United States Patent
Watanabe et al.

(10) Patent No.: US 12,457,841 B2
(45) Date of Patent: Oct. 28, 2025

(54) PHOTOELECTRIC CONVERSION ELEMENT AND PHOTOELECTRIC CONVERSION DEVICE INCLUDING THE PHOTOELECTRIC CONVERSION ELEMENT

(71) Applicant: CANON KABUSHIKI KAISHA, Tokyo (JP)

(72) Inventors: Hiroyuki Watanabe, Shizuoka (JP); Akihiro Maruyama, Shizuoka (JP); Tatsuya Yamaai, Kanagawa (JP); Kenichi Kaku, Shizuoka (JP); Shuntaro Watanabe, Kanagawa (JP); Jumpei Kuno, Kanagawa (JP); Kazunori Noguchi, Ibaraki (JP); Takashi Anezaki, Kanagawa (JP); Nobuhiro Nakamura, Tokyo (JP); Kohei Makisumi, Shizuoka (JP)

(73) Assignee: Canon Kabushiki Kaisha, Tokyo (JP)

(*) Notice: Subject to any disclaimer, the term of this patent is extended or adjusted under 35 U.S.C. 154(b) by 289 days.

(21) Appl. No.: 17/932,603

(22) Filed: Sep. 15, 2022

(65) Prior Publication Data
US 2023/0068976 A1 Mar. 2, 2023

Related U.S. Application Data

(63) Continuation of application No. PCT/JP2021/009941, filed on Mar. 12, 2021.

(30) Foreign Application Priority Data

Mar. 19, 2020 (JP) ................................. 2020-049504
Jun. 3, 2020 (JP) ................................. 2020-096830
(Continued)

(51) Int. Cl.
H10K 30/85 (2023.01)
H01G 9/20 (2006.01)
(Continued)

(52) U.S. Cl.
CPC ............. *H10K 30/85* (2023.02); *H10K 30/30* (2023.02); *H10K 30/50* (2023.02); *H10K 30/84* (2023.02);
(Continued)

(58) Field of Classification Search
CPC ........... H01G 9/20; H10K 30/50; H10K 85/50
See application file for complete search history.

(56) References Cited

U.S. PATENT DOCUMENTS

2014/0004451 A1 1/2014 Tomono
2017/0005282 A1 1/2017 Maehara

FOREIGN PATENT DOCUMENTS

JP 2012234970 A 11/2012
JP 2015517736 A 6/2015
(Continued)

OTHER PUBLICATIONS

Jun Hong Noh, et al.; "Chemical Management for Colorful, Efficient, and Stable Inorganic-Organic Hybrid Nanostructured Solar Cells;" Nano Letters, 2013; 13, 4, 1764-1769.

*Primary Examiner* — Lindsey A Buck
(74) *Attorney, Agent, or Firm* — Canon U.S.A., Inc. IP Division

(57) ABSTRACT

The present disclosure provides a photoelectric conversion element including a first electrode 3, a second electrode 7, a photoelectric conversion layer 5 between the first electrode 3 and the second electrode 7, and a reflection layer 6 between one of the first electrode 3 and the second electrode 7 and the photoelectric conversion layer 5. The wavelength at which the reflectance of the reflection layer 6 is maximum in the visible region is within the range of wavelengths in which the optical absorption coefficient of the photoelectric conversion layer 5 is ⅕ or more of the maximum optical absorption coefficient in the visible region.

9 Claims, 5 Drawing Sheets

| (30) | Foreign Application Priority Data | | |
|---|---|---|---|
| Jun. 30, 2020 | (JP) | ................................. | 2020-112744 |
| Feb. 25, 2021 | (JP) | ................................. | 2021-028128 |

(51) Int. Cl.

| | |
|---|---|
| *H10K 30/30* | (2023.01) |
| *H10K 30/50* | (2023.01) |
| *H10K 30/81* | (2023.01) |
| *H10K 30/82* | (2023.01) |
| *H10K 30/84* | (2023.01) |
| *H10K 30/86* | (2023.01) |
| *H10K 30/87* | (2023.01) |
| *H10K 85/10* | (2023.01) |
| *H10K 85/30* | (2023.01) |
| *H10K 85/50* | (2023.01) |
| *H10K 85/60* | (2023.01) |

(52) U.S. Cl.
CPC ............ *H10K 30/86* (2023.02); *H10K 30/87* (2023.02); *H10K 85/111* (2023.02); *H10K 85/141* (2023.02); *H10K 85/30* (2023.02); *H10K 85/50* (2023.02); *H10K 85/654* (2023.02); *H10K 85/6572* (2023.02); *H01G 9/2009* (2013.01); *H10K 30/81* (2023.02); *H10K 30/82* (2023.02)

(56) References Cited

FOREIGN PATENT DOCUMENTS

| | | |
|---|---|---|
| JP | 2015191916 A | 11/2015 |
| JP | 2015535390 A | 12/2015 |
| JP | 2019106401 A | 6/2019 |
| WO | 2015115607 A1 | 8/2015 |

PHOTOELECTRIC CONVERSION ELEMENT AND PHOTOELECTRIC CONVERSION DEVICE INCLUDING THE PHOTOELECTRIC CONVERSION ELEMENT

CROSS-REFERENCE TO RELATED APPLICATIONS

This application is a Continuation of International Patent Application No. PCT/JP 2021/009941, filed Mar. 12, 2021, which claims the benefit of Japanese Patent Application No. 2020-112744, filed Jun. 30, 2020, No. 2020-096830, filed Jun. 3, 2020, No. 2020-049504, filed Mar. 19, 2020, and No. 2021-028128, filed Feb. 25, 2021, all of which are hereby incorporated by reference herein in their entirety.

TECHNICAL FIELD

The present invention relates to a photoelectric conversion element and a photoelectric conversion device including the photoelectric conversion element.

BACKGROUND ART

To solve the problem of fossil energy depletion and the global environmental problems caused by using fossil energy, research on renewable and clean alternative energy sources, such as solar energy, wind power, and waterpower, has been actively being conducted. In particular, interest in solar cells, which directly transform sunlight into electrical energy, has been increasing significantly. A solar cell refers to a cell that absorbs light energy from sunlight and generates current-voltage by the photovoltaic effect, which is a phenomenon generating electrons and holes.

Currently, n-p diode type monocrystalline silicon (Si)-based solar cells with a light energy conversion efficiency exceeding 20% are widely known and used, in practice, for solar photovoltaic power generation. Also, perovskite solar cells using a compound having a perovskite structure in the active layer have attracted attention in terms of their high power generation efficiency and low costs, and many studies on such solar cells have been conducted. Additionally, the color of the active layer of solar cells can be changed by controlling the halogen ratio in the active layer. This can be expected to be applied to colorful and aesthetically pleasing solar cells.

NPL 1 describes a solar cell using an organic hybrid perovskite compound and describes that controlling the band gap of perovskite enables colorful solar cells to be obtained.

PTL 1 describes a photoelectric conversion element using $TiO_2$, SnO, or ZnO as electron-transporting materials.

PTL 2 describes a photoelectric conversion element using a perovskite compound as a material of the active layer and describes that the photoelectric conversion element uses N-alkylperylenetetracarboxylic diimide as an electron-transporting compound in the electron transport layer.

CITATION LIST

Patent Literature

PTL 1: PCT Japanese Translation Patent Publication No. 2015-535390
PTL 2: Japanese Patent Laid-Open No. 2019-106401

Non Patent Literature

NPL 1: Jun Hong Noh et al., Chemical Management for Colorful, Efficient, and Stable Inorganic-Organic Hybrid Nanostructured Solar Cells, Nano Letter. 2013, 13, 4, 1764-1769

The solar cells described in NPL 1 and PTLs 1 and 2 have room for further improvement in photoelectric conversion efficiency.

SUMMARY OF INVENTION

The present invention has been made in view of the problem described above and an object of the present invention is to provide a photoelectric conversion element with high photoelectric conversion efficiency.

First Embodiment

A photoelectric conversion element according to this embodiment includes a first electrode, a second electrode, a photoelectric conversion layer disposed between the first electrode and the second electrode, and a reflection layer disposed between the photoelectric conversion layer and one of the first electrode and the second electrode. The wavelength at which the reflectance of the reflection layer is maximum in the visible region is within the range of wavelengths in which the optical absorption coefficient of the photoelectric conversion layer is $\frac{1}{5}$ or more of the maximum optical absorption coefficient in the visible region.

Second Embodiment

A photoelectric conversion element of this embodiment includes an anode, a first layer containing a perovskite compound, an electrically conductive second layer, and a cathode in this order. The second layer is disposed between the cathode and the first layer. The second layer contains at least electrically conductive particles that include a core particle and an electrically conductive coating layer different in composition or material from the core particle.

Third Embodiment

A first photoelectric conversion element of this embodiment includes a first layer containing a perovskite compound between an anode and a cathode, and a second layer between the cathode and the first layer. The second layer contains a polymer compound to which an electron-transporting compound is bound.

A second photoelectric conversion element of this embodiment includes a first layer containing a perovskite compound between an anode and a cathode, and a second layer between the cathode and the first layer. The second layer contains at least one of the structures represented by formulas (E-1) to (E-3) presented below and at least one of the structures represented by formulas (P-1) to (P-5) presented below.

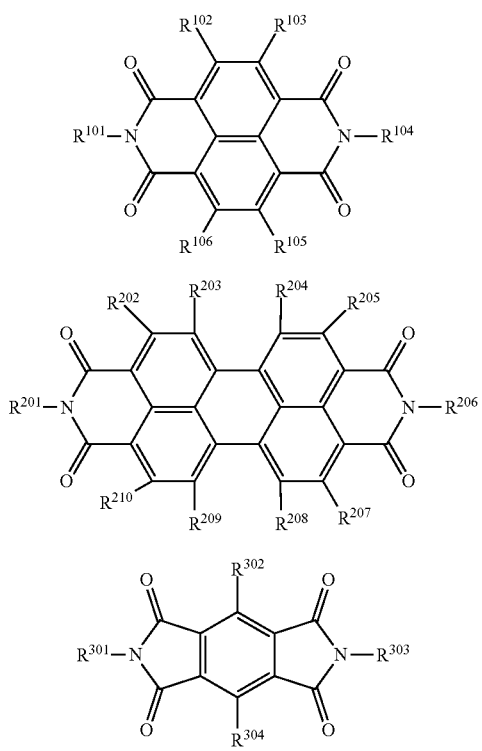

(E-1)
(E-2)
(E-3)

(In formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group. One or two of $R^{101}$ to $R^{106}$, one or two of $R^{201}$ to $R^{210}$, and one or two of $R^{301}$ to $R^{304}$ are single bonds. The substituent of the substituted alkyl group is an alkyl group, an aryl group, a halogen atom, or a carbonyl group. The substituent of the substituted aryl group or the substituted heterocyclic group is a halogen atom, a nitro group, a cyano group, an alkyl group, a halogen-substituted alkyl group, an alkoxy group, or a carbonyl group.)

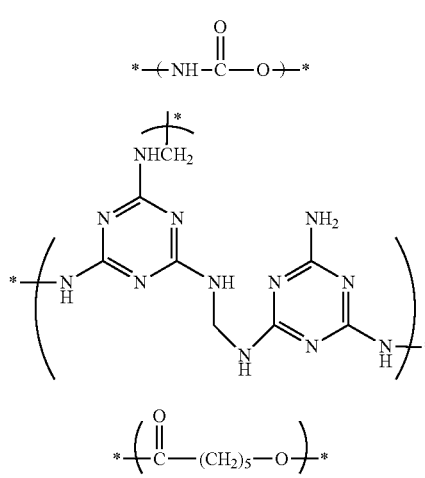

(P-1)
(P-2)
(P-3)
(P-4)
(P-5)

(In formulas (P-1) to (P-5), * designates a binding site.)

A third photoelectric conversion element of this embodiment includes a first layer containing a perovskite compound between an anode and a cathode, and a second layer between the cathode and the first layer. The second layer contains at least one of the structures represented by formula (U1) presented below and the structures represented by formula (U2) presented below.

(U1)
(U2)

(In formulas (U1) and (U2), $R^1$ and $R^3$ each independently represent a substituted or unsubstituted alkylene group whose main chain has 1 to 10 atoms, or a substituted or unsubstituted phenylene group. $R^2$ represents a single bond, a substituted or unsubstituted alkylene group whose main chain has 1 to 10 atoms, or a substituted or unsubstituted phenylene group. The substituent of the substituted alkylene group is an alkyl group, an aryl group, a hydroxy group, or a halogen atom. The substituent of the substituted phenylene group is a halogen atom, a nitro group, a cyano group, a hydroxy group, an alkyl group, or a halogen-substituted alkyl group. $R^9$ represents a hydrogen atom or an alkyl group. $A^1$ represents any one of the groups represented by formulas (A-1) to (A-6) presented below. $B^1$ represents a group represented by any one of formulas (B-1) to (B-3) presented below. $D^1$ represents a group represented by formula (D) presented below and whose main chain has 5 to 15 atoms. $E^1$ represents a divalent group represented by any one of formulas (E-1) to (E-3) presented below.)

—O—  (A-1)

$-\overset{O}{\underset{\|}{C}}-O-$  (A-2)

$-\overset{H}{\underset{|}{N}}-$  (A-3)

—S—   (A-4)

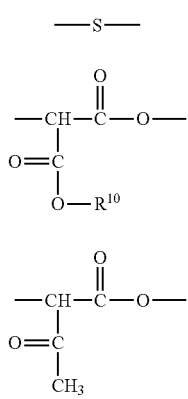
(A-5)

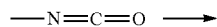
(A-6)

(In formula (A-5), $R^{10}$ represents a hydrogen atom or an alkyl group.)

—N=C=O →   (B-1)

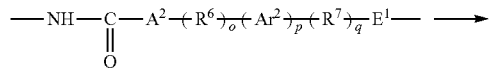
(B-2)

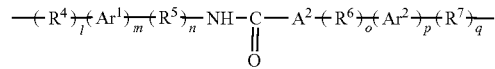
(D)

(In formula (D), $R^4$, $R^5$, $R^6$, and $R^7$ each independently represent an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, an alkoxycarbonyl-substituted alkylene group whose main chain has 1 to 5 atoms, or a phenyl-substituted alkylene group whose main chain has 1 to 5 atoms. One of the carbon atoms of the main chain of the alkylene group may be replaced with O, S, NH, or $NR^{15}$ ($R^{15}$ is an alkyl group). $Ar^1$ and $Ar^2$ each independently represent a substituted or unsubstituted phenylene group. The substituent of the substituted phenylene group is a halogen atom, a nitro group, a hydroxy group, a cyano group, an alkyl group, or a halogenated alkyl group. $A^2$ represents a group represented by any one of formulas (A-1) to (A-6) presented above. l, m, n, o, p, and q are each independently 0 or 1, and the sum of l, m, and n and the sum of o, p, and q are 1 to 3.)

—NH—C—$A^1$—$R^2$
    ‖
    O      —C—$C$—
           |   $H_2$
           $R^{12}$
(B-3)

(In formulas (B-1) to (B-3), $R^6$ and $R^7$ each independently represent an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, alkoxycarbonyl-substituted alkylene group whose main chain has 1 to 5 atoms, or a phenyl-substituted alkylene group whose main chain has 1 to 5 atoms. One of the carbon atoms of the main chain of the alkylene group may be replaced with O, S, NH, or $NR^{15}$ ($R^{15}$ is an alkyl group). $R^2$ represents a single bond, a substituted or unsubstituted alkylene group whose main chain has 1 to 10 atoms, or a substituted or unsubstituted phenylene group. The substituent of the substituted alkylene group is an alkyl group, an aryl group, a hydroxy group, or a halogen atom. The substituent of the substituted phenylene group is a halogen atom, a nitro group, a cyano group, a hydroxy group, an alkyl group, or a halogen-substituted alkyl group. $R^{12}$ represents a hydrogen atom or an alkyl group. $Ar^2$ represents a substituted or unsubstituted phenylene group. The substituent of the substituted phenylene group is a halogen atom, a nitro group, a hydroxy group, a cyano group, an alkyl group, or a halogenated alkyl group. $A^1$ and $A^2$ represent any one of the groups represented by formulas (A-1) to (A-5) presented above. $E^1$ represents a divalent group represented by any one of formulas (E-1) to (E-3) presented below. o, p, and q are each independently 0 or 1, and the sum of o, p, and q is 1 to 3. Arrows point to the side bound to $R^3$.)

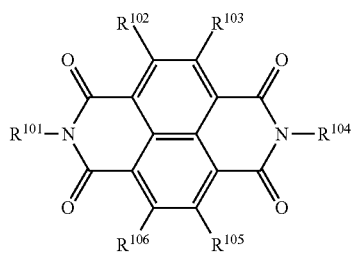
(E-1)

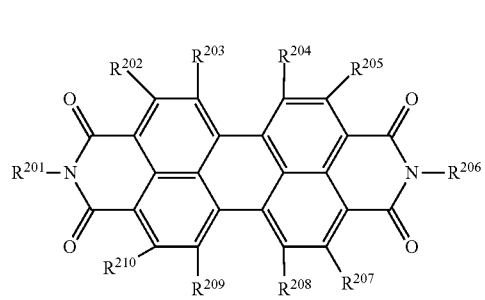
(E-2)

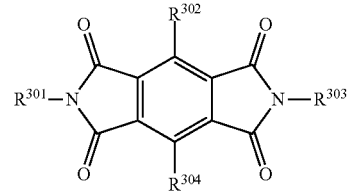
(E-3)

(In formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group. One or two of $R^{101}$ to $R^{106}$, one or two of $R^{201}$ to $R^{210}$, and one or two of $R^{301}$ to $R^{304}$ are single bonds. The substituent of the substituted alkyl group is an alkyl group, an aryl group, a halogen atom, or a carbonyl group. The substituent of the substituted aryl group or the substituted heterocyclic group is a halogen atom, a nitro group, a cyano group, an alkyl group, a halogen-substituted alkyl group, an alkoxy group, or a carbonyl group.)

A fourth photoelectric conversion element of this embodiment includes a first layer containing a perovskite compound between an anode and a cathode, and a second layer between the cathode and the first layer. The second layer contains at least one of the structures represented by formula (C1) presented below and the structures represented by formula (C2) presented below.

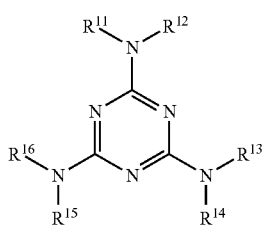

(C1)

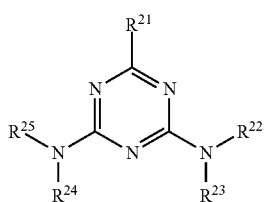

(C2)

(In formulas (C1) and (C2), $R^{11}$ to $R^{16}$ and $R^{22}$ to $R^{25}$ each independently represent a hydrogen atom, a methylene group, a monovalent group represented by —CH$_2$OR$^2$ ($R^2$ represents a hydrogen atom or an alkyl group with 1 to 10 carbon atoms), a group represented by formula (i) presented below, or a group represented by formula (ii) presented below. At least one of $R^{11}$ to $R^{16}$ and at least one of $R^{22}$ to $R^{25}$ are groups represented by formula (i) presented below, and at least one of $R^{11}$ to $R^{16}$ and at least one of $R^{22}$ to $R^{25}$ are groups represented by formula (ii) presented below. $R^{21}$ represents an alkyl group, a phenyl group, or an alkyl-substituted phenyl group.)

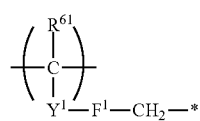

(i)

(In formula (i), $R^{61}$ represents a hydrogen atom or an alkyl group. $Y^1$ represents a single bond, an alkylene group, or a phenylene group. $F^1$ represents a divalent group represented by any one of formulas (F1) to (F4) presented below. * designates the side bound to N of formula (C1) presented above or the side bound to N of formula (C2) presented above.)

—O— (F1)

$$-\overset{O}{\underset{}{C}}-O-$$ (F2)

$$-\overset{H}{\underset{}{N}}-$$ (F3)

—S— (F4)

—E$^1$—(α)$_r$—(β)$_s$—(γ)$_t$—F$^2$—CH$_2$—* (ii)

(In formula (ii), F$^2$ represents a divalent group represented by any one of formulas (F1) to (F4) presented above. α represents an alkylene group whose main chain has 1 to 6 atoms, an alkylene group which is substituted by an alkyl group with 1 to 6 carbon atoms and whose main chain has 1 to 6 atoms, a benzyl-substituted alkylene group whose main chain has 1 to 6 atoms, alkoxycarbonyl-substituted alkylene group whose main chain has 1 to 6 atoms, or a phenyl-substituted alkylene group whose main chain has 1 to 6 atoms. One of the carbon atoms of the main chain of the alkylene group may be replaced with O, S, NH, or NR$^1$ (R$^1$ is an alkyl group with 1 to 6 carbon atoms). β represents a phenylene group, a phenylene group substituted by an alkyl group with 1 to 6 carbon atoms, a nitro-substituted phenylene group, or a halogen-substituted phenylene group. γ represents an alkylene group whose main chain has 1 to 6 atoms, or an alkylene group which is substituted by an alkyl group with 1 to 6 carbon atoms and whose main chain has 1 to 6 atoms. r, s, and t are each 0 or 1. E$^1$ represents a divalent group represented by any one of formulas (E-1) to (E-3) presented below. * designates the side bound to N of formula (C1) presented above or the side bound to N of formula (C2) presented above.)

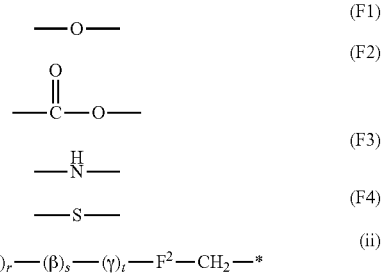

(E-1)

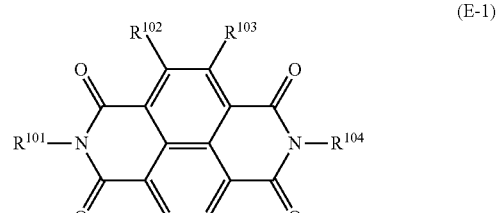

(E-2)

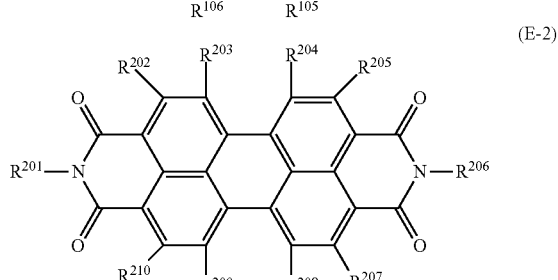

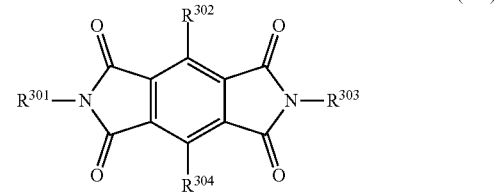

(E-3)

(In formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group. One or two of $R^{101}$ to $R^{106}$, one or two of $R^{201}$ to $R^{210}$, and one or two of $R^{301}$ to $R^{304}$ are single bonds. The substituent of the substituted alkyl group is an alkyl group, an aryl group, a halogen atom, or a carbonyl group. The substituent of the substituted aryl group or the substituted heterocyclic group is a halogen atom, a nitro group, a cyano group, an alkyl group, a halogen-substituted alkyl group, an alkoxy group, or a carbonyl group.)

Further features of the present invention will become apparent from the following description of exemplary embodiments with reference to the attached drawings.

DESCRIPTION OF EMBODIMENTS

Photoelectric Conversion Element

First Embodiment

Figure 1:
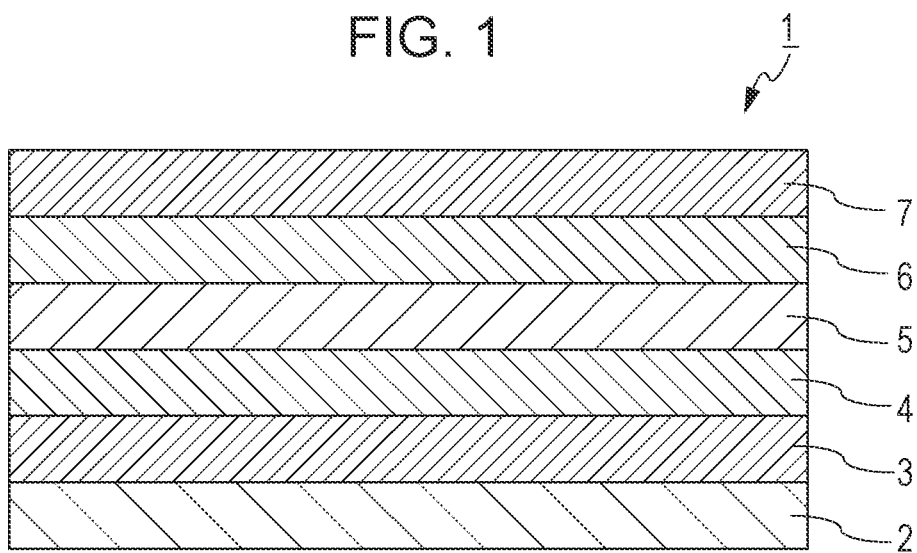
FIG. 1 depicts an example of the photoelectric conversion element according to an embodiment of the present invention.

A first embodiment of the present invention will be described in detail below. A photoelectric conversion element according to the present embodiment includes a first electrode, a second electrode, a photoelectric conversion layer between the first electrode and the second electrode, and a reflection layer between the photoelectric conversion layer and one of the first electrode and the second electrode. The wavelength at which the reflectance of the reflection layer is maximum in the visible region is within the range of wavelengths in which the optical absorption coefficient of the photoelectric conversion layer is $\frac{1}{5}$ or more of the maximum optical absorption coefficient in the visible region. The present inventors have found through their studies that such a configuration can be a photoelectric conversion element with high photoelectric conversion efficiency. In the present embodiment, the "photoelectric conversion layer" may also be referred to as the "function layer" or "active layer". The photoelectric conversion layer may include a charge transport layer.

Preferably, the reflection layer contains particles with a volume average particle size of 50 nm to 600 nm. Such a reflection layer can reflect particularly blue light more strongly than other light. Consequently, the amount of light absorbed by the function layer increases, thereby increasing the photoelectric conversion efficiency.

Reflection of blue light from the reflection layer means that the function layer appears red, more specifically, means that the light reflected from the reflection layer and transmitted through the photoelectric conversion layer can have an L*c*h* color space of $20 \leq L^*$, $30 \leq c^*$, and $0 \leq h^* \leq 90$. The color space may be $47 \leq c^*$, may be $20 \leq L^*$, $42 \leq c^*$, and $0 \leq h^* \leq 50$, or may be $20 \leq L^*$, $47 \leq c^*$, and $50 \leq h^* \leq 90$.

In the present embodiment, the function layer may include a layer that absorbs light and separate charges; hence, the function layer may be a photoelectric conversion layer. Preferably, the function layer can absorb light with wavelengths at which the reflection layer exhibits higher reflectance than at other wavelengths. Also, the material of the function layer may be an organic material, an inorganic material, or a material containing perovskite. The function layer may be made of a mixture of these materials.

The reflection layer according to the present embodiment has high reflectance at wavelengths of light for which the function layer has high absorption. More specifically, the particle size of the particles contained in the reflection layer is 50 nm to 600 nm. Preferably, the particle size is 70 nm to 500 nm and is more preferably 90 nm to 400 nm. The particle size of the particles contained in the reflection layer may be measured as volume average particle size.

The photoelectric conversion element according to the present embodiment includes a first electrode, a second electrode, and a photoelectric conversion layer between the first and second electrodes, and a reflection layer. The wavelength at which the reflectance of the reflection layer is maximum in the visible region is within the range of wavelengths of light absorbed by the photoelectric conversion layer. More preferably, the wavelength at which the reflectance is maximum is within the range of wavelengths in which the optical absorption coefficient of the photoelectric conversion layer is $\frac{1}{5}$ or more of the maximum optical absorption coefficient in the visible region. Still more preferably, the wavelength at which the reflectance is maximum is within the range of wavelengths in which the optical absorption coefficient of the photoelectric conversion layer is half or more of the maximum optical absorption coefficient in the visible region.

In other words, in the spectrum of reflectance of the reflection layer against wavelength, the wavelength for the maximum reflectance is within the range of wavelengths of light absorbed by the photoelectric conversion layer. Also, it can also be said that the maximum peak of the spectrum is within the above range.

When being taken into account, this spectrum may be in the visible region or in the visible region, ultraviolet light region, and infrared light region. More specifically, the spectrum may be in the region of 250 nm to 1100 nm.

The present embodiment will now be described with reference to the drawings.

FIG. 1 is a diagram illustrating an example of the photoelectric conversion element 1 according to the present embodiment. A first electrode 3, a charge transport layer 4, a photoelectric conversion layer 5, a reflection layer 6, and a second electrode 7 are disposed on a substrate 2. The first electrode 3 and the second electrode 7 may be an anode or a cathode. A current is generated in a configuration in which the first electrode 3 and the second electrode 7 are connected to an external circuit. The positions of the first electrode 3 and the second electrode 7 may be replaced.

For example, the photoelectric conversion layer 5 is excited by light entering through the substrate 2, the first electrode 3, and the charge transport layer 4 to produce electrons or holes. Hence, the photoelectric conversion layer 5 produces a current between the first electrode 3 and the second electrode 7. The charge transport layer 4 is a layer disposed between the photoelectric conversion layer 5 and the two electrodes and may not be provided in some cases. The charge transport layer 4 and the photoelectric conversion layer 5 may be in a form in which they are repeatedly stacked. Such a form may be called a tandem structure.

In the manufacture of the photoelectric conversion element, a method may be used in which coating liquids described later are prepared for each layer and applied according to the desired order of layers, followed by drying. At this time, the coating liquids may be applied by dip coating, spray coating, ink jet coating, roll coating, die coating, blade coating, curtain coating, wire bar coating, ring coating, spin coater coating, or the like.

Supporting Substrate

The supporting substrate is preferably a substrate that can be provided with an electrode (anode or cathode) on the main surface thereof, and that is made of a material not chemically changed when the function layer of the photoelectric conversion element is formed. The supporting substrate is also simply referred to as the substrate.

Examples of the material of the supporting substrate include glass, plastics, polymer films, and silicon.

In the photoelectric conversion element configured to take light from the supporting substrate side, a highly light-transmissive substrate is suitable as the supporting substrate.

The photoelectric conversion element disposed on an opaque supporting substrate cannot take light through the supporting substrate. Accordingly, the electrode farther from the supporting substrate is preferably transparent or translucent. Disposing a transparent or translucent electrode as the electrode farther from the supporting substrate enables light to be taken in therethrough when an opaque supporting substrate is used.

Electrodes

The electrodes are made of electrically conductive material. Examples of the material of the electrodes include metal, inorganic compounds such as metal oxides, and organic compounds such as electrically conductive polymer.

The electrodes may be defined by a single layer or a stack of a plurality of layers.

Either the first electrode or the second electrode may be an anode, and the other may be a cathode. Preferably, at least one of the anode and the cathode is transparent or translucent.

The first electrode and the second electrode receive charges generated in the function layer, and the charges are extracted to the outside as electrical energy.

Examples of transparent or translucent electrode materials include electrically conductive metal oxides and metals. When the electrode material is not transparent, the material can be thinned to such a thickness as to transmit light so that the electrode functions as a transparent or translucent electrode. Specifically, transparent or translucent electrode materials include, for example, indium oxide, zinc oxide, tin oxide, and their composites, such as ITO, IZO, FTO, and NESA, gold, platinum, silver, copper, and aluminum.

The method for forming the electrodes (anode and cathode) is not particularly limited. For example, the electrodes may be formed on a layer on which the electrodes should be formed or the supporting substrate by vacuum deposition, sputtering, ion plating, plating, coating, or the like.

Function Layer

The function layer is disposed between the first electrode and the second electrode. The function layer may include a photoelectric conversion layer that converts absorbed light into charges. The photoelectric conversion layer may be called an active layer. The function layer may include a charge transport layer. The charge transport layer may be called a hole transport layer or an electron transport layer depending on its function.

The function layer may be in contact with both the first electrode and the second electrode or either.

Hole Transport Layer

Preferably, the photoelectric conversion element according to the present embodiment includes a hole transport layer between the photoelectric conversion layer and the anode.

The hole transport layer functions to transport holes from the photoelectric conversion layer to the anode. The hole transport layer also functions to reduce the transport of electrons from the photoelectric conversion layer to the anode to suppress the recombination of electrons and holes, thus reducing the decrease in photoelectric conversion efficiency. The hole transport layer is preferably in contact with the anode.

Hole-transporting materials that form the hole transport layer include inorganic materials such as CuI and CuNCS and organic hole-transporting materials disclosed in paragraphs 0209 to 0212 of Japanese Patent Laid-Open No. 2001-291534 and are not particularly limited. Preferable organic hole-transporting materials include electrically conductive polymers, such as polythiophene, polyaniline, polypyrrole, and polysilane; spiro compounds in which two rings share a central atom of a tetrahedral structure, such as C or Si; aromatic amine compounds, such as triarylamine; triphenylene compounds; nitrogen-containing heterocyclic compounds; and liquid crystalline cyano compounds.

The hole-transporting material is preferably an organic hole-transporting material capable of being applied as a solution and then turned solid. Specific examples of such a material include 2,2',7,7'-tetrakis-(N,N-di-p-methoxyphenylamine)-9,9-spirobifluorene (also called Spiro-OMeTAD), poly(3-hexylthiophene-2,5-diyl), 4-(diethylamino)benzaldehyde diphenylhydrazone, and polyethylenedioxythiophene (PEDOT).

The thickness of the hole transport layer is not particularly limited but is preferably 50 m or less, more preferably 1 nm to 10 µm, still more preferably 5 nm to 5 µm, and particularly preferably 10 nm to 1 µm. The thickness can be measured by observing a cross section of the photoelectric conversion element under a scanning electron microscope (SEM).

The hole transport layer can be formed by preparing a coating liquid for the electrically conductive layer containing the above-described materials and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents.

Photoelectric Conversion Layer

The photoelectric conversion layer of the photoelectric conversion element according to the present embodiment may contain a compound having a perovskite structure (perovskite compound).

The perovskite compound preferably has an organic-inorganic hybrid structure in which organic and inorganic compounds are components of the perovskite structure.

The organic-inorganic perovskite compound is preferably a compound represented by the general formula R-M-$X_3$.

In the general formula R-M-$X_3$, R represents an organic molecule and is represented preferably by $C_lN_mH_n$ (L, m, and n are each a positive integer).

Specific examples of such an R include methylamine, ethylamine, propylamine, butylamine, pentylamine, hexylamine, dimethylamine, diethylamine, dipropylamine, dibutylamine, dipentylamine, dihexylamine, trimethylamine, triethylamine tripropylamine, tributylamine, tripentylamine, trihexylamine, ethylmethylamine, methylpropylamine, butylmethylamine, methylpentylamine, hexylmethylamine, ethylpropylamine, ethylbutylamine, imidazole, azole, pyrrole, aziridine, azirine, azetidine, azete, imidazoline, carbazole; and ions thereof (e.g., methylammonium ($CH_3NH_3^+$) and the like) and phenethylammonium. Among these, methylamine, ethylamine, propylamine, butylamine, pentylamine, hexylamine, ions thereof, and phenethylammonium are preferred. Particularly, methylamine, ethylamine, propylamine, and ions thereof are preferred.

In the general formula R-M-$X_3$, M represents a metal atom, and examples include lead, tin, zinc, titanium, antimony, bismuth, nickel, iron, cobalt, silver, copper, gallium, germanium, magnesium, calcium, indium, aluminum, manganese, chromium, molybdenum, and europium. These metals may be used individually or in combination.

In the general formula R-M-$X_3$, X represents a halogen atom or a chalcogen atom, and examples include chlorine, bromine, iodine, sulfur, and selenium. These halogen or chalcogen atoms may be used individually or in combination. Among these, halogen atoms are preferable because the presence of halogen atoms in the structure of the organic-inorganic perovskite compound makes the organic-inorganic perovskite compound soluble in organic solvents and enables the application to inexpensive printing methods or the like. Furthermore, iodine is more preferable because iodine narrows the energy band gap of the organic-inorganic perovskite compound.

The organic-inorganic perovskite compound preferably has a cubic crystal structure with a metal atom M at the body center, organic molecule R at each vertex, and halogen or chalcogen atoms X at the face centers. Although details are not clear, it is presumed that this structure allows the octahedron in the crystal lattice to change its orientation easily and thus increases the mobility of electrons in the organic-inorganic perovskite compound, consequently increasing the photoelectric conversion efficiency.

The organic-inorganic perovskite compound is preferably a crystalline semiconductor. The organic-inorganic perovskite compound that is a crystalline semiconductor increases the mobility of electrons and improves the photoelectric conversion efficiency. A crystalline semiconductor refers to a semiconductor whose scattering peaks can be detected by measurements such as X-ray diffraction.

The thickness of the portion made of the organic-inorganic perovskite compound may be 5 nm to 5000 nm. When the thickness is 5 nm or more, the amount of light absorption increases, and the photoelectric conversion efficiency increases further. When the thickness is 5000 nm or less, regions with low charge separation efficiency can be reduced, leading to increased photoelectric conversion efficiency.

The more preferably, the thickness of the portion made of the perovskite compound is 10 nm to 1000 nm, further preferably 20 nm to 500 nm.

The active layer can be formed by preparing a coating liquid for the active layer containing the above-described materials and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents. The coating liquid may be prepared by mixing two liquids having different compositions.

Reflection Layer

The photoelectric conversion element according to the present embodiment includes a reflection layer that reflects entering light. The reflection layer is disposed between the function layer and the first or second electrode.

The reflection layer is a layer of a stack formed in the order of, for example, the first electrode, the charge transport layer, the photoelectric conversion layer, the reflection layer, and the second electrode and reflects light not fully absorbed by the photoelectric conversion layer to enable the perovskite layer to absorb light again, thus being effective in increasing the light absorption efficiency of the entire element.

To ensure that the light reflected from the reflection layer is easily absorbed by the photoelectric conversion layer, the reflection layer contains particles with a volume average particle size of 50 nm to 600 nm. The particle size of the particles contained in the reflection layer is preferably 70 nm to 500 nm, particularly preferably 90 nm to 400 nm.

The refractive index of the particles is preferably 1.3 to 3.0, more preferably 1.8 to 3.0, and still more preferably 2.3 to 3.0. The aspect ratio of the particles is preferably 1.0 to 4.0, more preferably 1.0 to 3.0, and still more preferably 1.0 to 2.0.

The material of the particles is not particularly limited. Examples as metal compounds include zinc oxide, aluminum oxide, indium oxide, silicon oxide, zirconium oxide, tin oxide, titanium oxide, magnesium oxide, antimony oxide, bismuth oxide, barium sulfate, strontium titanate, barium titanate, and potassium niobate. Examples as metals include aluminum, nickel, iron, nichrome, copper, zinc, and silver. Examples of resin particles include acrylic resin, fluororesin, polystyrene resin, polyethylene resin, and silicone resin.

Particles may have a coating layer made of an electrically conductive material. Examples of the electrically conductive material include metal-based materials, such as metal oxides, aluminum, palladium, iron, copper, and silver; and composite materials surface-treated by electrolysis, spray coating, or mixed vibration. Among these, metal oxides are preferable. The metal oxide is preferably any one selected from tin oxide, zinc oxide, and titanium oxide. These metal oxides can contribute to increase in current density when appropriately reduced to have an oxygen-deficient structure or appropriately doped. When tin oxide is used, the tin oxide is preferably doped with an element selected from niobium, tantalum, phosphorus, tungsten, and fluorine. When zinc oxide is used, the zinc oxide is preferably doped with either element aluminum or gallium. When titanium oxide is used, the titanium oxide is preferably doped with either element niobium or tantalum.

In the present embodiment, the aspect ratio of the particles is determined with a scanning electron microscope, as described below. Particles to be measured are observed under a scanning electron microscope S-4800 (manufactured by Hitachi, Ltd.), and the major and minor axis diameters of 100 particles randomly selected from an image obtained by the observation are measured, followed by calculating their arithmetic means.

In the present embodiment, the refractive index of the particles is defined as the value measured using CARGILLE standard refractive index liquids produced by Cargille Laboratories. The specific measuring method is as follows: Particles are placed on a glass slide, and a refractive index liquid is dropped. The particles and the refractive index liquid are mixed well and irradiated with a sodium lamp from below. Contours of the particles are observed from above. When the contours are not visible, the refractive index of the particles is considered equal to that of the refractive index liquid. For resin formed into a film, the refractive index is defined as the value measured in accordance with JIS K7142, Plastics-Determination of refractive index.

Also, the refractive index of resin formed into a film is defined as the value obtained using an Abbe refractometer DR-A1 (trade name, manufactured by ATAGO Co., Ltd.)

The reflection layer according to the present embodiment may contain a binder in addition to the particles. Examples of the binder include polyester resin, polycarbonate resin, polyvinyl acetal resin, acrylic resin, silicone resin, epoxy resin, melamine resin, polyurethane resin, phenol resin, and alkyd resin. The use of a binder enables the formation of a dense and uniform reflection layer to form a uniform interface between the reflection layer and the active layer, consequently enhancing the electron transport capacity. However, excessive binder resin content may reduce the electron transport capacity within the reflection layer.

The weight ratio (particles/resin) of the particles to the resin in the reflection layer is preferably 100/1 to 2/1, more preferably 95/1 to 4/1, and still more preferably 90/1 to 10/1.

The average thickness of the reflection layer is preferably 50 nm to 1000 nm and more preferably 70 nm to 500 nm.

The reflection layer can be formed by preparing a coating liquid for the reflection layer containing the above-described materials and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents. For dispersing the particles in the coating liquid for the reflection layer, a paint shaker, a sand mill, a ball mill, or a high-speed liquid collision disperser may be used. The electrically conductive layer coating liquid prepared by dispersion may be filtered to remove impurities as a coating liquid for the reflection layer.

Figure 2:
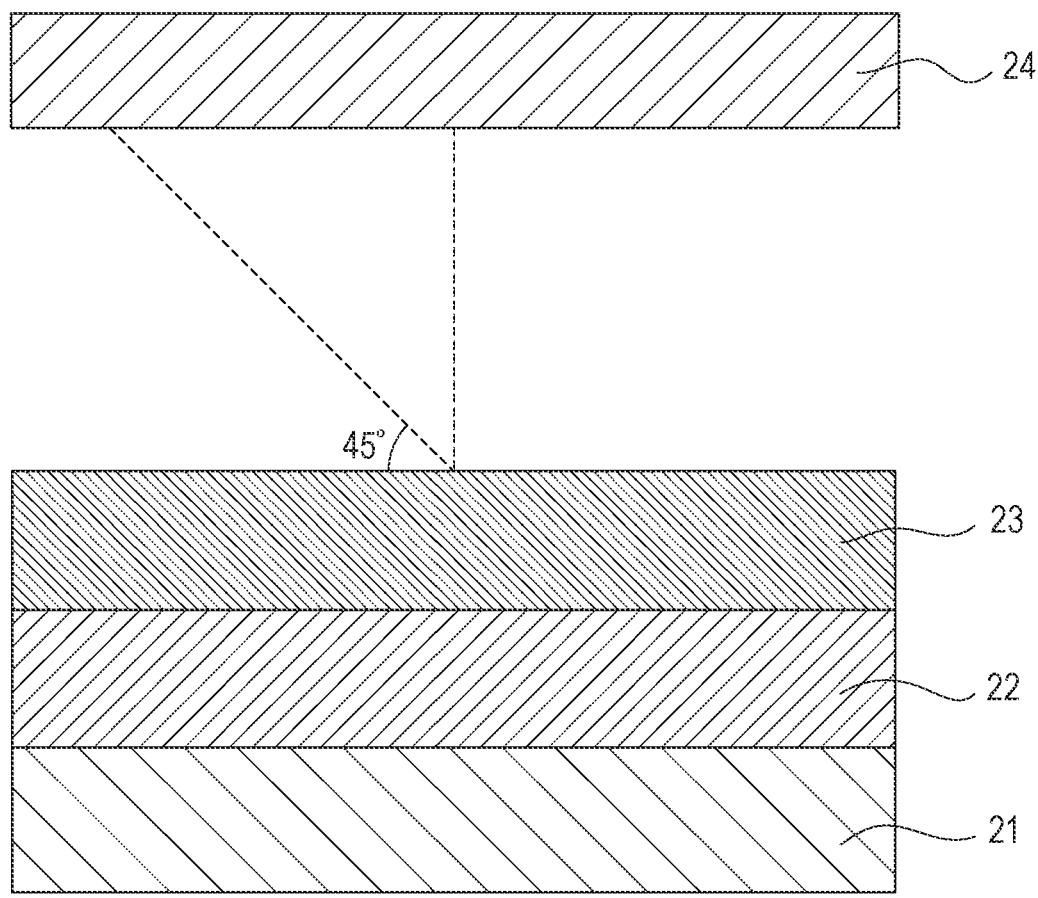
FIG. 2 depicts an example of colorimetry according to an embodiment of the present invention.

In the present embodiment, color tones were measured as depicted in FIG. 2. Specifically, coating films of a reflection layer 22 and a photoelectric conversion layer 23 are formed in this order on an aluminum sheet 21, and the surface of the coating films is irradiated with light from a spectrocolorimeter 24 at an angle of 45 degrees to the vertical axis of the surface of the coating films. L*, c*, and h* are thus determined from the spectral reflectance at 90 degrees to the surface of the coating films. A perovskite layer can be used as the photoelectric conversion layer, and RM200QC (manufactured by X-Rite Inc.) can be used as the spectrocolorimeter.

Second Embodiment

The present inventors have found through their study that a photoelectric conversion element including an anode, a first layer containing a perovskite compound, an electrically conductive second layer, and a cathode in this order has an increased photoelectric conversion efficiency when the second layer contains electrically conductive particles produced by coating core particles with an electrically conductive material.

It is unknown how the second embodiment of the present invention produces such an effect, but the following mechanism is presumed. Coating core particles with an electrically conductive material creates an interaction between the electrically conductive material and the core particles, and the conduction band energy level of the electrically conductive material approaches the conduction band energy level of the perovskite compound of the first layer. Consequently, electron injection from the first layer to the second layer is promoted to increase current density. This is probably the reason for the increase in the photoelectric conversion efficiency.

The second embodiment of the present invention will be described in detail below. The present invention is not limited to the following embodiment and encompasses any modifications or changes of the following embodiment that are made within the scope and spirit of the invention on the basis of the knowledge of those skilled in the art.

Figure 3:
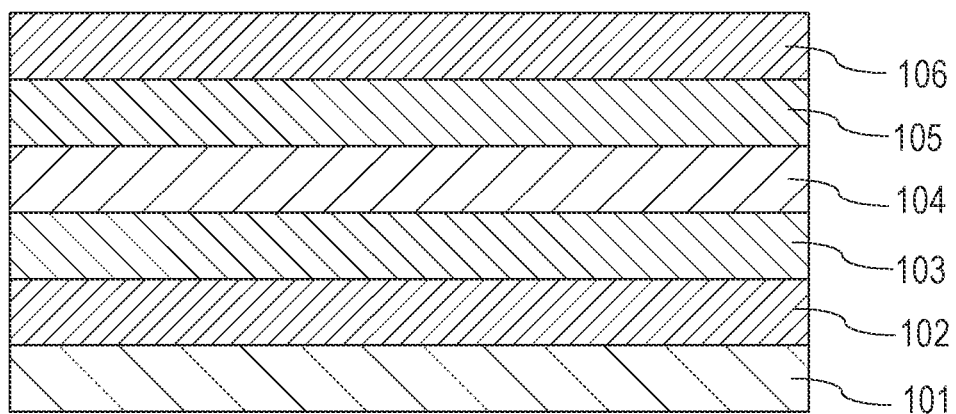
FIG. 3 is a sectional diagram schematically illustrating in the thickness direction an example of the configuration of the photoelectric conversion element according to an embodiment of the present invention.

FIG. 3 schematically depicts the configuration of an embodiment of the photoelectric conversion element according to the present invention. FIG. 3 is a sectional diagram of a photoelectric conversion element taken in the thickness direction (layering direction), in which an anode 102, a charge transport layer 103, a first layer 104, a second layer 105, and a cathode 106 overlie a substrate 101. Current is generated between the anode 102 and the cathode 106 through an external circuit. The first layer 104 is excited by light taken from the substrate 101 side or the cathode 106 side to produce electrons or holes; hence, the first layer is a photoelectric conversion layer that produces a current between the anode 102 and the cathode 106 and is what is called an active layer. The charge transport layer 103 is disposed between the first layer 104 and the two electrodes 102 and 106 but is not necessarily an essential component. The first layer 104 may be in a tandem structure defined by a plurality of layers. Although FIG. 3 depicts a configuration in which the anode 102 is disposed on the substrate 101 side, the cathode 106 may be disposed on the substrate 101 side, and on which the second layer 105, the first layer 104, the charge transport layer 103, and the anode 102 may be formed in this order. In the following, the first layer 104 is referred to as the active layer 104.

The photoelectric conversion element of the present embodiment can be produced by preparing coating liquids for each layer described later, applying the coating liquids in a desired order, and drying the coating liquids. At this time, the coating liquids may be applied by dip coating, spray coating, ink jet coating, roll coating, die coating, blade coating, curtain coating, wire bar coating, ring coating, spin coater coating, or the like.

Substrate

The substrate 101 is preferably a substrate that can be provided with an electrode (in the case of FIG. 3, the anode 102) on the main surface thereof, and that is made of a material not chemically changed when the function layer of the photoelectric conversion element is formed. Examples of the material of the substrate include glass, plastics, polymer films, and silicon. In the case of taking light from the substrate 101 side, a transparent material is used for the substrate 101.

Electrodes

The electrodes 102 and 106 are made of electrically conductive material. Examples of the material of the electrodes 102 and 106 include metal, inorganic compounds such as metal oxides, and organic compounds such as electrically conductive polymer. The electrodes 102 and 106 may be defined by a single layer or a stack of a plurality of layers.

In the case of taking light from the substrate 101 side, the electrode on the substrate 101 side (in the case of FIG. 3, the anode 102) is preferably made of a material with high transparency so that the photoelectric conversion element can function effectively. In the case of taking light from the opposite side to the substrate 101 (in the case of FIG. 3, from the cathode 106 side), on the other hand, the electrode on the opposite side to the substrate 101 (in the case of FIG. 3, the cathode 106) is made of a material with high transparency.

Examples of transparent or translucent electrode materials include electrically conductive metal oxides and metals. When the electrode material is not transparent, the material can be thinned to such a thickness as to transmit light so that the electrode functions as a transparent or translucent electrode. Specific examples of transparent or translucent electrode materials include, for example, indium oxide, zinc oxide, tin oxide, and their composites, such as ITO, IZO, FTO, and NESA, gold, platinum, silver, copper, and aluminum.

The method for forming the electrodes 102 and 106 is not limited. For example, the electrodes may be formed by vacuum deposition, sputtering, ion plating, plating, coating, or the like.

Hole Transport Layer

In the present embodiment, the charge transport layer 103 between the anode 102 and the active layer 104 is preferably a hole transport layer.

The hole transport layer 103 functions to transport holes from the active layer 104 to the anode 102. Also, the hole transport layer functions to inhibit electrons from flowing into the anode 102 from the active layer 104 to suppress the recombination of electrons and holes, thus preventing the decrease in photoelectric conversion efficiency. The hole transport layer is preferably in contact with the anode.

Hole-transporting materials that can form the hole transport layer 103 include electrically conductive polymers, such as polythiophene, polyaniline, polypyrrole, and polysilane; spiro compounds in which two rings share a central atom of a tetrahedral structure, such as C or Si; aromatic amine compounds, such as triarylamine; triphenylene compounds; nitrogen-containing heterocyclic compounds; and liquid crystalline cyano compounds.

Specific examples of the hole-transporting material include 2,2',7,7'-tetrakis-(N,N-di-p-methoxyphenylamine)-9,9-spirobifluorene (also called Spiro-OMeTAD), poly(3-hexylthiophene-2,5-diyl), 4-(diethylamino)benzaldehyde diphenylhydrazone, and polyethylenedioxythiophene (PEDOT). The hole transport layer 103 may contain an additive, such as lithium bis(trifluoromethanesulfonyl)imide or tert-butylpyridine (TBP).

The thickness of the hole transport layer 103 is preferably, but not particularly limited to, 1 μm or less, more preferably 100 nm to 600 nm. This thickness can be measured by observing a cross section of the photoelectric conversion element under a scanning electron microscope (SEM).

The hole transport layer 103 can be formed by preparing a coating liquid containing the above-described materials and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents.

Active Layer

The active layer contains a compound having a perovskite structure (perovskite compound). The perovskite compound preferably has an organic-inorganic hybrid structure in which organic and inorganic compounds are components of the perovskite structure and is particularly preferably a compound represented by the general formula $RMX_3$.

In the general formula $RMX_3$, R represents an organic molecule, such as methylamine, ethylamine, propylamine, butylamine, pentylamine, hexylamine, and ions thereof. M represents a metal atom, such as Cu, Ni, Mn, Fe, Co, Pd, Ge, Sn, Pb, and Eu. These metals may be used individually or in combination. Also, X represents a halogen atom, such as chlorine, bromine, iodine, or fluorine. These halogen atoms may be used individually or in combination.

The organic-inorganic perovskite compound is preferably a crystalline semiconductor. The organic-inorganic perovskite compound that is a crystalline semiconductor increases the mobility of electrons and improves the photoelectric conversion efficiency. A crystalline semiconductor refers to a semiconductor whose scattering peaks can be detected by measurements such as X-ray diffraction.

The thickness of the active layer 104 is preferably, but not particularly limited to, 2 μm or less, more preferably 200 nm to 1 μm.

The active layer 104 can be formed by preparing a coating liquid containing a material capable of forming a perovskite compound by a chemical reaction and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents.

Electrically Conductive Layer

In the present embodiment, the electrically conductive layer 105 disposed between the active layer 104 and the cathode 106 is an electron transport layer and contains electrically conductive particles produced by coating core particles with an electrically conductive material. The core particles are different in composition or material from the electrically conductive material forming the coating layer.

In the present embodiment, examples of the electrically conductive material forming the coating layer of the electrically conductive particles include metal-based materials, such as metal oxides, aluminum, palladium, iron, copper, and silver; composite materials surface-treated by electrolysis, spray coating, or mixed vibration; carbon black; and carbon black-based materials. Among these, carbon black and metal oxides are preferable. A metal oxide is further preferable. The metal oxide is preferably any one selected from tin oxide, zinc oxide, and titanium oxide.

Additionally, such metal oxides can contribute to increase in current density when appropriately reduced to have an oxygen-deficient structure or appropriately doped. When tin oxide is used, the tin oxide is preferably doped with an element selected from niobium, tantalum, phosphorus, tungsten, and fluorine. When zinc oxide is used, the zinc oxide is preferably doped with either element aluminum or gallium. When titanium oxide is used, the titanium oxide is preferably doped with either element niobium or tantalum.

The amount of dopant element for the metal oxide is preferably 0.5% by mass to 10.0% by mass in the coating layer. When the dopant content is less than 0.5% by mass, the effect of increasing current density may not be sufficient. In contrast, a dopant content of more than 10.0% by mass may be prone to cause leakage in the photoelectric conversion element. Preferably, the dopant content is 1.0% by mass to 7.0% by mass in the coating layer.

In the present embodiment, the material of the core particles of the electrically conductive particles may be a metal compound, a metal, carbon black, resin, or the like. Examples of the metal compound include zinc oxide, aluminum oxide, indium oxide, silicon oxide, zirconium oxide, tin oxide, titanium oxide, magnesium oxide, antimony oxide, bismuth oxide, barium sulfate, strontium titanate, barium titanate, and potassium niobate. Examples of the metal include aluminum, nickel, iron, nichrome, copper, zinc, and silver. Examples of the resin include acrylic resin, fluororesin, polystyrene resin, polyethylene resin, and silicone resin.

Particles in various forms, such as spherical, polyhedral, elliptical, flaky, and needle-like, may be used as the core particles. Among these, spherical, polyhedral, or elliptical core particles are preferably used from the viewpoint of electron injection at the interface between the active layer and the electrically conductive layer. More preferably, the core particles are spherical or near-spherical polyhedral.

In the present embodiment, the aspect ratio of the electrically conductive particles expressed by the ratio (a/b) of the average major axis diameter a to the average minor axis diameter b is preferably 3.0 or less. An aspect ratio of 3.0 or less is preferred because such an aspect ratio increases the electron injection efficiency from the active layer to the electrically conductive layer 105.

Preferably, the average major axis diameter a and the average minor axis diameter b of the electrically conductive particles are both 50 nm to 600 nm. When the average major axis diameter a and the average minor axis diameter b are 50 nm or more, the electrically conductive particles are less likely to re-aggregate after the coating liquid for the electrically conductive layer has been prepared. Also, when the average major axis diameter a and the average minor axis diameter b are 600 nm or less, the surface of the electrically conductive layer 105 is less likely to be roughened. The electrically conductive layer 105 with a roughened surface is prone to cause leakage. More preferably, in the present embodiment, the average major axis diameter a and the average minor axis diameter b of the electrically conductive particles are 50 nm to 400 nm.

In the present embodiment, the average major axis diameter a and the average minor axis diameter b of the electrically conductive particles are measured with a scanning electron microscope. Specifically, electrically conductive particles to be measured are observed under a scanning electron microscope "S-4800" (manufactured by Hitachi, Ltd.), and the major and minor axis diameters of 100 electrically conductive particles randomly selected from an image obtained by the observation are measured, followed by calculating their arithmetic means.

Preferably, the average major axis diameter and the average minor axis diameter of the core particles are 1 time to 50 times, more preferably 5 times to 20 times, as large as the average thickness of the coating layer.

The electrically conductive layer according to the present embodiment may be made only of the above-described electrically conductive particles but may contain a binder in addition to the electrically conductive particles. Examples of the binder include polyester resin, polycarbonate resin, polyvinyl acetal resin, acrylic resin, silicone resin, epoxy resin, melamine resin, polyurethane resin, phenol resin, and alkyd resin. In the present embodiment, the electrically conductive layer 105 contains preferably 20% by volume or more of the above-described electrically conductive particles. When the electrically conductive particle content is less than 20% by volume, the distance between the electrically conductive particles increases, and the current density tends to decrease accordingly. Accordingly, for the electrically conductive layer 105 containing electrically conductive particles and a binder resin, the binder resin content of the electrically conductive layer 105 is 80% by volume or less.

The average thickness of the electrically conductive layer 105 is preferably 0.1 μm to 1.0 μm and is more preferably 0.1 μm to 0.5 μm.

The electrically conductive layer 105 can be formed by preparing a coating liquid for the electrically conductive layer containing the above-described electrically conductive particles and a solvent, and optionally the above-described binder resin, forming a coating film of the coating liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents. For dispersing the electrically conductive particles in the coating liquid for the electrically conductive layer, a method using a paint shaker, a sand mill, a ball mill, or a high-speed liquid collision disperser may be used. The coating liquid for the electrically conductive layer prepared by dispersion may be filtered to remove unnecessary materials.

Third Embodiment

The third embodiment of the present invention will be described in detail below.

The present inventors have found through their study that the configuration having a first layer containing a perovskite compound between an anode and a cathode and a second layer featured by the present embodiment between the cathode and the first layer increases the photoelectric conversion efficiency.

It is unknown how the present embodiment produces such an effect, but the present inventors presume the following mechanism. The inventors think that two effects produced by any of the features of the present embodiment given to the second layer containing an electron-transporting compound increase the photoelectric conversion efficiency. One of the two is probably that the electron-transporting compound enhances electron extraction. The inventors think that aligning the levels of the perovskite compound and the electron-transporting compound allows electrons to move rapidly, thereby increasing the photoelectric conversion efficiency. The other is probably that the formation of the first layer disposed on the second layer is promoted, thus improving the crystallinity of the first layer. Probably, the feature of the present embodiment given to the second layer facilitates interface formation and forms a surface with a wettability imparting an affinity with the first layer, thus promoting crystal growth. The inventors think that the improved crystallinity of the first layer increases light absorption, allows generated charges to move efficiently, and consequently increases the photoelectric conversion efficiency.

The photoelectric conversion element of the present embodiment includes a first layer containing a perovskite compound between an anode and a cathode and a second layer between the cathode and the first layer.

Figure 4A:
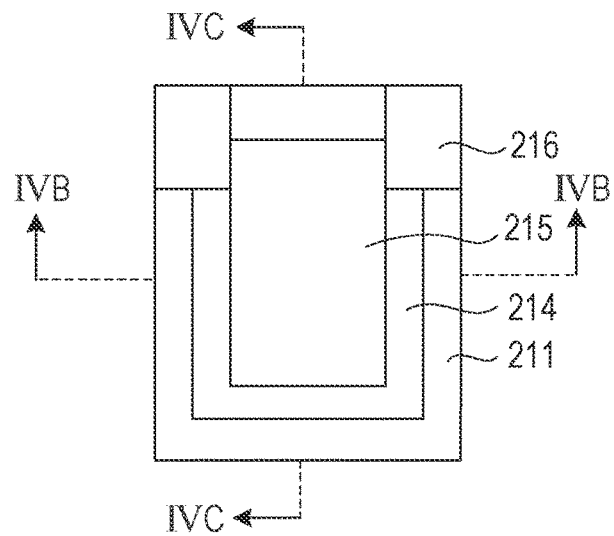
FIG. 4A is a diagram illustrating an example of the configuration of a photoelectric conversion element according to an embodiment of the present invention.
Figure 4B:
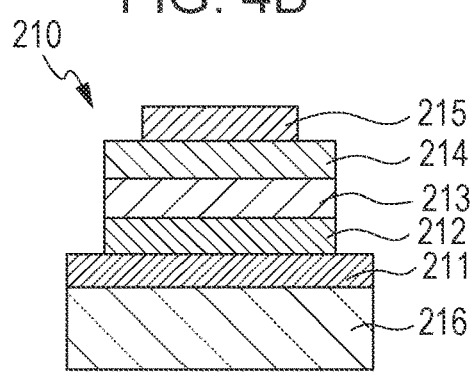
FIG. 4B is a diagram illustrating an example of the configuration of a photoelectric conversion element according to an embodiment of the present invention.
Figure 4C:
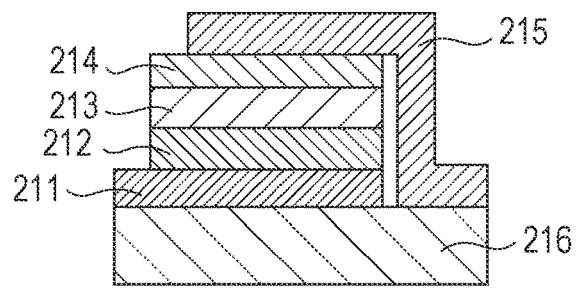
FIG. 4C is a diagram illustrating an example of the configuration of a photoelectric conversion element according to an embodiment of the present invention.

FIGS. 4A to 4C are diagrams illustrating an example of the configuration of a photoelectric conversion element according to the present embodiment. FIG. 4A is a plan view when viewed from the cathode side. FIG. 4B is a sectional view across IVB-IVB in FIG. 4A. FIG. 4C is a sectional view across IVC-IVC in FIG. 4A. In the photoelectric conversion element depicted in FIGS. 4A to 4C, a substrate 216, an anode 211, a third layer 212, a first layer 213, a second layer 214, and a cathode 215 are formed in this order. Current is generated between the anode 211 and the cathode 215 through an external circuit. In this instance, the first layer 213 is the photoelectric conversion layer that is excited by light entering through the substrate 216, the anode 211, and the third layer 212 or through the cathode 215 and the second layer 214 to produce electrons or holes and generate a current between the anode 211 and the cathode 215. The third layer 212 is a layer between the first layer 213 and the anode 211 and is not necessarily an essential layer. The first layer 213 may be in a tandem structure including a plurality of layers.

In the manufacture of the photoelectric conversion element of the present embodiment, a process may be used in which coating liquids for each layer described later are prepared and applied according to the desired order of the layers, followed by drying. In this process, the coating liquids may be applied by dip coating, spray coating, ink jet coating, dispensing coating, roll coating, die coating, blade coating, curtain coating, wire bar coating, ring coating, spin coater coating, or the like.

Substrate 216

The substrate 216 is preferably a substrate that can be provided with an electrode on the main surface thereof, and that is made of a material not chemically changed when the function layer of the photoelectric conversion element is formed. Examples of the material of the supporting substrate include glass, plastics, polymer films, and silicon.

Electrodes (Anode 211, Cathode 215)

The electrodes are made of electrically conductive material. Examples of the material of the electrodes include metal, inorganic compounds such as metal oxides, and organic compounds such as electrically conductive polymer. The electrodes may be defined by a single layer or a stack of a plurality of layers.

In the photoelectric conversion element of the present embodiment, the perovskite compound in the first layer 213 absorbs light entering through either electrode to produce electrons and holes. Thus produced electrons reach the cathode 215, and holes reach the anode 211. The electrons and holes are extracted as electrical energy (current) outside the photoelectric conversion element. In order for the photoelectric conversion element to function effectively, incident light must reach the first layer 213 through the substrate 216. Highly transparent materials are suitably used for the substrate 216 and the electrodes. In the photoelectric conversion element configured to take light from the substrate 216 side, highly light-transmissive materials are suitable for the substrate 216 and the electrode on the substrate 216. In the photoelectric conversion element configured to take light from the side of the electrode farther from the substrate 216, highly light-transmissive materials are suitable for the electrode farther from the substrate 216.

Examples of transparent or translucent electrode materials include electrically conductive metal oxides and metals. When the electrode material is not transparent, the material can be thinned to such a thickness as to transmit light so that the electrode functions as a transparent or translucent electrode. Specific examples of transparent or translucent electrode materials include, for example, indium oxide, zinc oxide, tin oxide, and their composites, such as ITO, IZO, FTO, and NESA, gold, platinum, silver, copper, and aluminum.

The method for forming the electrodes is not limited. For example, the electrodes may be formed by vacuum deposition, sputtering, ion plating, plating, coating, or the like.

Third Layer 212

Preferably, the photoelectric conversion element according to the present embodiment includes a third layer 212 between the first layer 213 and the anode 211. The third layer 212 may be a hole transport layer.

The third layer 212 functions to transport holes from the first layer 213 to the anode 211. Also, the third layer functions to inhibit electrons from flowing into the anode 211 from the first layer 213 to suppress the recombination of electrons and the holes, thus preventing the decrease in photoelectric conversion efficiency. The third layer 212 is preferably in contact with the anode 211.

Hole-transporting materials that can form the third layer 212 include electrically conductive polymers, such as polythiophene, polyaniline, polypyrrole, and polysilane; spiro compounds in which two rings share a central atom of a tetrahedral structure, such as C or Si; aromatic amine compounds, such as triarylamine; triphenylene compounds; nitrogen-containing heterocyclic compounds; and liquid crystalline cyano compounds. Specific examples of the hole-transporting material include 2,2',7,7'-tetrakis-(N,N-di-p-methoxyphenylamine)-9,9-spirobifluorene (also called Spiro-OMeTAD), poly(3-hexylthiophene-2,5-diyl), 4-(diethylamino)benzaldehyde diphenylhydrazone, and polyethylenedioxythiophene (PEDOT).

The third layer 212 may contain an additive, such as lithium bis(trifluoromethanesulfonyl)imide or t-butylpyridine (TBP).

The thickness of the third layer 212 is preferably, but not particularly limited to, 1 µm or less, more preferably 200 nm to 60 µm. The thickness can be measured by observing a cross section of the photoelectric conversion element under a scanning electron microscope (SEM).

The third layer 212 can be formed by preparing a coating liquid for the electrically conductive layer containing the above-described materials and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents.

First Layer 213

The first layer 213 contains a perovskite compound (compound having a perovskite structure). The first layer 213 may be an active layer, a function layer, or a photoelectric conversion layer.

The perovskite compound preferably has an organic-inorganic hybrid structure in which organic and inorganic compounds are components of the perovskite structure.

The organic-inorganic perovskite compound is preferably a compound represented by the general formula $RMX_3$.

In the general formula $RMX_3$, R represents an organic molecule, such as methylamine, ethylamine, propylamine, butylamine, pentylamine, hexylamine, and ions thereof.

In the general formula $RMX_3$, M represents a metal atom, such as Cu, Ni, Mn, Fe, Co, Pd, Ge, Sn, Pb, and Eu. These metals may be used individually or in combination.

In general formula $RMX_3$, X represents a halogen atom, such as chlorine, bromine, iodine, or fluorine. These halogen atoms may be used individually or in combination.

The organic-inorganic perovskite compound is preferably a crystalline semiconductor. The organic-inorganic perovskite compound that is a crystalline semiconductor increases the mobility of electrons and improves the photoelectric conversion efficiency. A crystalline semiconductor refers to a semiconductor whose scattering peaks can be detected by measurements such as X-ray diffraction.

The thickness of the portion made of the organic-inorganic perovskite compound portion is preferably, but not particularly limited to, 2 μm or less, more preferably 200 nm to 1 μm.

The first layer 213 can be formed by preparing a coating liquid for the electrically conductive layer containing the above-described materials and a solvent, forming a coating film of this liquid, and drying the coating film. Examples of the solvent used in the coating liquid include alcohol-based solvents, sulfoxide-based solvents, ketone-based solvents, ether-based solvents, ester-based solvents, and aromatic hydrocarbon-based solvents. In particular, from the viewpoint of improving the solubility of the materials of the first layer 213, and improving the crystallinity, aprotic polar solvents, such as dimethyl sulfoxide and dimethylformamide are preferred.

Second Layer 214

The photoelectric conversion element according to the present embodiment includes a second layer 214 between the first layer 213 and the cathode 215. The second layer 214 may be a foundation layer or an electrically conductive layer.

First Photoelectric Conversion Element

In a first photoelectric conversion element, the second layer 214 contains a polymer compound, and the polymer compound is bound to an electron-transporting compound.

Examples of the electron-transporting compound contained in the second layer 214 include oxadiazole derivatives, anthraquinodimethane and its derivatives, benzoquinone and its derivatives, naphthoquinone and its derivatives, anthraquinone and its derivatives, tetracyanoquinodimethane and its derivatives, fluorenone derivatives, diphenyldicyanoethylene and its derivatives, diphenoquinone derivatives, 8-hydroxyquinoline and metal complexes of its derivatives, polyquinoline and its derivatives, polyquinoxaline and its derivatives, polyfluorene and its derivatives, fullerenes and their derivatives, phenanthrene derivatives such as bathocuproine, naphthalenetetracarboxylic diimide and its derivatives, perylenetetracarboxylic diimide and its derivatives, and pyromellitic diimide and its derivatives. In particular, naphthalenetetracarboxylic diimide and its derivatives, perylenetetracarboxylic diimide and its derivatives, and pyromellitic diimide and its derivatives are preferred.

The second layer 214 may be a cured film formed by curing a curable resin, and the electron-transporting compound may be bound to the chain of the resin forming the cured film.

Second Photoelectric Conversion Element

In a second photoelectric conversion elements, the second layer 214 contains at least one of the structures represented by formulas (E-1) to (E-3) and at least one of the structures represented by formulas (P-1) to (P-5). The second layer 214 is a layer (cured layer) containing at least one of the structures represented by formulas (E-1) to (E-3) and at least one of the structures represented by formulas (P-1) to (P-5). In other words, the second layer 214 includes a cured film (polymer) having at least one of the structures represented by formulas (E-1) to (E-3) and at least one of the structures represented by formulas (P-1) to (P-5).

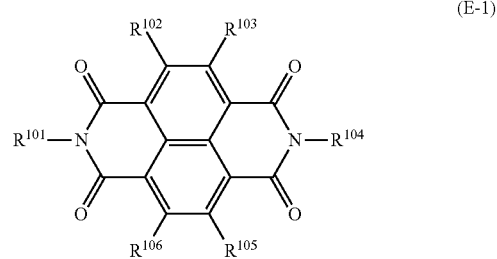

(E-1)

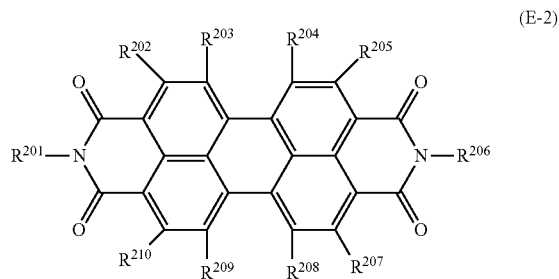

(E-2)

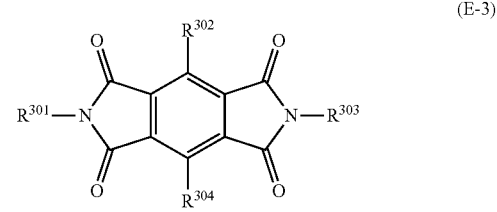

(E-3)

In formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group. One or two of $R^{101}$ to $R^{106}$, one or two of $R^{201}$ to $R^{210}$, and one or two of $R^{301}$ to $R^{304}$ are single bonds. The substituent of the substituted alkyl group is an alkyl group, an aryl group, a halogen atom, or a carbonyl group. The substituent of the substituted aryl group or the substituted heterocyclic group is a halogen atom, a nitro group, a cyano group, an alkyl group, a halogen-substituted alkyl group, an alkoxy group, or a carbonyl group.

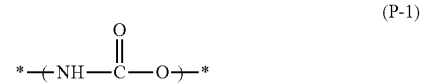

(P-1)

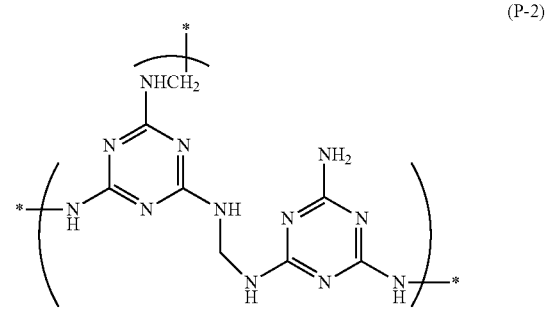

(P-2)

-continued

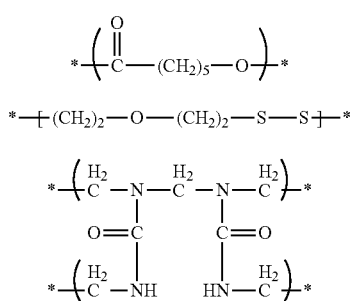

(P-3)

(P-4)

(P-5)

In formulas (P-1) to (P-5), * designates a binding site.

The single bond may be a single bond that binds to the chain of the resin forming the second layer 214, and the structures represented by formulas (P-1) to (P-5) may be a part of the resin chain.

Tables 1 to 5 presents specific examples of formulas (E-1) to (E-3). In Tables 1 to 5, each binding site is designated by a dotted line. The specific examples presented in Tables 1 to 5 are each a specific structure of $E^1$ of the specific example presented in Tables 6 to 11 or Tables 12 to 19 that is denoted by the corresponding number. Tables 1 to 5 may therefore present the same structure in duplicate.

TABLE 1

| Specific example | E-1 |
|---|---|
| 101 | |
| 102 | |
| 103 | |
| 104 | |
| 105 | |

TABLE 1-continued
| Specific example | E-1 |
|---|---|
| 106 | 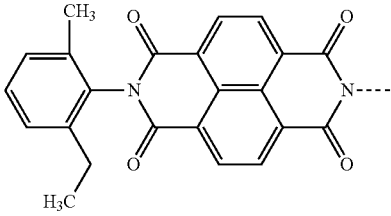 |
| 107 | 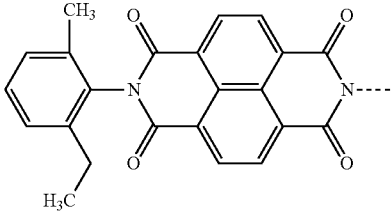 |
| 108 | 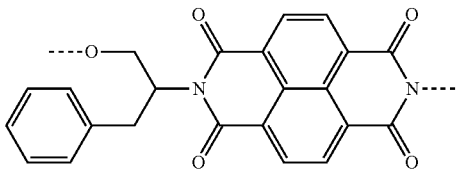 |
| 109 | 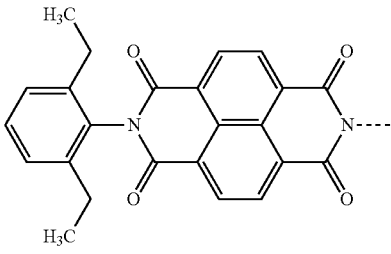 |
| 110 | 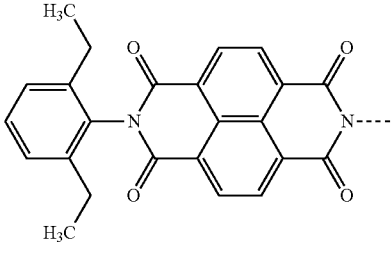 |
| 111 | 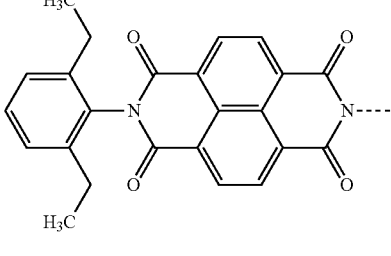 |

TABLE 1-continued
| Specific example | E-1 |
|---|---|
| 112 | 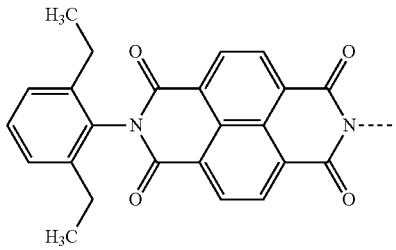 |
| 113 | 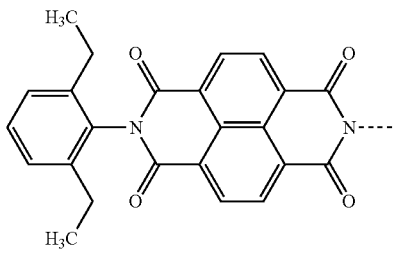 |
| 114 | 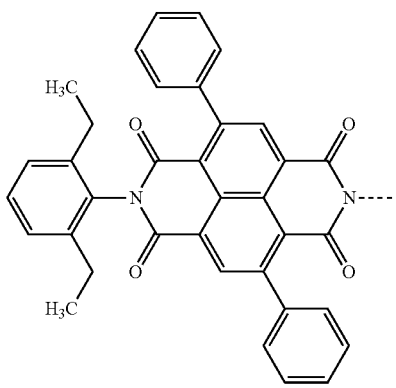 |
| 115 | 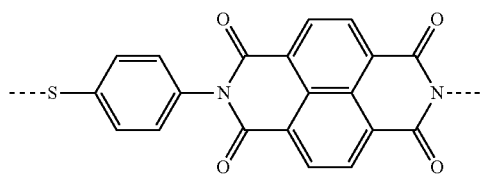 |
| 116 | 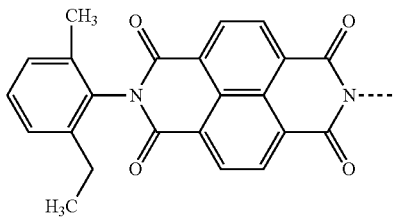 |
| 117 | 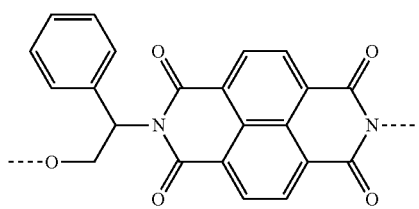 |

TABLE 1-continued
| Specific example | E-1 |
|---|---|
| 118 | 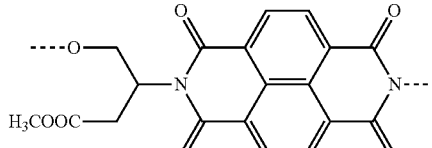 |
| 119 | 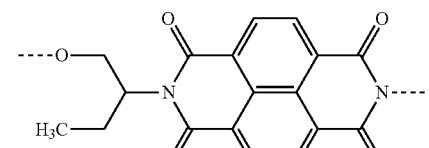 |
| 120 | 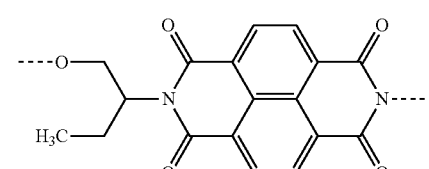 |
| 121 | 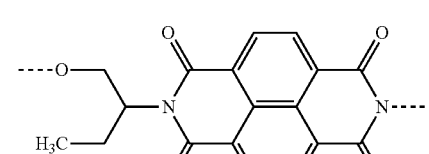 |
| 122 | 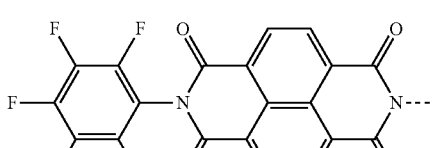 |
| 123 | 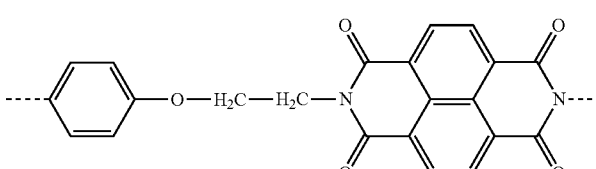 |
| 124 | 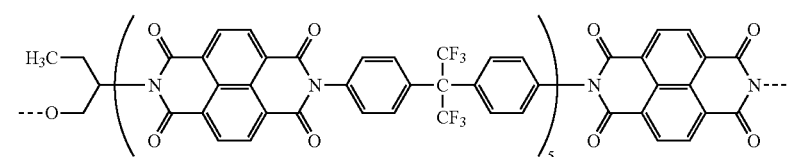 |

TABLE 2
| Specific example | E-1 |
|---|---|
| 125 | 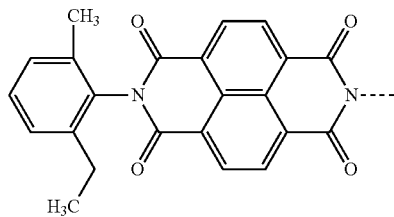 |
| 126 | 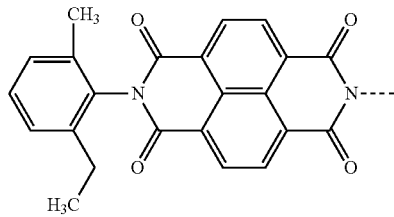 |
| 127 | 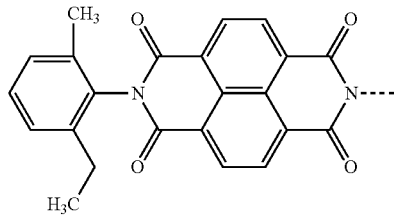 |
| 128 | 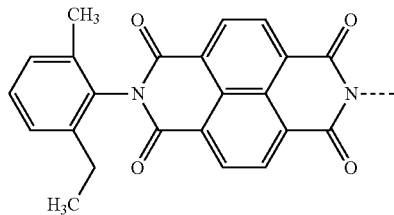 |
| 129 | 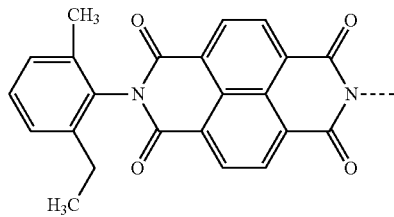 |
| 130 | 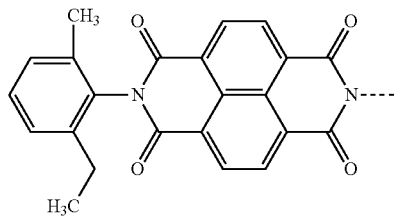 |
| 131 | 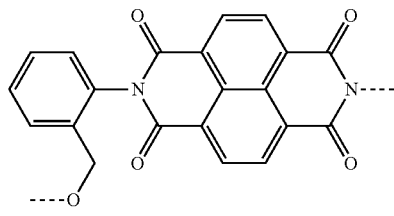 |

TABLE 2-continued
| Specific example | E-1 |
|---|---|
| 132 | 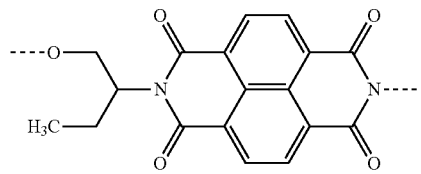 |
| 133 | 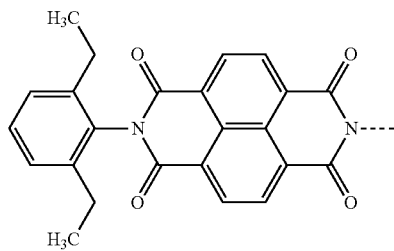 |
| 134 | 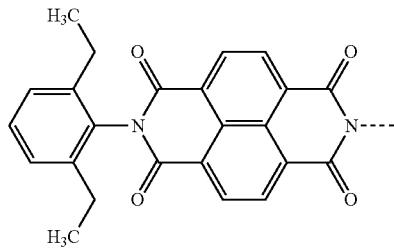 |
| 135 | 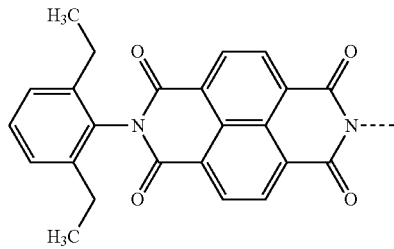 |
| 136 | 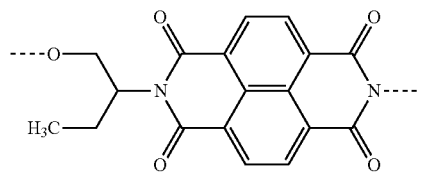 |
| 138 | 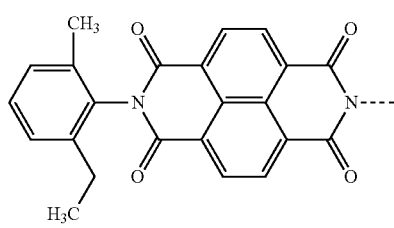 |
| 139 | 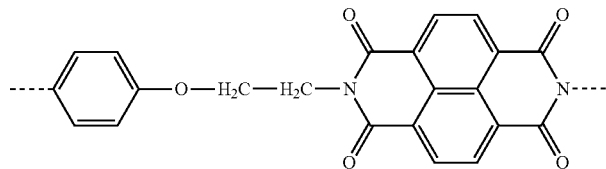 |

TABLE 2-continued
| Specific example | E-1 |
|---|---|
| 137 | 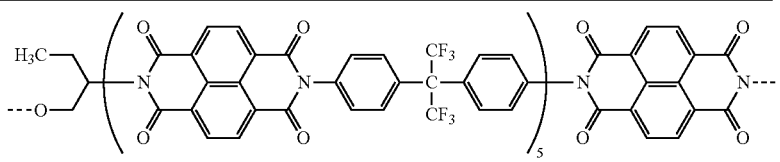 |
TABLE 3
| Specific example | E-1 |
|---|---|
| 140 | 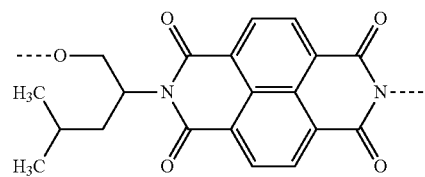 |
| 141 | 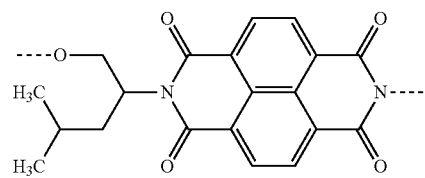 |
| 142 | 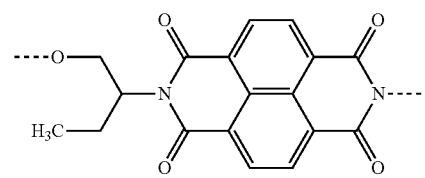 |
| 143 | 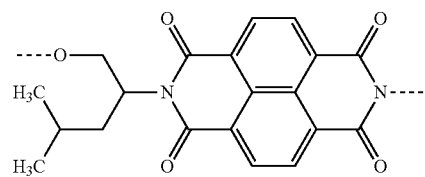 |
| 144 | 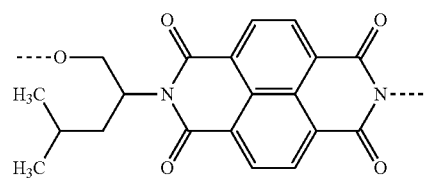 |
| 145 | 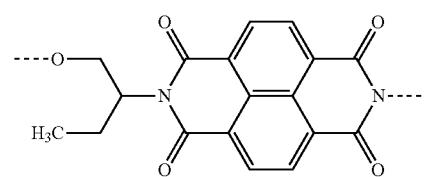 |
TABLE 3-continued
| Specific example | E-1 |
|---|---|
| 151 | 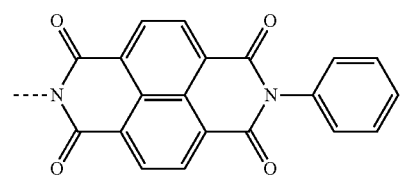 |
| 152 | 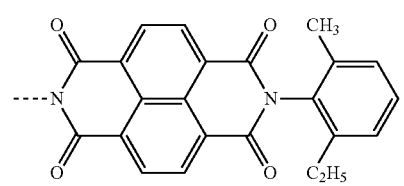 |
TABLE 4
| Specific example | E-1 |
|---|---|
| 2001 | 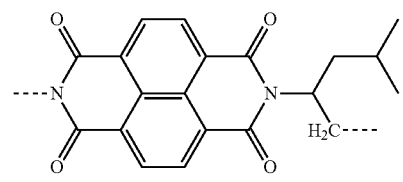 |
| 2002 | 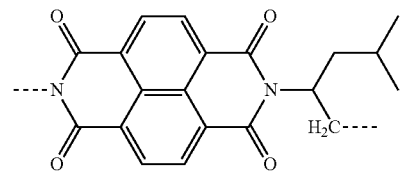 |
| 2003 | 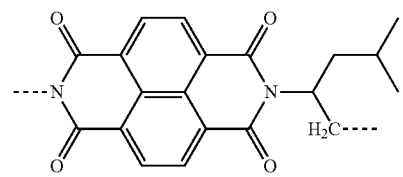 |

TABLE 4-continued
| Specific example | E-1 |
|---|---|
| 2004 | 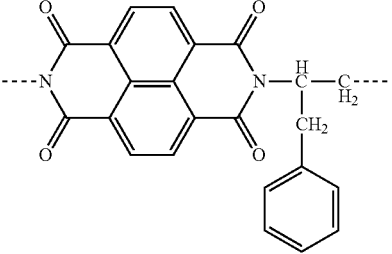 |
| 2005 | 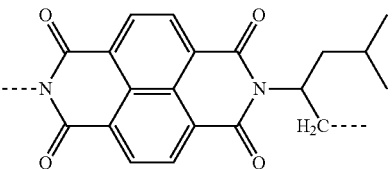 |
| 2006 | 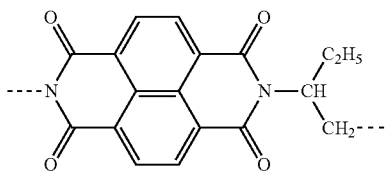 |
| 2007 | 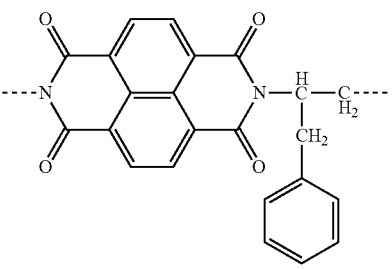 |
| 2008 | 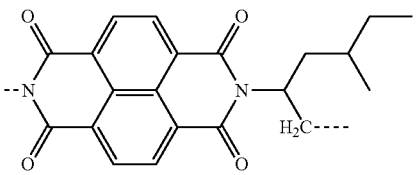 |
| 2009 | 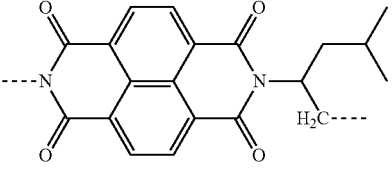 |
| 2010 | 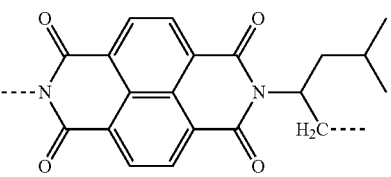 |
| 2011 | 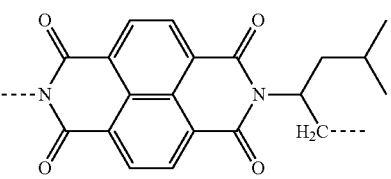 |
| 2012 | 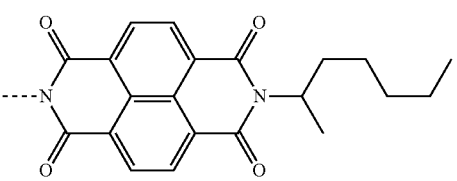 |
| 2013 | 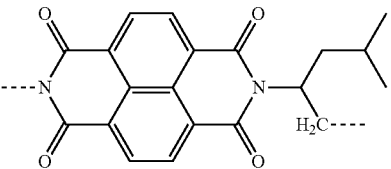 |
| 2014 | 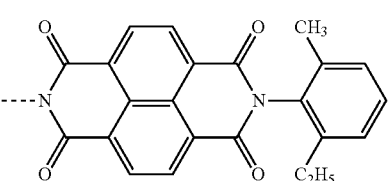 |
| 2015 | 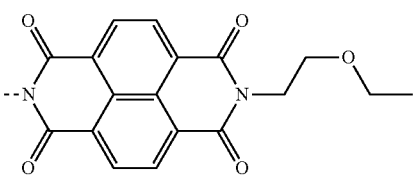 |

TABLE 5

| Specific example | E-2 | Specific example | E-3 |
|---|---|---|---|
| 201 | | 301 | |
| 202 | | 302 | |
| 203 | | 303 | |
| 204 | | 304 | |
| 205 | | 305 | |
| 206 | | 306 | |

TABLE 5-continued

| Specific example | E-2 | Specific example | E-3 |
|---|---|---|---|
| 207 | [structure] | 307 | [structure] |
| 208 | [structure] | 308 | [structure] |

The second layer 214 may be formed, for example, as described below. First, a crosslinking agent, a resin with a polymerizable functional group capable of reacting with the crosslinking agent, and an electron-transporting compound with a polymerizable functional group capable of reacting with the crosslinking agent are dissolved in a solvent to prepare a coating liquid. A coating film of the coating liquid is formed and thermally cured to yield the second layer 214. Thermal curing is preferred because the reaction can be more uniformly made when conducted during drying.

Electron-Transporting Compound

The electron-transporting compound is preferably a naphthalenetetracarboxylic diimide derivative, a perylenetetracarboxylic diimide derivative, or a pyromellitic diimide derivative. Additionally, the electron-transporting compound preferably has a polymerizable functional group capable of reacting with the crosslinking agent. Examples of the polymerizable functional group include a hydroxy group, a thiol group, a carboxyl group, an amino group, an isocyanate group, and an acrylic group.

The derivatives (electron-transporting material derivatives) having the structure represented by (E-1) can be synthesized by known synthesizing processes, such as those described in U.S. Pat. Nos. 4,442,193, 4,992,349, and 5,468,583 and Chemistry of materials, Vol. 19, No. 11, 2703-2705 (2007). Also, such a derivative may be synthesized by a reaction of a naphthalenetetracarboxylic acid dianhydride available from Tokyo Chemical Industry Co., Ltd., Sigma-Aldrich Japan, or Johnson Matthey Japan G.K. with a monoamine derivative.

In order for the electron-transporting material to have a polymerizable functional group (e.g., hydroxy group, thiol group, amino group, or carboxyl group) capable of reacting with the crosslinking agent, for example, such a polymerizable functional group may be introduced directly into the derivative with an (E-1) structure, or a structure with a polymerizable functional group or a functional group capable of acting as a precursor of the polymerizable functional group may be introduced. In the latter process, for example, a functional group-containing aryl group may be introduced into a halogenated naphthyltetracarboxy diimide derivative using a cross-coupling reaction using a palladium catalyst and a base, or a functional group-containing alkyl group may be introduced to the derivative using a cross-coupling reaction using a $FeCl_3$ catalyst and a base. Alternatively, after lithiation, an epoxy compound and $CO_2$ may be allowed to act on the derivative to introduce a hydroxy alkyl group or a carboxyl group. In the former process, for example, a naphthalenetetracarboxylic acid dianhydride derivative with a polymerizable functional group or a functional group capable of acting as a precursor of the polymerizable functional group or a monoamine derivative may be used as a raw material for synthesizing a naphthyltetracarboxy diimide derivative.

Derivatives with a structure represented by (E-2) or (E-3) may be synthesized by, for example, a known process described in Journal of the American chemical society, Vol. 129, No. 49, 15259-78 (2007). Also, such a derivative may be synthesized by a reaction of a perylenetetracarboxylic acid dianhydride (E-2) or pyromellitic acid dianhydride (E-3) available from Tokyo Chemical Industry Co., Ltd., Sigma-Aldrich Japan, or Johnson Matthey Japan G.K. with a monoamine derivative.

In a process for introducing such a polymerizable functional group into a derivative with a (E-2) or (E-3) structure, the polymerizable functional group may be introduced directly into the derivative, or a structure with a polymerizable functional group or a functional group capable of acting as a precursor of the polymerizable functional group may be introduced. In the latter process, for example, a halogenated compound of perylenetetracarboxylic diimide derivative or pyromellitic acid diimide derivative may be subjected to a cross-coupling reaction using a palladium catalyst and a base or a cross-coupling reaction using a $FeCl_3$ catalyst and a base. In the former process, for example, a perylenetetracarboxylic acid dianhydride derivative with a polymerizable functional group or a functional group capable of acting as a precursor of the polymerizable functional group or a monoamine derivative may be used as a raw material for synthesizing a perylene diimide derivative.

Examples of electron-transporting compounds with a polymerizable functional group include the following.
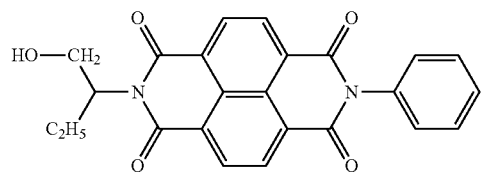 (E-1-1)
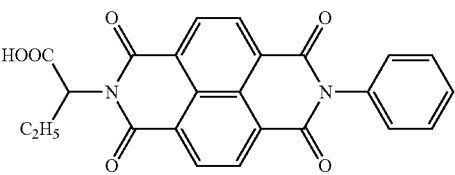 (E-1-2)
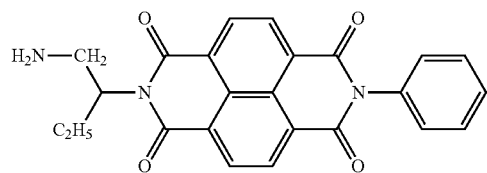 (E-1-3)
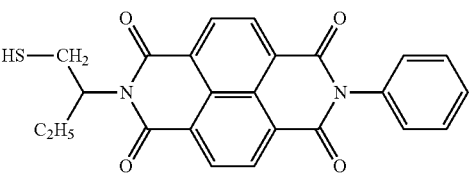 (E-1-4)
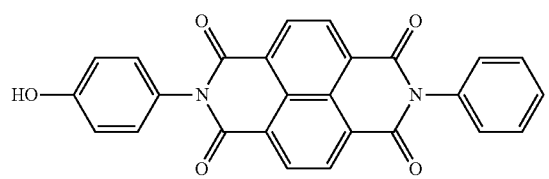 (E-1-5)
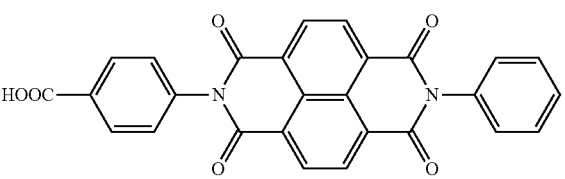 (E-1-6)
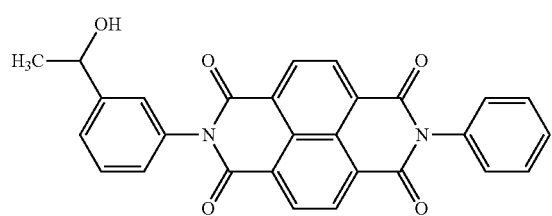 (E-1-7)
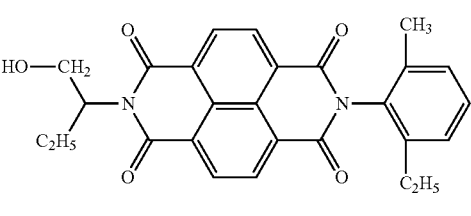 (E-1-8)
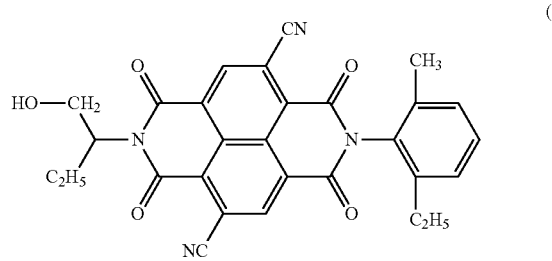 (E-1-9)
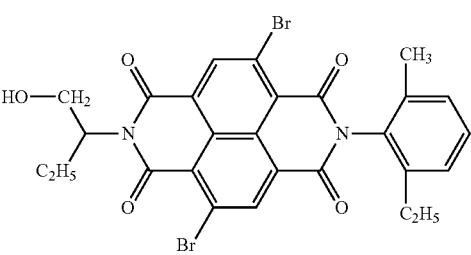 (E-1-10)
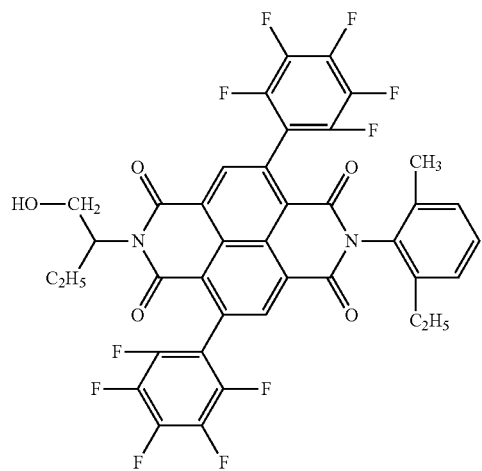 (E-1-11)
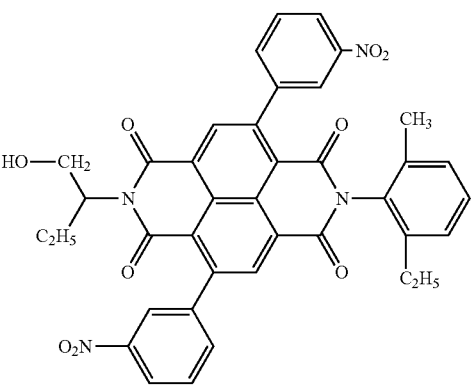 (E-1-12)

-continued
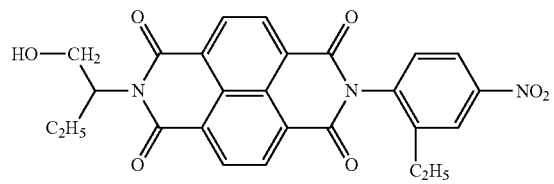
(E-1-13)
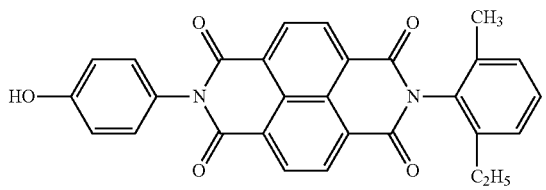
(E-1-14)
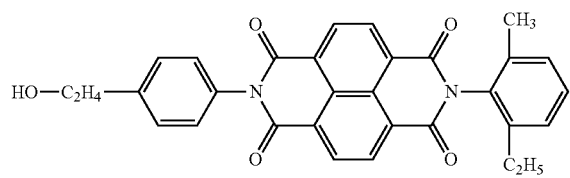
(E-1-15)
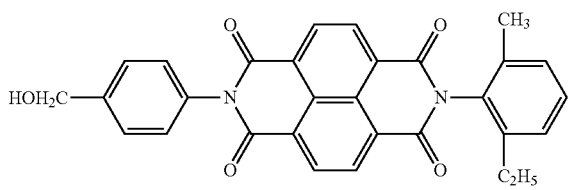
(E-1-16)
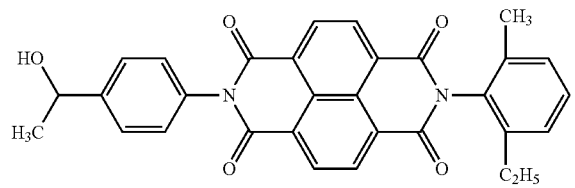
(E-1-17)
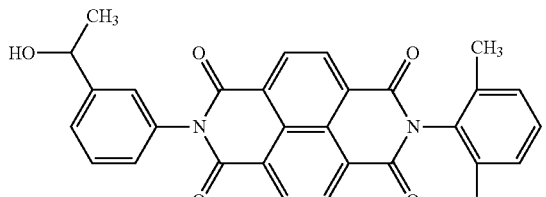
(E-1-18)
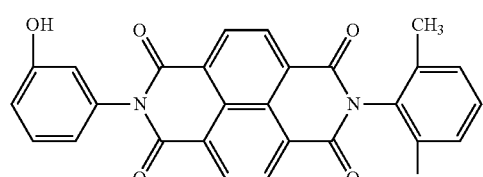
(E-1-19)
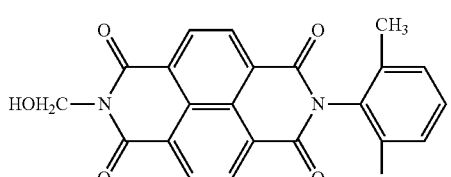
(E-1-20)
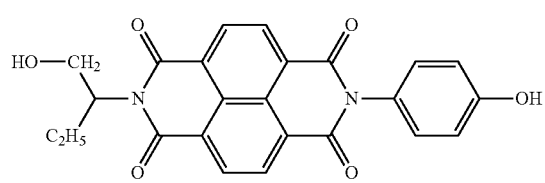
(E-1-21)
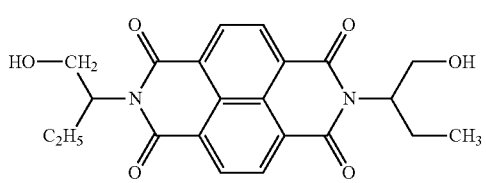
(E-1-22)
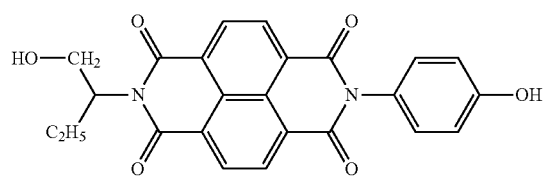
(E-1-23)
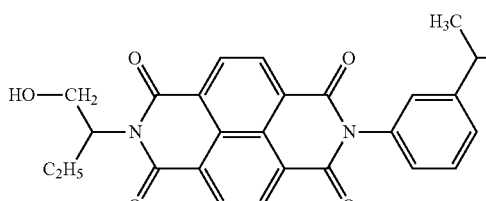
(E-1-24)
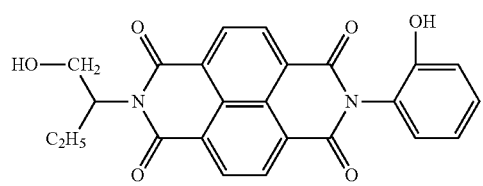
(E-1-25)
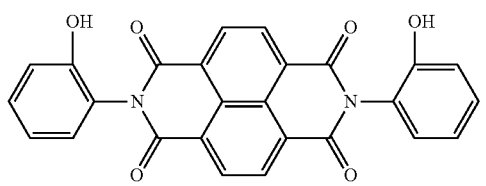
(E-1-26)

-continued
(E-1-27)
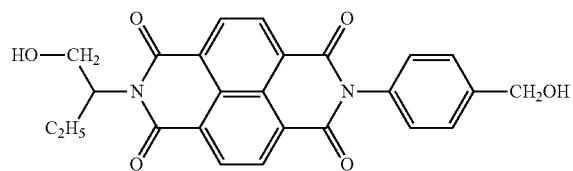
(E-1-28)
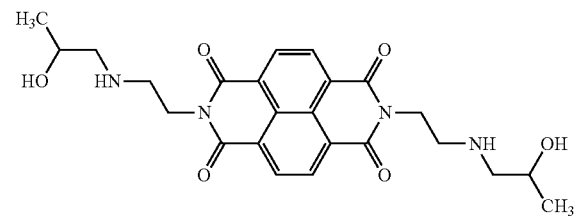
(E-1-29)
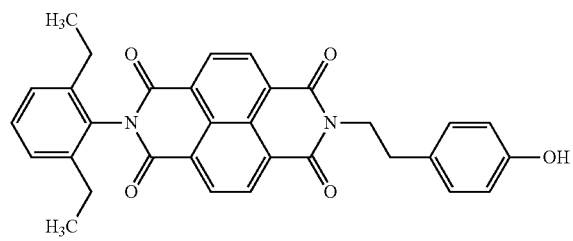
(E-1-30)
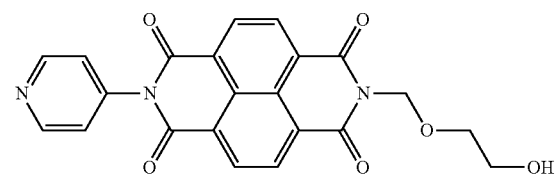
(E-1-31)
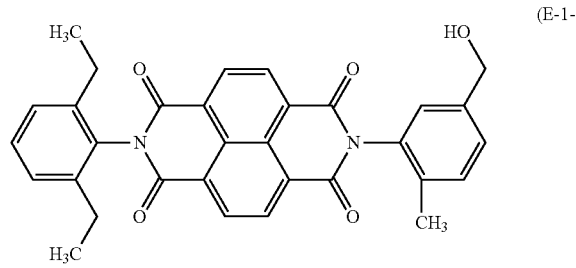
(E-1-32)
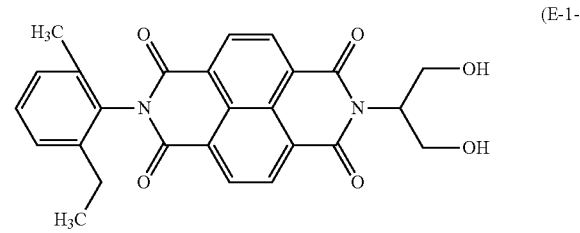
(E-1-33)
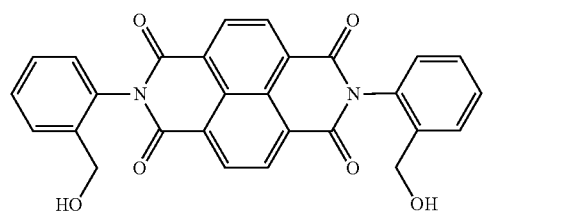
(E-1-34)
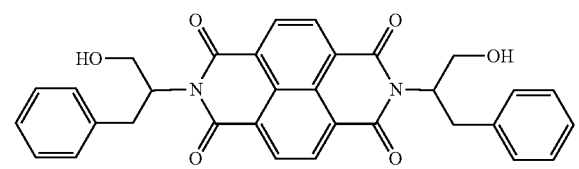
(E-1-35)
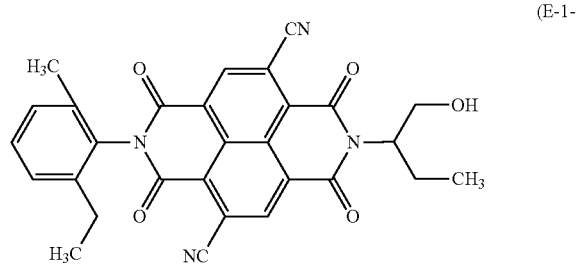
(E-1-36)
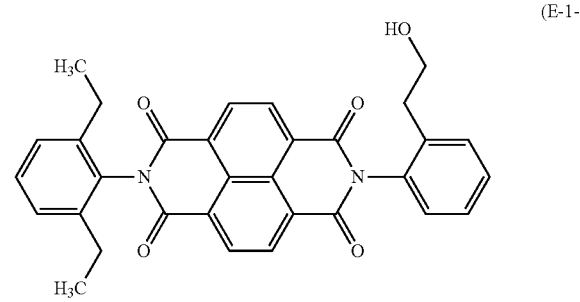
(E-1-37)
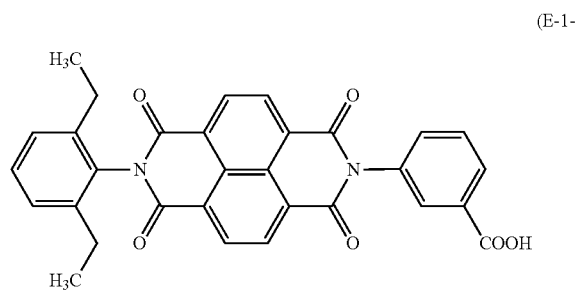
(E-1-38)
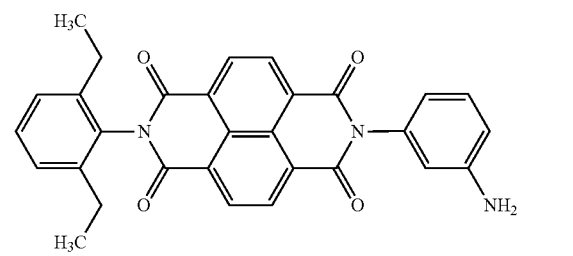

-continued
(E-1-39)
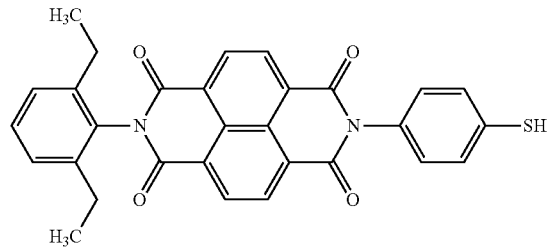
(E-1-40)
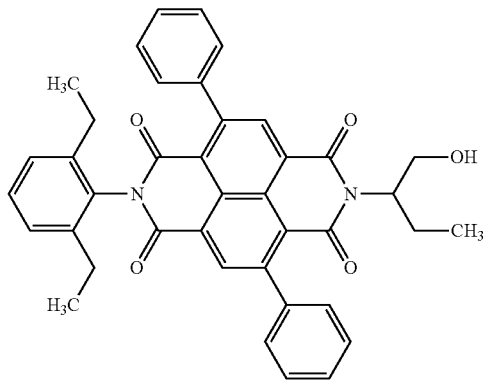
(E-1-41)
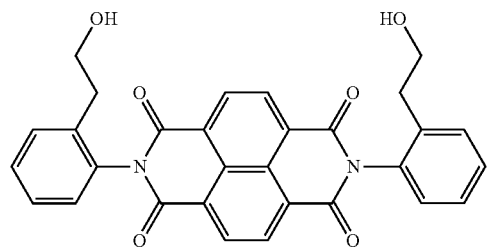
(E-1-42)
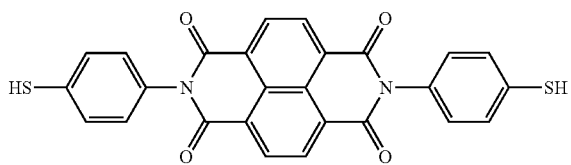
(E-1-43)
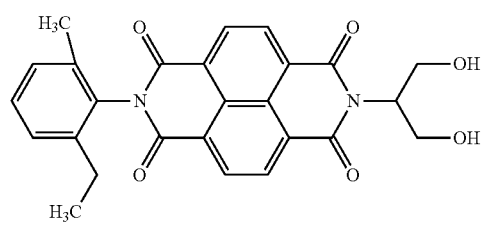
(E-1-44)
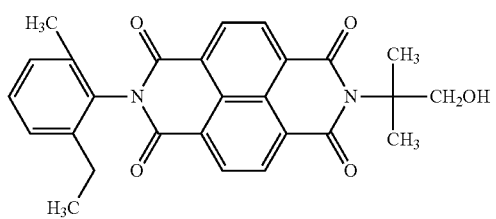
(E-1-45)
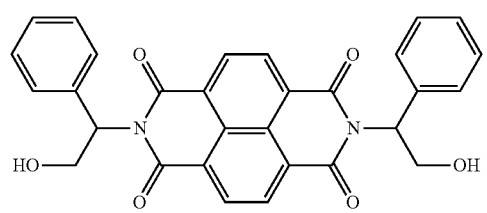
(E-1-46)
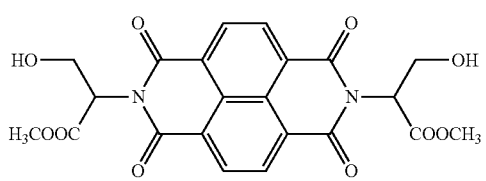
(E-1-47)
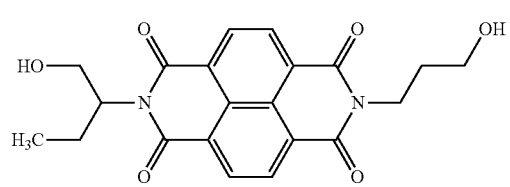
(E-1-48)
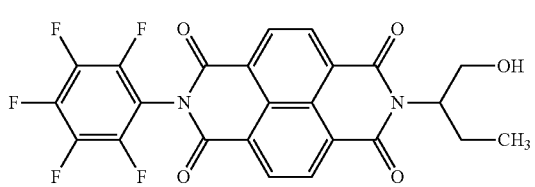
(E-1-49)
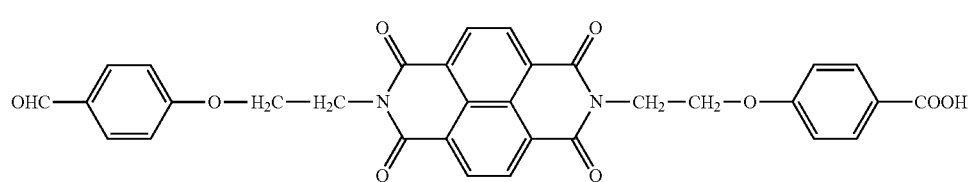

-continued
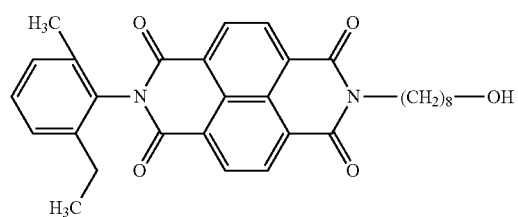
(E-1-50)
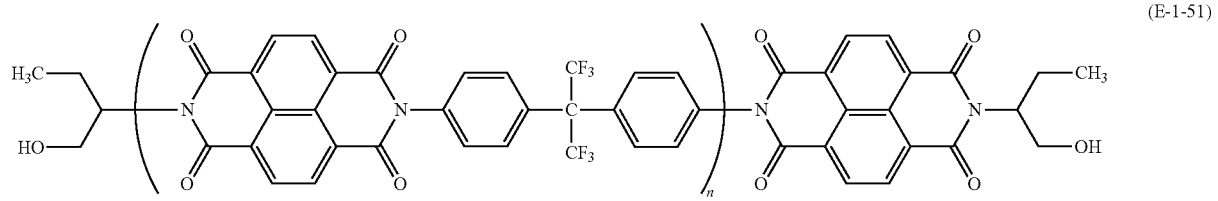
(E-1-51)
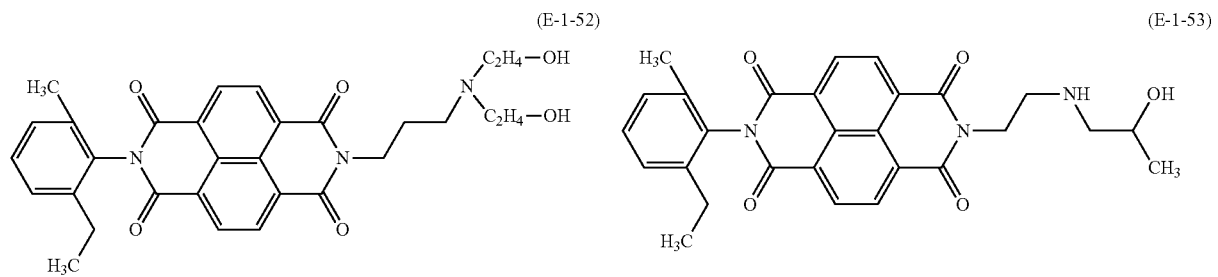
(E-1-52) (E-1-53)
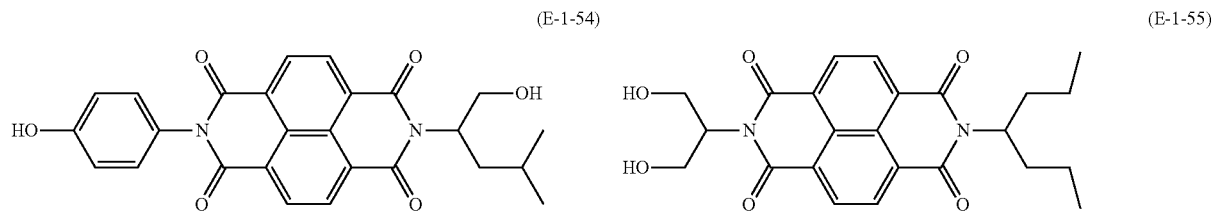
(E-1-54) (E-1-55)
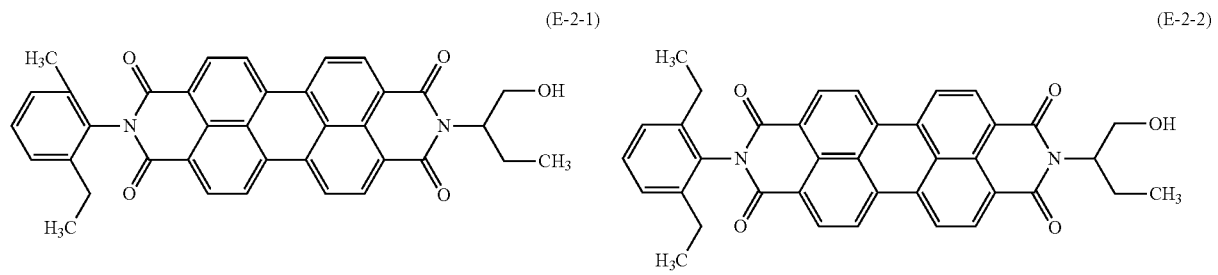
(E-2-1) (E-2-2)
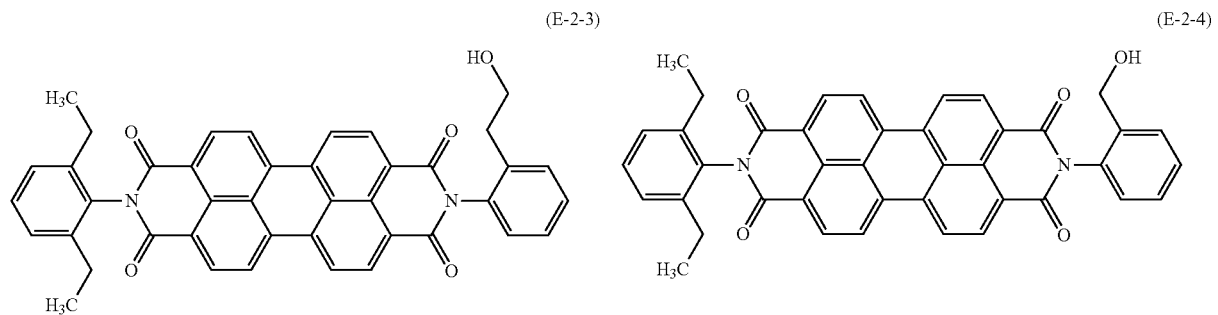
(E-2-3) (E-2-4)

-continued
(E-2-5)
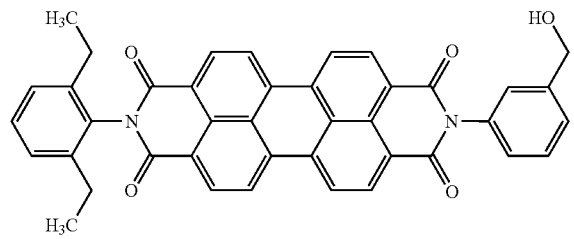
(E-2-6)
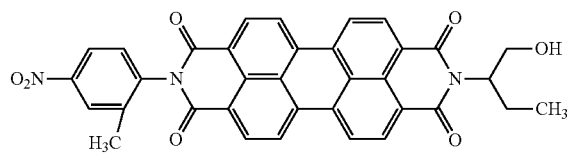
(E-2-7)
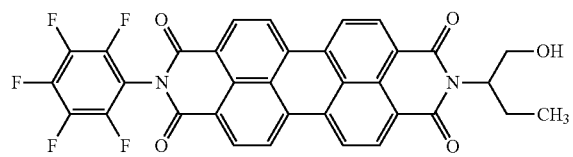
(E-2-8)
(E-2-9)
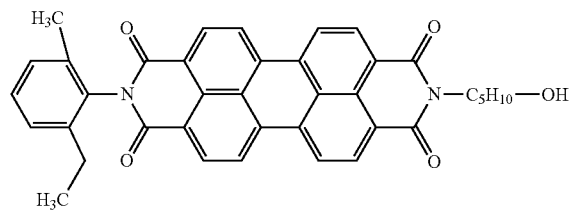
(E-2-10)
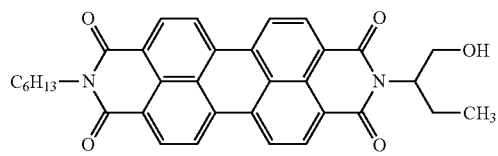
(E-2-11)
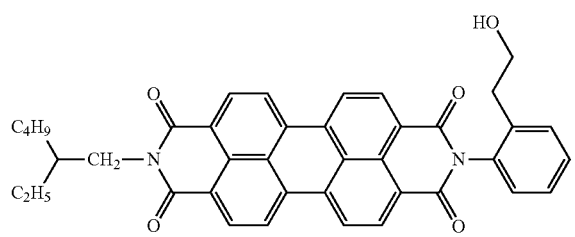
(E-2-12)
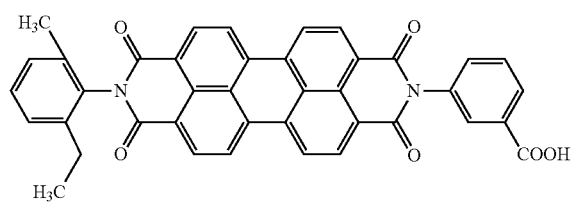
(E-2-13)
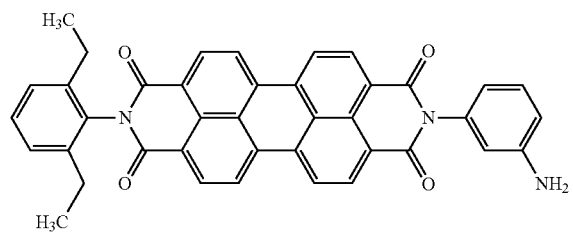
(E-2-14)
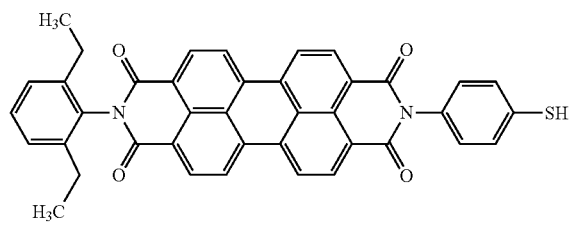
(E-2-15)
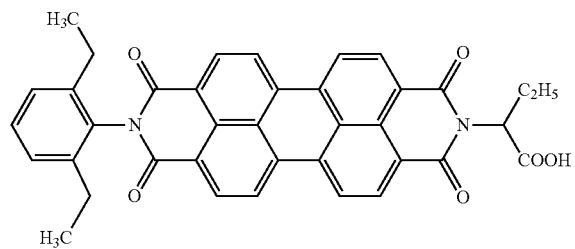
(E-2-16)
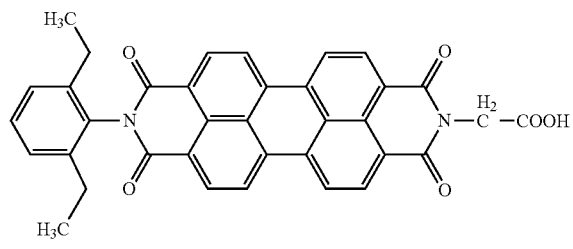

-continued
(E-2-17)
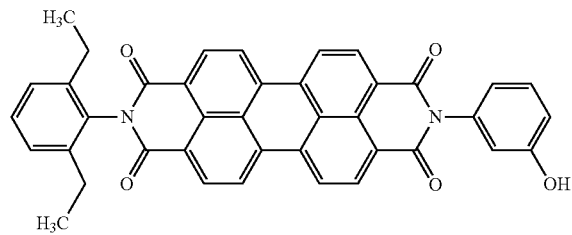
(E-2-18)
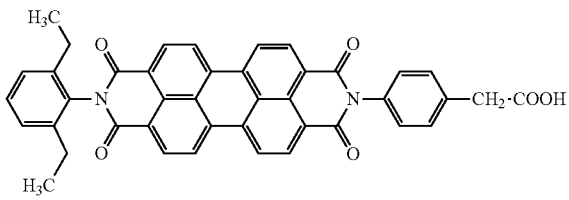
(E-2-19)
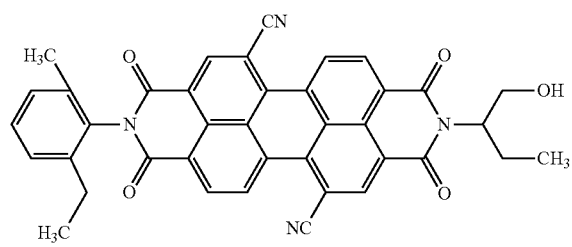
(E-2-20)
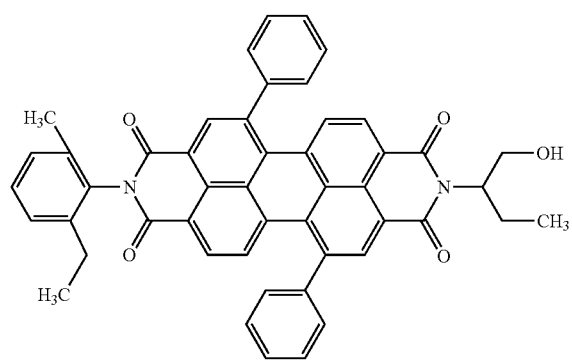
(E-2-21)
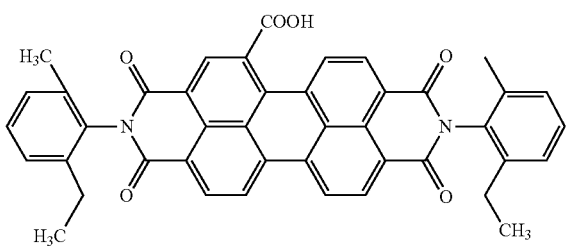
(E-2-22)
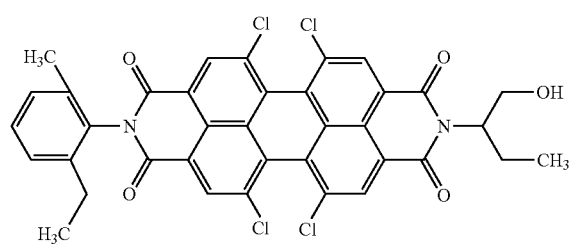
(E-2-23)
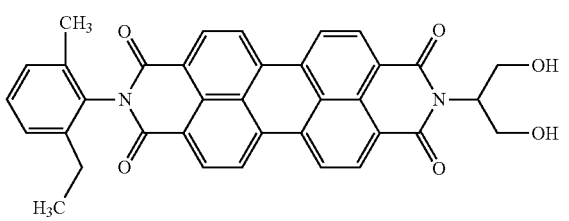
(E-2-24)
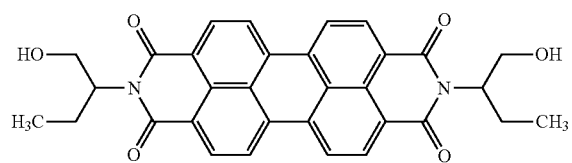
(E-2-25)
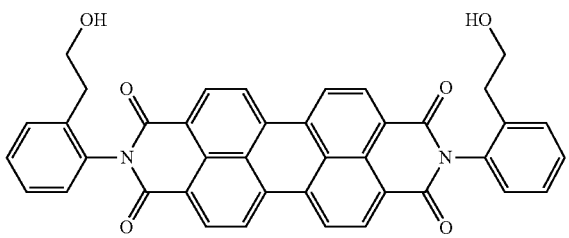
(E-2-26)
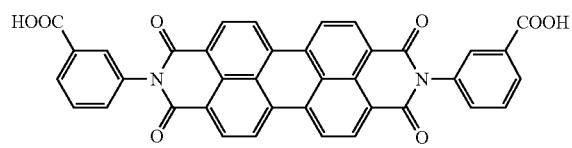
(E-2-27)
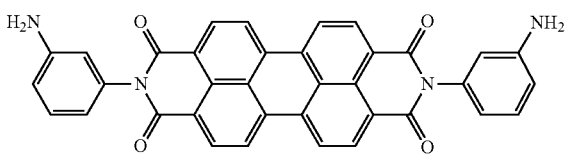

-continued
(E-2-28)
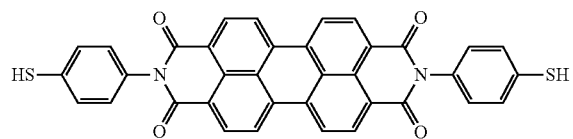
(E-2-29)
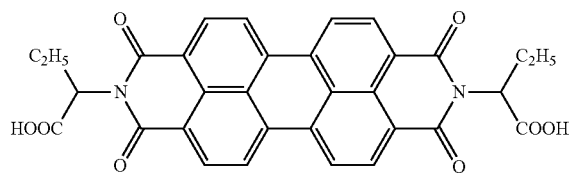
(E-2-30)
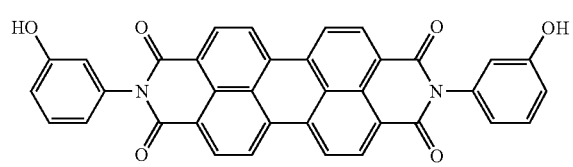
(E-2-31)
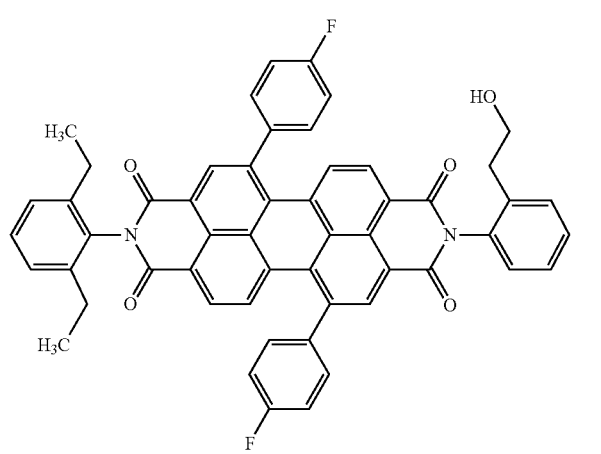
(E-2-32)
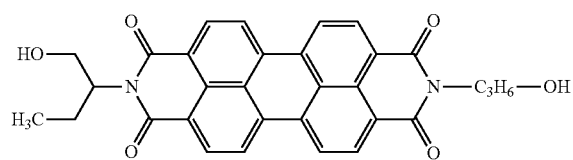
(E-2-33)
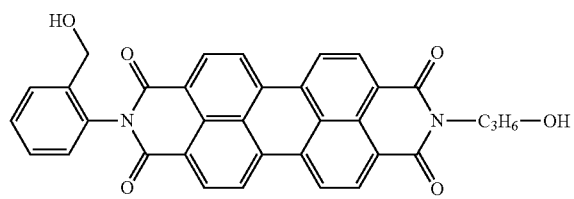
(E-2-34)
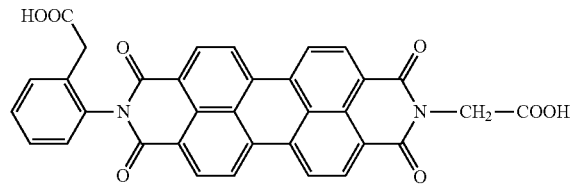
(E-2-35)
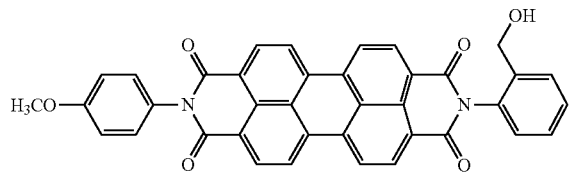
(E-3-1)
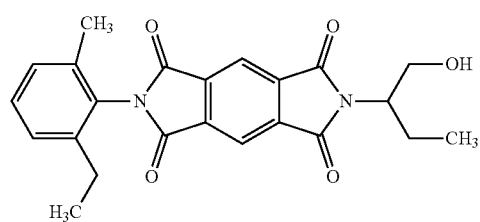
(E-3-2)
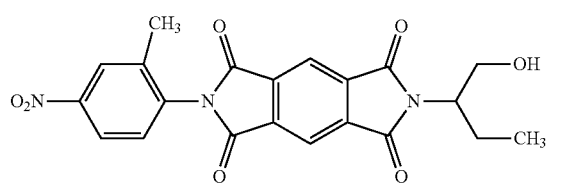
(E-3-3)
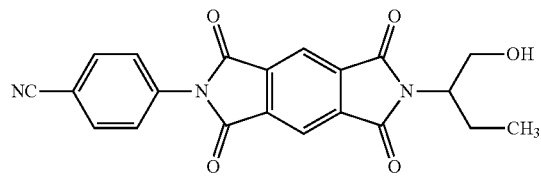
(E-3-4)
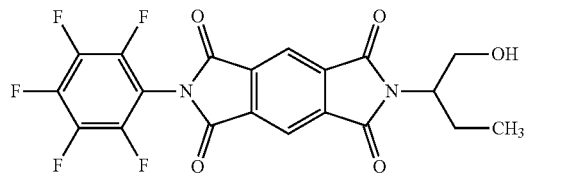

-continued

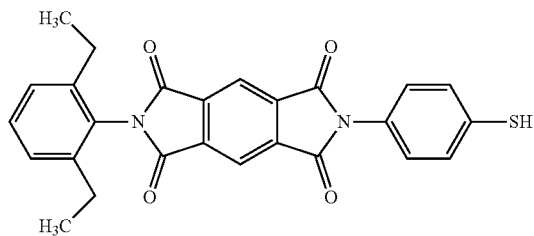
(E-3-5)

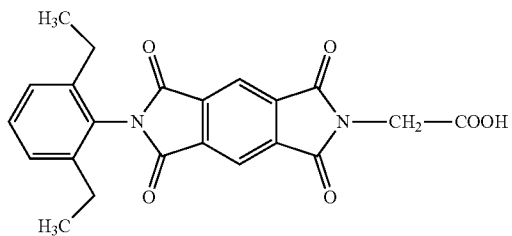
(E-3-6)

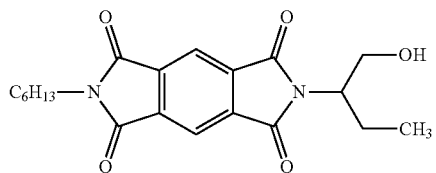
(E-3-7)

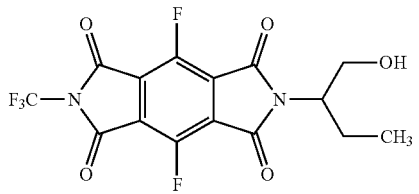
(E-3-8)

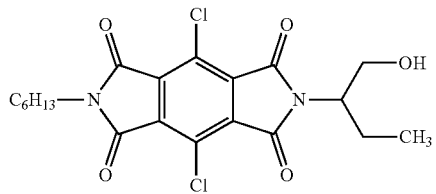
(E-3-9)

(E-3-10)

Third Photoelectric Conversion Element

In the third photoelectric conversion element, the second layer 214 contains at least one of the structures represented by formula (U1) and the structures represented by formula (U2). The second layer 214 is a layer (cured layer) containing at least one of the structures represented by formula (U1) and the structures represented by formula (U2). In other words, the second layer 214 includes a cured film (polymer) having at least one of the structures represented by formula (U1) and the structures represented by formula (U2).

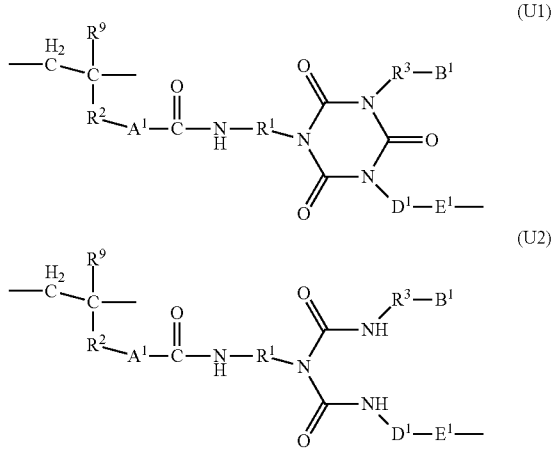

In formulas (U1) and (U2), $R^1$ and $R^3$ each independently represent a substituted or unsubstituted alkylene group whose main chain has 1 to 10 atoms, or a substituted or unsubstituted phenylene group.

$R^2$ represents a single bond, a substituted or unsubstituted alkylene group whose main chain has 1 to 10 atoms, or a substituted or unsubstituted phenylene group. The substituent of the substituted alkylene group is an alkyl group, an aryl group, a hydroxy group, or a halogen atom. The substituent of the substituted phenylene group is a halogen atom, a nitro group, a cyano group, a hydroxy group, an alkyl group, or a halogen-substituted alkyl group.

$R^9$ represents a hydrogen atom or an alkyl group.

$A^1$ represents any one of the groups represented by formulas (A-1) to (A-6).

$B^1$ represents a group represented by any one of formulas (B-1) to (B-3).

$D^1$ represents a group represented by formula (D) and whose main chain has 5 to 15 atoms. The number of atoms in the main chain represented by formula (D) is more preferably 10 to 15 from the viewpoint of increasing the photoelectric conversion efficiency. The number of atoms in the main chain of $D^1$ refers to the number of atoms of the shortest chain between the right and left ends of formula (D). For example, the main chain of a p-phenylene group has 4 atoms. The main chain of a m-phenylene group has 3 atoms. The main chain of o-phenylene group has 2 atoms.

$E^1$ represents a divalent group represented by any one of formulas (E-1) to (E-3).

In formulas (U1) and (U2), the right side of $E^1$ indicates a hydrogen atom, a substituted or unsubstituted aryl group, a substituted or unsubstituted alkyl group, or a binding site. One of the carbon atoms of the main chain of the substituted or unsubstituted alkyl group may be replaced with O, S, NH, or $NR^{16}$ ($R^{16}$ is an alkyl group). The substituent of the substituted aryl group may be an alkyl group, a halogen atom, a nitro group, or a cyano group. The substituent of the substituted alkyl group may be an alkyl group, an aryl group, a halogen atom, a nitro group, or a cyano group. In the case of a binding site, a substituted or unsubstituted arylene group or substituted or unsubstituted alkylene group is bound to $D^1$ of the structures represented by (U1) and (U2) excluding $E^1$.

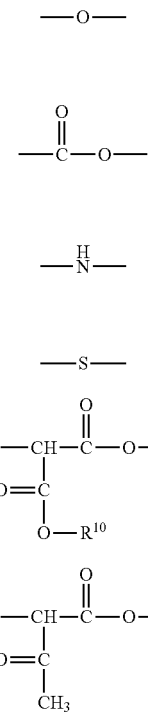

In formula (A-5), $R^{10}$ represents a hydrogen atom or an alkyl group.

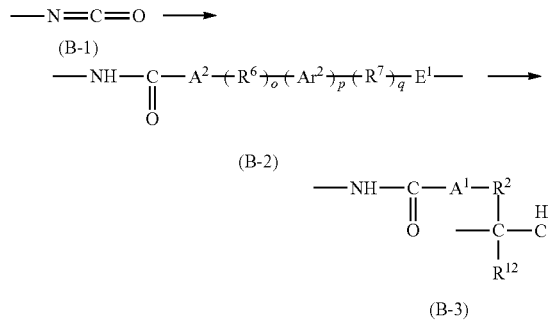

In formulas (B-1) to (B-3), $R^6$ and $R^7$ are each independently an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, alkoxycarbonyl-substituted alkylene group whose main chain has 1 to 5 atoms, or a phenyl-substituted alkylene group whose main chain has 1 to 5 atoms. One of the carbon atoms of the main chain of the alkylene group may be replaced with O, S, NH, or $NR^{15}$ ($R^{15}$ is an alkyl group).

$R^2$ represents a single bond, a substituted or unsubstituted alkylene group whose main chain has 1 to 10 atoms, or a substituted or unsubstituted phenylene group. The substituent of the substituted alkylene group is an alkyl group, an aryl group, a hydroxy group, or a halogen atom. The substituent of the substituted phenylene group is a halogen atom, a nitro group, a cyano group, a hydroxy group, an alkyl group, or a halogen-substituted alkyl group.

$R^{12}$ represents a hydrogen atom or an alkyl group.

$Ar^2$ represents a substituted or unsubstituted phenylene group. The substituent of the substituted phenylene group is a halogen atom, a nitro group, a hydroxy group, a cyano group, an alkyl group, or a halogenated alkyl group.

$A^1$ and $A^2$ represent any one of the groups represented by formulas (A-1) to (A-5).

$E^1$ represents a divalent group represented by any one of formulas (E-1) to (E-3).

o, p, and q are each independently 0 or 1, and the sum of o, p, and q is 1 to 3.

Arrows point to the side bound to $R^3$.

In (B-2), the right side of $E^1$ indicates a hydrogen atom, a substituted or unsubstituted aryl group, or a substituted or unsubstituted alkyl group, a heterocyclic group, or a binding site. The substituent of the substituted aryl group may be an alkyl group, a halogen atom, or a nitro group. In the case of a binding site, a substituted or unsubstituted arylene group or an alkylene group is bound to $D^1$ of the structures represented by (U1) and (U2) excluding $E^1$. The right side of $CH_2$ in formula (B-3) is bound to a side chain of the resin in the second layer 214.

In formula (B-2), $R^6$, $R^7$, $Ar^2$, $A^2$, o, p, and q may be the same as or different from $R^6$, $R^7$, $Ar^2$, $A^2$, o, p, and q of formula (D), respectively. $E^1$ of formula (B-2) may be the same as or different from $E^1$ of formulas (U1) and (U2). In formula (B-3), $R^2$ and $A_1$ may be the same as or different from $R^2$ and $A^1$ of formulas (U1) and (U2), respectively.

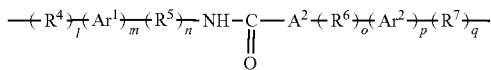

(D)

In formula (D), $R^4$, $R^5$, $R^6$, and $R^7$ are each independently an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, alkoxycarbonyl-substituted alkylene group whose main chain has 1 to 5 atoms, or a phenyl-substituted alkylene group whose main chain has 1 to 5 atoms. One of the carbon atoms of the main chain of the alkylene group may be replaced with O, S, NH, or $NR^{15}$ ($R^{15}$ is an alkyl group). More preferably, $R^4$, $R^5$, $R^6$, and $R^7$ are each independently an alkylene group whose main chain has 1 to 5 atoms or a methyl-substituted or ethyl-substituted alkylene group whose main chain has 1 to 5 atoms.

$Ar^1$ and $Ar^2$ each independently represent a substituted or unsubstituted phenylene group. The substituent of the substituted phenylene group is a halogen atom, a nitro group, a hydroxy group, a cyano group, an alkyl group, or a halogenated alkyl group. Preferably, $Ar^1$ and $Ar^2$ are unsubstituted phenylene groups.

$A^2$ represents a group represented by any one of formulas (A-1) to (A-6).

l, m, n, o, p, and q are each independently 0 or 1, and the sum of l, m, and n and the sum of o, p, and q are 1 to 3.

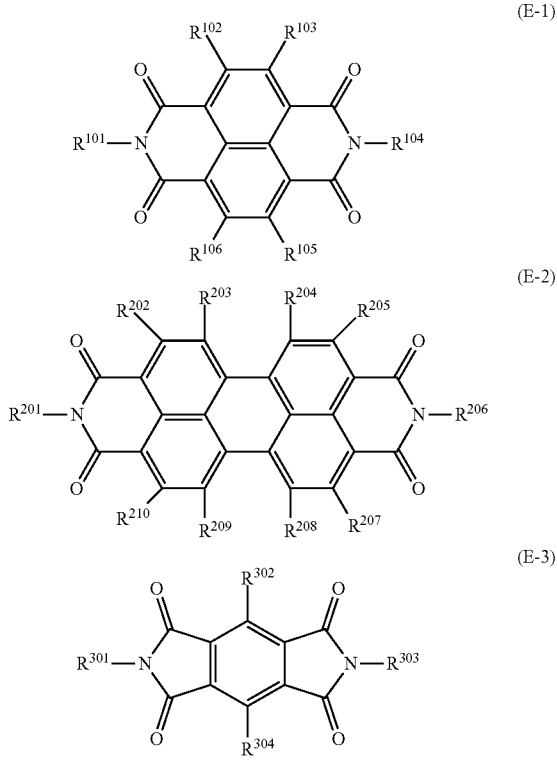

(E-1)
(E-2)
(E-3)

In formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group. One or two of $R^{101}$ to $R^{106}$, one or two of $R^{201}$ to $R^{210}$, and one or two of $R^{301}$ to $R^{304}$ are single bonds. The substituent of the substituted alkyl group is an alkyl group, an aryl group, a halogen atom, or a carbonyl group. The substituent of the substituted aryl group or the substituted heterocyclic group is a halogen atom, a nitro group, a cyano group, an alkyl group, a halogen-substituted alkyl group, an alkoxy group, or a carbonyl group.

In the structure represented by formula (U1), $R^2$ in formula (U1) is bound to structure X surrounded by a dotted line. This structure X is probably the portion corresponding to the resin chain. The same can apply to formula (U2).

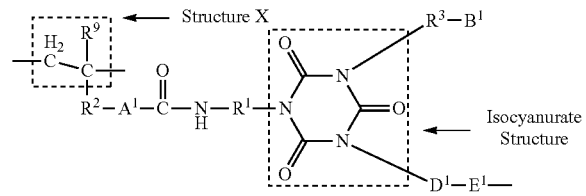

The present inventors think that two effects of the second layer 214 containing the structures represented by formulas (U1) and (U2) increase the photoelectric conversion efficiency. One of the two is probably that the electron-transporting compound ($E^1$) and a urethane linkage enhance electron extraction. The urethane linkage, as well as the electron-transporting compound, has an electron-withdrawing property. Therefore, the inventors think that electrons move rapidly from the perovskite compound, thereby increasing the photoelectric conversion efficiency. The other is probably that the formation of the first layer 213 disposed on the second layer 214 is promoted, thus improving the crystallinity of the first layer 213. Probably, the feature of the present embodiment given to the second layer 214 facilitates interface formation and forms a surface with a wettability imparting an affinity with the first layer 213, promoting crystal growth. The inventors think that the improved crystallinity of the first layer 213 increases light absorption, allows generated charges to move efficiently, and consequently increases the photoelectric conversion efficiency.

Preferably, the second layer 214 contains the structures represented by formulas (U1) and (U2) in a proportion of 30% by mass to 100% by mass relative to the total mass of the second layer 214.

The amount of the structures represented by formulas (U1) and (U2) in the second layer 214 can be analyzed by common analytical methods. An exemplary analytical method will be described below. The amount of the structure represented by formula (U1) in the foundation layer is determined by FT-IR using a KBr-tab method. A calibration curve based on the absorption by the isocyanurate structure is prepared using samples prepared by adding tris(2-hydroxyethyl) isocyanurate to KBr powder in varying proportions, and the amount of the structure represented by formula (U1) in the second layer 214 can be calculated from the calibration curve. The same can apply to formula (U2).

Also, the structures represented by formulas (U1) and (U2) can be identified by measuring the second layer 214 by a method such as solid-state $^{13}$C-NMR, mass spectrometry, MS spectrometry with pyrolysis GC analysis, and characteristic absorption measurements by infrared spectrometry. For example, solid-state $^{13}$C-NMR can be performed with CMX-300 Infinity manufactured by Chemagnetics under the conditions: observed nuclear: $^{13}$C, reference substance: polydimethylsiloxane, number of accumulations: 8192, pulse sequence: CP/MAS, DD/MAS, pulse width: 2.1 μs (DD/MAS), 4.2 μs (CP/MAS), contact time: 2.0 ms, and spinning rate of sample: 10 kHz. In mass spectrometry, the molecular weight is measured with a mass spectrometer (MALDI-TOF MS, Ultraflex manufactured by Bruker Daltonics) under the conditions: accelerating voltage: 20 kV, mode: Reflector, molecular weight standard: fullerene C60. The structure can be identified using the top values of the thus obtained peaks.

The second layer 214 may further contain various resins, a crosslinking agent, organic particles, inorganic particles, metal oxide particles, a leveling agent, a catalyst for promoting curing, and so forth to improve the formability of the layer and the photoelectric conversion efficiency in addition to the structures represented by formulas (U1) and (U2). However, the total of such constituents is preferably less than 50% by mass, more preferably less than 20% by mass, relative to the total mass of the second layer 214. The thickness of the second layer 214 is preferably 10 nm to 1.0 μm.

Specific examples of the structures represented by formulas (U1) and (U2) will be presented below, but these examples do not limit the invention. In Tables 6 to 11, each binding site is designated by a dotted line. Single bonds are expressed by "SB". The left-right orientation of formulas (U1) and (U2) is the same as that of each structure presented in Tables 6 to 11. Also, in all the compounds exemplified in Tables 6 to 11, $R^9$ and $R^{12}$ in formulas (U1) and (U2) are hydrogen atoms. $R^6$, $R^7$, $Ar^2$, $A^2$, o, p, and q of formula (B-2) are the same as $R^6$, $R^7$, $Ar^2$, $A^2$, o, p, and q in $D^1$, respectively. The specific examples of $E^1$ in formulas (U1) and (U2) are denoted by the corresponding numbers in Tables 1 to 5.

TABLE 6

| Specific example | $D^1$ | | | | | | | | | |
|---|---|---|---|---|---|---|---|---|---|---|
| | $R^4$ | l | $Ar^1$ | m | $R^5$ | n | $A^2$ | $R^6$ | o | $Ar^2$ |
| 101 | ----$C_6H_{12}$---- | 1 | SB | 0 | SB | 0 | ----O---- | ----$CH_2$---CH(---$C_2H_5$)---- | 1 | SB |
| 102 | ----$C_6H_{12}$---- | 1 | SB | 0 | SB | 0 | ----C(=O)---O---- | ----$CH_2$---CH(---$C_2H_5$)---- | 1 | SB |
| 103 | ----$C_6H_{12}$---- | 1 | SB | 0 | SB | 0 | ----N(H)---- | ----$CH_2$---CH(---$C_2H_5$)---- | 1 | SB |
| 104 | ----$C_6H_{12}$---- | 1 | SB | 0 | SB | 0 | ----S---- | ----$CH_2$---CH(---$C_2H_5$)---- | 1 | SB |
| 105 | ----$C_6H_{12}$---- | 1 | SB | 0 | SB | 0 | ----O---- | ----$CH_2$---CH(---$C_2H_5$)---- | 1 | SB |
| 106 | ----$C_6H_{12}$---- | 1 | SB | 0 | SB | 0 | ----O---- | ----$CH_2$---CH(---$C_2H_5$)---- | 1 | SB |
| 107 | ----$C_6H_{12}$---- | 1 | SB | 0 | SB | 0 | ----O---- | ----$CH_2$---CH(---$C_2H_5$)---- | 1 | SB |
| 108 | ----$C_6H_{12}$---- | 1 | SB | 0 | SB | 0 | ----O---- | ----$CH_2$---CH(---$C_2H_5$)---- | 1 | SB |
| 109 | ----$C_6H_{12}$---- | 1 | SB | 0 | SB | 0 | ----O---- | ----$CH_2$---CH(---$C_2H_5$)---- | 1 | SB |
| 110 | ----$C_6H_{12}$---- | 1 | SB | 0 | SB | 0 | ----O---- | ----$CH_2$---CH(---$C_2H_5$)---- | 1 | SB |
| 111 | ----$C_6H_{12}$---- | 1 | SB | 0 | SB | 0 | ----O---- | ----CH(---$CH_3$)---- | 1 | 1,4-phenylene |
| 112 | ----$C_6H_{12}$---- | 1 | SB | 0 | SB | 0 | ----O---- | ----CH(---$CH_3$)---- | 1 | 1,3-phenylene |
| 113 | ----$C_6H_{12}$---- | 1 | SB | 0 | SB | 0 | ----O---- | ----$CH_2$---$CH_2$---- | 1 | 1,4-phenylene |
| 114 | ----$CH_2$---- | 1 | SB | 0 | SB | 0 | ----O---- | ----CH(---$CH_3$)---- | 1 | 1,3-phenylene |
| 115 | ----$CH_2$---- | 1 | SB | 0 | SB | 0 | ----O---- | ----$CH_2$---CH(---$C_2H_5$)---- | 1 | SB |

TABLE 6-continued

| Specific example | D¹ p | R⁷ | q | R³ | B¹ | A¹ | R² | R¹ |
|---|---|---|---|---|---|---|---|---|
| 101 | 0 | SB | 0 | —C₆H₁₂— | (B-2) | —O— | SB | —C₆H₁₂— |
| 102 | 0 | SB | 0 | —C₆H₁₂— | (B-2) | —O— | SB | —C₆H₁₂— |
| 103 | 0 | SB | 0 | —C₆H₁₂— | (B-2) | —O— | SB | —C₆H₁₂— |
| 104 | 0 | SB | 0 | —C₆H₁₂— | (B-2) | —O— | SB | —C₆H₁₂— |
| 105 | 0 | SB | 0 | —C₆H₁₂— | (B-2) | —O— | SB | —C₆H₁₂— |
| 106 | 0 | SB | 0 | —C₆H₁₂— | (B-2) | —O— | SB | —C₆H₁₂— |
| 107 | 0 | SB | 0 | —C₆H₁₂— | (B-2) | —O— | SB | —C₆H₁₂— |
| 108 | 0 | SB | 0 | —C₆H₁₂— | (B-2) | —O— | SB | —C₆H₁₂— |
| 109 | 0 | SB | 0 | —C₆H₁₂— | (B-2) | —O— | SB | —C₆H₁₂— |
| 110 | 0 | SB | 0 | —C₆H₁₂— | (B-2) | —O— | SB | —C₆H₁₂— |
| 111 | 1 | SB | 0 | —C₆H₁₂— | (B-2) | —O— | SB | —C₆H₁₂— |
| 112 | 1 | SB | 0 | —C₆H₁₂— | (B-2) | —O— | SB | —C₆H₁₂— |
| 113 | 1 | SB | 0 | —C₆H₁₂— | (B-2) | —O— | SB | —C₆H₁₂— |
| 114 | 1 | SB | 0 | —CH₂— | (B-2) | —O— | SB | —CH₂— |
| 115 | 0 | SB | 0 | —CH₂— | (B-2) | —O— | SB | —CH₂— |

TABLE 7

| Specific example | R⁴ | l | Ar¹ | m | R⁵ | n | A² | R⁶ |
|---|---|---|---|---|---|---|---|---|
| 116 | —CH₂— | 1 | SB | 0 | SB | 0 | —O— | —CH₂— |
| 117 | —C₆H₁₂— | 1 | SB | 0 | SB | 0 | —O— | —CH(CH₃)— |
| 118 | —C₆H₁₂— | 1 | SB | 0 | SB | 0 | —O— | —CH(CH₃)— |
| 119 | —C₆H₁₂— | 1 | SB | 0 | SB | 0 | —O— | —CH(CH₃)— |
| 120 | —C₆H₁₂— | 1 | SB | 0 | SB | 0 | —O— | —CH(CH₃)— |
| 121 | —C₆H₁₂— | 1 | SB | 0 | SB | 0 | —O— | —CH₂—CH(C₂H₅)— |

TABLE 7-continued

| 122 | ----C$_6$H$_{12}$---- | 1 | SB | 0 | SB | 0 | ----O---- | ----C$_{H_2}$---CH----<br>　　　　　｜<br>　　　　C$_2$H$_5$ |
| --- | --- | --- | --- | --- | --- | --- | --- | --- |
| 123 | ----C$_6$H$_{12}$---- | 1 | SB | 0 | SB | 0 | ----O---- | ----C$_{H_2}$---CH----<br>　　　　　｜<br>　　　　C$_2$H$_5$ |
| 124 | ----C$_6$H$_{12}$---- | 1 | SB | 0 | SB | 0 | ----O---- | ----C$_{H_2}$---CH----<br>　　　　　｜<br>　　　　C$_2$H$_5$ |
| 125 | ----C$_6$H$_{12}$---- | 1 | SB | 0 | SB | 0 | ----O---- | CH$_3$<br>｜<br>----CH---- |
| 126 | ----C$_6$H$_{12}$---- | 1 | SB | 0 | SB | 0 | ----O---- | SB |
| 127 | ----C$_6$H$_{12}$---- | 1 | SB | 0 | SB | 0 | ----O---- | SB |
| 128 | SB | 0 | 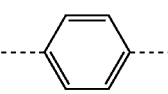 | 1 | SB | 0 | ----O---- | CH$_3$<br>｜<br>----CH---- |
| 129 | SB | 0 | 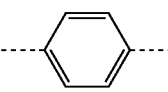 | 1 | SB | 0 | ----O---- | ----C$_{H_2}$---CH----<br>　　　　　｜<br>　　　　C$_2$H$_5$ |
| 130 | SB | 0 | 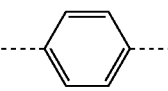 | 1 | SB | 0 | ----O---- | ----C$_{H_2}$---CH----<br>　　　　　｜<br>　　　　C$_2$H$_5$ |
| 131 | SB | 0 | 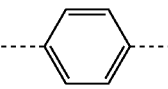 | 1 | SB | 0 | ----O---- | ----C$_{H_2}$---C$^H$----<br>　　　　　｜<br>　　　　C$_2$H$_5$ |
| 132 | SB | 0 | 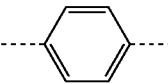 | 1 | SB | 0 | ----O---- | ----$^H$C---$^{H_2}$C---$^H$N---C$_2$H$_4$----<br>　　　｜<br>　　CH$_3$ |
| 133 | SB | 0 |  | 1 | SB | 0 | ----O---- | ----C$_{H_2}$---C$^H$----<br> |

| Specific | D$^1$ | | | | |
| --- | --- | --- | --- | --- | --- |
| example | o | Ar$^2$ | p | R$^7$ | q |
| 116 | 1 | SB | 0 | SB | 0 |
| 117 | 1 | 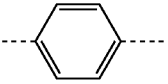 | 1 | SB | 0 |
| 118 | 1 | 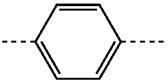 | 1 | SB | 0 |
| 119 | 1 | 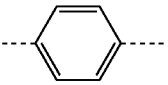 | 1 | SB | 0 |
| 120 | 1 | 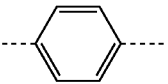 | 1 | SB | 0 |

TABLE 7-continued

| | | | | | |
|---|---|---|---|---|---|
| 121 | 1 | SB | 0 | SB | 0 |
| 122 | 1 | SB | 0 | SB | 0 |
| 123 | 1 | SB | 0 | SB | 0 |
| 124 | 1 | SB | 0 | SB | 0 |
| 125 | 1 | (meta-phenylene) | 1 | SB | 0 |
| 126 | 0 | (ortho-phenylene) | 1 | SB | 0 |
| 127 | 0 | (ortho-phenylene) | 1 | SB | 0 |
| 128 | 1 | (para-phenylene) | 1 | SB | 0 |
| 129 | 1 | SB | 0 | SB | 0 |
| 130 | 1 | SB | 0 | SB | 0 |
| 131 | 1 | SB | 0 | SB | 0 |
| 132 | 1 | SB | 0 | SB | 0 |
| 133 | 1 | SB | 0 | SB | 0 |

| Specific example | $R^3$ | $B^1$ | $A^1$ | $R^2$ | $R^1$ |
|---|---|---|---|---|---|
| 116 | ----$CH_2$--- | (B-2) | ----O---- | SB | ----$CH_2$--- |
| 117 | ----$C_6H_{12}$--- | (B-1) | ----O---- | SB | ----$C_6H_{12}$--- |
| 118 | ----$C_6H_{12}$--- | (B-3) | ----O---- | SB | ----$C_6H_{12}$--- |
| 119 | ----$C_6H_{12}$--- | (B-3) | ----O---- | (para-phenylene) | ----$C_6H_{12}$--- |
| 120 | ----$C_6H_{12}$--- | (B-3) | ----NH---- | SB | ----$C_6H_{12}$--- |
| 121 | ----$C_6H_{12}$--- | (B-1) | ----O---- | SB | ----$C_6H_{12}$--- |
| 122 | ----$C_6H_{12}$--- | (B-2) | ----O---- | SB | ----$C_6H_{12}$--- |
| 123 | ----$C_6H_{12}$--- | (B-3) | ----O---- | SB | ----$C_6H_{12}$--- |
| 124 | ----$C_6H_{12}$--- | (B-2) | ----O---- | SB | ----$C_6H_{12}$--- |
| 125 | ----$C_6H_{12}$--- | (B-2) | ----O---- | SB | ----$C_6H_{12}$--- |
| 126 | ----$C_6H_{12}$--- | (B-2) | ----O---- | SB | ----$C_6H_{12}$--- |
| 127 | ----$C_6H_{12}$--- | (B-2) | ----O---- | SB | ----$C_6H_{12}$--- |
| 128 | ----$C_6H_{12}$--- | (B-2) | ----O---- | SB | ----$C_6H_{12}$--- |

TABLE 7-continued

| | | | | | |
|---|---|---|---|---|---|
| 129 | ----$C_6H_{12}$---- | (B-2) | ----O---- | SB | ----$C_6H_{12}$---- |
| 130 | ----$C_6H_{12}$---- | (B-1) | ----NH---- | SB | ----$C_6H_{12}$---- |
| 131 | ----$C_6H_{12}$---- | (B-2) | ----NH---- | SB | ----$C_6H_{12}$---- |
| 132 | ----$C_6H_{12}$---- | (B-2) | ----NH---- | SB | ----$C_6H_{12}$---- |
| 133 | ----$C_6H_{12}$---- | (B-2) | ----NH---- | SB | ----$C_6H_{12}$---- |

TABLE 8

| Specific example | $R^4$ | l | $Ar^1$ | m | $R^5$ | n | $A^2$ | $R^6$ | o | $Ar^2$ | p | $R^7$ | q |
|---|---|---|---|---|---|---|---|---|---|---|---|---|---|
| 151 | ----$C_6H_{12}$---- | 1 | SB | 0 | SB | 0 | diethyl malonate linker | ----$CH_2$-CH($C_2H_5$)---- | 1 | SB | 0 | SB | 0 |
| 152 | ----$C_6H_{12}$---- | 1 | SB | 0 | SB | 0 | diethyl malonate linker | ----$CH_2$-CH($C_2H_5$)---- | 1 | SB | 0 | SB | 0 |
| 153 | ----$C_6H_{12}$---- | 1 | SB | 0 | SB | 0 | diethyl malonate linker | ----$CH_2$---- | 1 | meta-phenylene | 1 | SB | 0 |

| Specific example | $R^3$ | $B^1$ | $A^1$ | $R^2$ | $R^1$ |
|---|---|---|---|---|---|
| 151 | ----$C_6H_{12}$---- | (B-2) | ----O---- | SB | ----$C_6H_{12}$---- |
| 152 | ----$C_6H_{12}$---- | (B-2) | ----O---- | SB | ----$C_6H_{12}$---- |
| 153 | ----$C_6H_{12}$---- | (B-2) | ----O---- | SB | ----$C_6H_{12}$---- |

TABLE 9

| Specific example | $R^4$ | l | $Ar^1$ | m | $R^5$ | n | $A^2$ | $R^6$ | o | $Ar^2$ | p | $R^7$ | q |
|---|---|---|---|---|---|---|---|---|---|---|---|---|---|
| 201 | ----$C_6H_{12}$---- | 1 | SB | 0 | SB | 0 | ----O---- | ----$CH_2$-$CH_2$---- | 1 | para-phenylene | 1 | SB | 0 |
| 202 | ----$C_6H_{12}$---- | 1 | SB | 0 | SB | 0 | ----O---- | ----$CH_2$-$CH_2$---- | 1 | para-phenylene | 1 | SB | 0 |
| 203 | ----$C_6H_{12}$---- | 1 | SB | 0 | SB | 0 | ----O---- | ----$CH_2$-$CH_2$---- | 1 | para-phenylene | 1 | SB | 0 |

TABLE 9-continued

| | | | | | | | | | | | |
|---|---|---|---|---|---|---|---|---|---|---|---|
| 204 | ----$C_6H_{12}$---  | 1 | SB | 0 | SB | 0 | ----O---- | ----$\underset{H_2}{C}$—$\underset{H_2}{C}$---- | 1 |  | 1 SB 0 |
| 205 | ----$C_6H_{12}$--- | 1 | SB | 0 | SB | 0 | ----O---- | ----$\underset{H_2}{C}$—$\underset{H_2}{C}$---- | 1 |  | 1 SB 0 |
| 206 | ----$C_6H_{12}$--- | 1 | SB | 0 | SB | 0 | ----O---- | ----$\underset{H_2}{C}$—$\underset{H_2}{C}$---- | 1 |  | 1 SB 0 |
| 207 | ----$C_6H_{12}$--- | 1 | SB | 0 | SB | 0 | ----$\underset{H}{N}$---- | ----$\underset{H_2}{C}$—$\underset{H_2}{C}$---- | 1 |  | 1 SB 0 |
| 208 | ----$C_6H_{12}$--- | 1 | SB | 0 | SB | 0 | ----S---- | ----$\underset{H_2}{C}$—$\underset{H_2}{C}$---- | 1 | 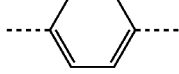 | 1 SB 0 |
| 209 | ----$C_6H_{12}$--- | 1 | SB | 0 | SB | 0 | ----O---- | ----$\underset{H_2}{C}$—$\underset{\underset{C_2H_5}{\|}}{CH}$---- | 1 | SB | 0 SB 0 |
| 210 | ----$C_6H_{12}$--- | 1 | SB | 0 | SB | 0 | ----O---- | SB | 0 | 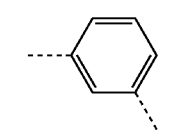 | 1 SB 0 |
| 211 | ----$C_6H_{12}$--- | 1 | SB | 0 | SB | 0 | ----O---- | —$C_2H_4$—O—$C_2H_4$— | 1 | SB | 0 SB 0 |
| 212 | ----$C_6H_{12}$--- | 1 | SB | 0 | SB | 0 | ----O---- | ----$CH_2$---- | 1 | 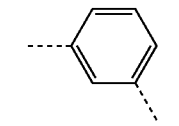 | 1 SB 0 |
| 301 | ----$C_6H_{12}$--- | 1 | SB | 0 | SB | 0 | ----O---- | SB | 0 |  | 1 SB 0 |
| 302 | ----$C_6H_{12}$--- | 1 | SB | 0 | SB | 0 | ----O---- | SB | 0 |  | 1 SB 0 |
| 303 | ----$C_6H_{12}$--- | 1 | SB | 0 | SB | 0 | ----O---- | SB | 0 | 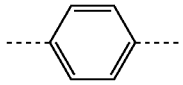 | 1 SB 0 |

| Specific example | $R^3$ | $B^1$ | $A^1$ | $R^2$ | $R^1$ |
|---|---|---|---|---|---|
| 201 | ----$C_6H_{12}$---  | (B-2) | ----O---- | SB | ----$C_6H_{12}$--- |
| 202 | ----$C_6H_{12}$---  | (B-2) | ----O---- | SB | ----$C_6H_{12}$--- |
| 203 | ----$C_6H_{12}$---  | (B-2) | ----O---- | SB | ----$C_6H_{12}$--- |
| 204 | ----$C_6H_{12}$---  | (B-2) | ----O---- | SB | ----$C_6H_{12}$--- |
| 205 | ----$C_6H_{12}$---  | (B-2) | ----O---- | SB | ----$C_6H_{12}$--- |
| 206 | ----$C_6H_{12}$---  | (B-2) | ----O---- | SB | ----$C_6H_{12}$--- |

TABLE 9-continued

| | | | | | |
|---|---|---|---|---|---|
| 207 | ----C$_6$H$_{12}$--- | (B-2) | ----O---- | SB | ----C$_6$H$_{12}$--- |
| 208 | ----C$_6$H$_{12}$--- | (B-2) | ----O---- | SB | ----C$_6$H$_{12}$--- |
| 209 | ----C$_6$H$_{12}$--- | (B-2) | ----O---- | SB | ----C$_6$H$_{12}$--- |
| 210 | ----C$_6$H$_{12}$--- | (B-2) | ----O---- | SB | ----C$_6$H$_{12}$--- |
| 211 | ----C$_6$H$_{12}$--- | (B-2) | ----O---- | SB | ----C$_6$H$_{12}$--- |
| 212 | ----C$_6$H$_{12}$--- | (B-2) | ----O---- | SB | ----C$_6$H$_{12}$--- |
| 301 | ----C$_6$H$_{12}$--- | (B-2) | ----O---- | SB | ----C$_6$H$_{12}$--- |
| 302 | ----C$_6$H$_{12}$--- | (B-2) | ----O---- | SB | ----C$_6$H$_{12}$--- |
| 303 | ----C$_6$H$_{12}$--- | (B-2) | ----O---- | SB | ----C$_6$H$_{12}$--- |

TABLE 10

| Specific example | D$^1$ | | | | | | | |
|---|---|---|---|---|---|---|---|---|
| | R$^4$ | l | Ar$^1$ | m | R$^5$ | n | A$^2$ | R$^6$ | o |
| 2001 | ----C$_6$H$_{12}$--- | 1 | SB | 0 | SB | 0 | ----O---- | ----CH$_2$–CH(CH$_2$–CH(CH$_3$)$_2$)---- | 1 |
| 2002 | ----C$_6$H$_{12}$--- | 1 | SB | 0 | SB | 0 | ----O---- | ----C$_2$H$_4$—S—C$_2$H$_4$---- | 1 |
| 2003 | ----C$_6$H$_{12}$--- | 1 | SB | 0 | SB | 0 | ----O---- | ----C$_2$H$_4$—O—C$_2$H$_4$---- | 1 |
| 2004 | ----C$_6$H$_{12}$--- | 1 | SB | 0 | SB | 0 | ----O---- | ----C$_2$H$_4$—S—C$_2$H$_4$---- | 1 |
| 2005 | ----C$_6$H$_{12}$--- | 1 | SB | 0 | SB | 0 | ----O---- | ----C$_2$H$_4$—CH$_2$—C$_2$H$_4$---- | 1 |
| 2006 | ----C$_6$H$_{12}$--- | 1 | SB | 0 | SB | 0 | ----O---- | ----CH$_2$—CH(C$_2$H$_5$)---- | 1 |
| 2007 | ----C$_6$H$_{12}$--- | 1 | SB | 0 | SB | 0 | ----O---- | ----CH$_2$–CH(CH$_2$–CH(CH$_3$)$_2$)---- | 1 |

| Specific example | D$^1$ | | | | | | | | |
|---|---|---|---|---|---|---|---|---|---|
| | Ar$^2$ | p | R$^7$ | q | R$^3$ | B$^1$ | A$^1$ | R$^2$ | R$^1$ |
| 2001 | SB | 0 | SB | 0 | ----C$_6$H$_{12}$--- | (B-3) | ----O---- | SB | ----C$_6$H$_{12}$--- |
| 2002 | SB | 0 | SB | 0 | ----C$_6$H$_{12}$--- | (B-3) | ----O---- | SB | ----C$_6$H$_{12}$--- |
| 2003 | SB | 0 | SB | 0 | ----C$_6$H$_{12}$--- | (B-3) | ----O---- | SB | ----C$_6$H$_{12}$--- |
| 2004 | SB | 0 | SB | 0 | ----C$_6$H$_{12}$--- | (B-3) | ----O---- | SB | ----C$_6$H$_{12}$--- |

TABLE 10-continued

| | | | | | | | | | |
|---|---|---|---|---|---|---|---|---|---|
| 2005 | SB | 0 | SB | 0 | ----C$_6$H$_{12}$--- (B-3) | ----O---- | | SB | ----C$_6$H$_{12}$--- |
| 2006 | SB | 0 | SB | 0 | ----C$_6$H$_{12}$--- (B-3) | ----O---- | | SB | ----C$_6$H$_{12}$--- |
| 2007 | SB | 0 | SB | 0 | ----C$_6$H$_{12}$--- (B-3) | ----O---- | | SB | ----C$_6$H$_{12}$--- |

TABLE 11

| Specific example | R$^4$ | l | Ar$^1$ | m | R$^5$ | n | A$^2$ | D$^1$ R$^6$ | o | Ar$^2$ | p | R$^7$ | q |
|---|---|---|---|---|---|---|---|---|---|---|---|---|---|
| 2008 | ----C$_6$H$_{12}$--- | 1 | SB | 0 | SB | 0 | ----O---- | ----CH$_2$--CH---- with C$_2$H$_5$--CH--CH$_3$ | 1 | SB | 0 | SB | 0 |
| 2009 | ----C$_6$H$_{12}$--- | 1 | SB | 0 | SB | 0 | ----O---- | ----CH$_2$--CH---- with H$_3$C--O--C=O | 1 | SB | 0 | SB | 0 |
| 2010 | ----C$_6$H$_{12}$--- | 1 | SB | 0 | SB | 0 | ----O---- | ----CH$_2$--CH---- with H$_3$C--CH--CH$_3$ | 1 | SB | 0 | SB | 0 |
| 2011 | ----C$_6$H$_{12}$--- | 1 | SB | 0 | SB | 0 | ----O---- | ----C$_2$H$_4$--N(H$_2$)--CH--C$_2$H$_4$---- | 1 | SB | 0 | SB | 0 |
| 2012 | ----C$_6$H$_{12}$--- | 1 | SB | 0 | SB | 0 | ----O---- | ----C$_2$H$_4$--S--C$_2$H$_4$---- | 1 | SB | 0 | SB | 0 |
| 2013 | ----C$_6$H$_{12}$--- | 1 | SB | 0 | SB | 0 | ----C(=O)--O---- | ----CH$_2$--CH---- with H$_2$C--CH(CH$_3$)--CH$_3$ | 1 | SB | 0 | | |
| 2014 | ----C$_6$H$_{12}$--- | 1 | SB | 0 | SB | 0 | ----O---- | ----CH$_2$--CH---- with H$_2$C--CH(CH$_3$)--CH$_3$ | 1 | SB | 0 | SB | 0 |
| 2015 | ----C$_6$H$_{12}$--- | 1 | SB | 0 | SB | 0 | ----O---- | ----CH$_2$--CH---- with H$_2$C--CH(CH$_3$)--CH$_3$ | 1 | SB | 0 | SB | 0 |

| Specific example | R$^3$ | B$^1$ | A$^1$ | R$^2$ | R$^1$ |
|---|---|---|---|---|---|
| 2008 | ----C$_6$H$_{12}$--- | (B-3) | ----O---- | SB | ----C$_6$H$_{12}$--- |
| 2009 | ----C$_6$H$_{12}$--- | (B-3) | ----O---- | SB | ----C$_6$H$_{12}$--- |
| 2010 | ----C$_6$H$_{12}$--- | (B-3) | ----O---- | SB | ----C$_6$H$_{12}$--- |
| 2011 | ----C$_6$H$_{12}$--- | (B-3) | ----O---- | SB | ----C$_6$H$_{12}$--- |
| 2012 | ----C$_6$H$_{12}$--- | (B-3) | ----O---- | SB | ----C$_6$H$_{12}$--- |

TABLE 11-continued

| | | | | | |
|---|---|---|---|---|---|
| 2013 | ----C$_6$H$_{12}$--- | (B-3) | ----O---- | SB | ----C$_6$H$_{12}$--- |
| 2014 | ----C$_6$H$_{12}$--- | (B-3) | ----O---- | SB | ----C$_6$H$_{12}$--- |
| 2015 | ----C$_6$H$_{12}$--- | (B-3) | ----O---- | SB | ----C$_6$H$_{12}$--- |

The second layer 214 may be formed, for example, as described below. First, an isocyanate compound (crosslinking agent), a resin with a polymerizable functional group capable of reacting with the isocyanate group of the isocyanate compound, and an electron-transporting compound with a polymerizable functional group capable of reacting with the isocyanate group of the isocyanate compound are dissolved in a solvent to prepare a coating liquid. A coating film of the coating liquid is formed and thermally cured to yield the second layer 214. Thermal curing is preferred because the reaction can be more uniformly made when conducted during drying.

Isocyanate Compound

The isocyanate compound is preferably an isocyanate compound (blocked isocyanate compound) whose isocyanate group is protected by a blocking agent, such as an oxime. Heating the blocked isocyanate compound with the resin and the electron-transporting compound initiates an addition reaction to separate the blocking agent, and a crosslinking reaction proceeds. Thus, a cured product containing the structures represented by formulas (U1) and (U2) is produced.

Examples of the blocking agent include active methylene compounds, such as ethyl acetate and acetyl acetone; mercaptan compounds, such as butyl mercaptan and dodecyl mercaptan; acid amide compounds, such as acetanilide and acetamide; lactam compounds, such as ε-caprolactam, δ-valerolactam, and γ-butyrolactam; acid imide compounds, such as succinimide and maleimide; imidazole-based compounds, such as imidazole and 2-methylimidazole; urea-based compounds, such as urea, thiourea, and ethyleneurea; oxime compounds, such as formamide oxime, acetamide oxime, acetone oxime, methyl ethyl ketoxime, methyl isobutyl ketoxime, and cyclohexanone oxime; and amine compounds, such as diphenylaniline, aniline, carbazole, ethyleneimine and polyethylenimine. These blocking agents may be used individually or in combination. Among these blocking agents, oxime compounds such as methyl ethyl ketoxime, lactam compounds such as ε-caprolactam, and imidazole-based compounds such as 2-methylimidazole are preferred in view of versatility, ease of manufacture, workability, and thermal curing temperature.

Next, examples of the isocyanate compound will be presented below.

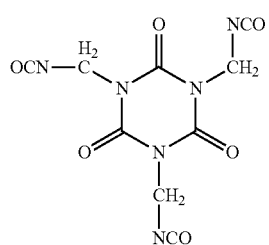

(I-5)
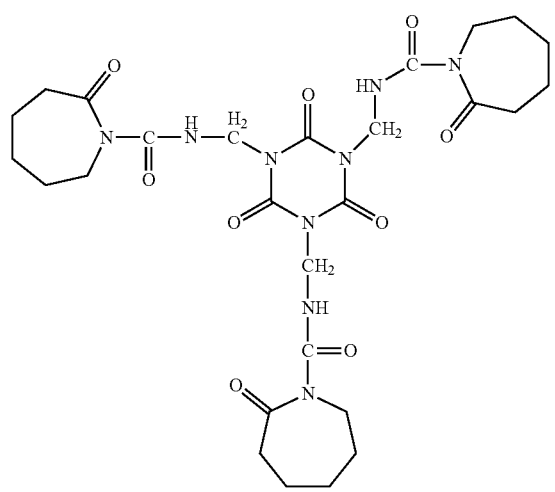
(I-8)
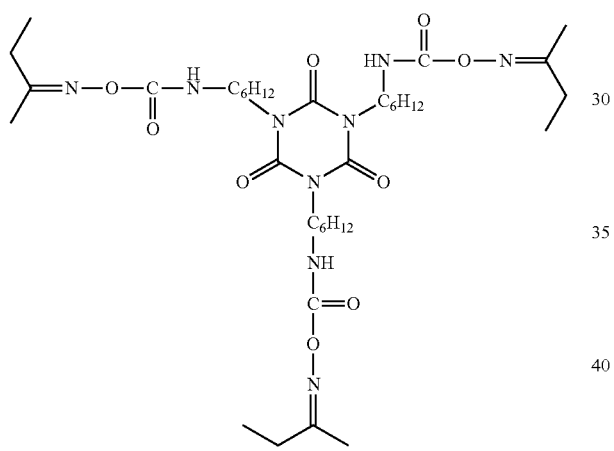
(I-9)
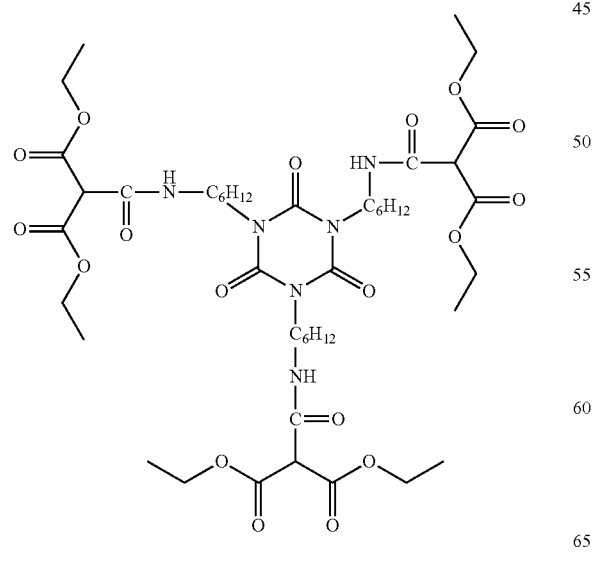
(I-10)
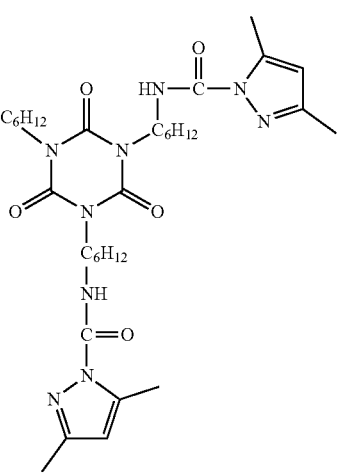
(I-11)
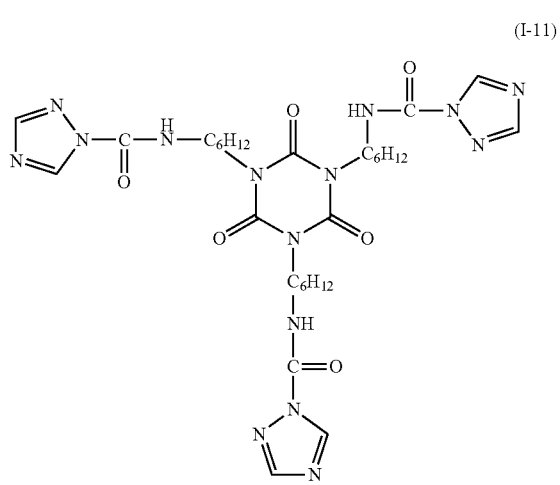
(I-12)
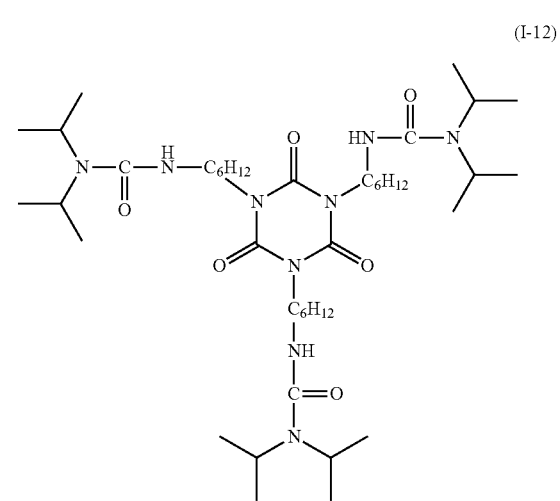

-continued (I-13)

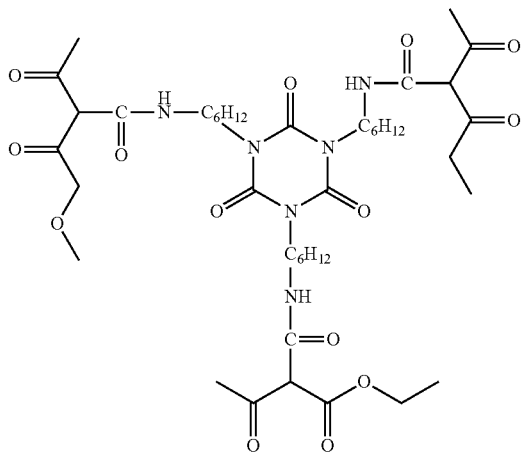

The isocyanate compound has isocyanate groups (amount by mole=I) preferably in a mole ratio (I/H) of 0.5 to 5.0 to the total moles (=H) of the polymerizable functional groups of the resin and the polymerizable functional groups of the electron-transporting compound. A mole ratio (I/H) of 0.5 to 5.0 is preferred because the isocyanate groups can react efficiently with the polymerizable functional groups to increase the crosslink density.

Electron-Transporting Compound

Details of the electron-transporting compound having a polymerizable functional group capable of reacting with the isocyanate group have been described above in [Electron-Transporting Compound] in [Second Photoelectric Conversion Element].

[Resin]

The polymerizable functional group of the resin is preferably the hydroxy group, the carboxyl group, the amide group, or the thiol group. The hydroxy or amide group, which can react efficiently with the isocyanate group, is more preferred. Hence, polyol resin, polyvinylphenol resin, and polyamide resin, which have two or more hydroxy groups or amide groups, are preferred as the resin. For the molecular weight of the resin, the weight average molecular weight (Mw) is preferably in the range of 5,000 to 1,500,000.

Preferably, the cured product containing the structures represented by formulas (U1) and (U2) further contains the structure represented by formula (2) presented below. Hence, the resin should have the structure represented by formula (2) presented below. The structure represented by formula (2) improves the adhesion of the second layer 214 to the underlying and overlying layers and the uniformity of the thickness of the second layer 214, leading to increased photoelectric conversion efficiency.

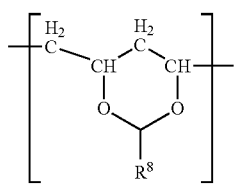

(2)

In formula (2), $R^8$ represents a substituted or unsubstituted alkyl group with 1 to 5 carbon atoms. The substituent of the substituted alkyl group is an alkyl group, an aryl group, or a halogen atom.

Solvent

The solvent used for preparing the coating liquid for forming the second layer 214 can be selected arbitrarily from, for example, alcohols, aromatic solvents, halogenated hydrocarbons, ketones, ketoalcohols, ethers, esters, and so forth. More specifically, examples that can be used include, for example, organic solvents, such as methanol, ethanol, n-propanol, isopropanol, n-butanol, benzyl alcohol, methyl cellosolve, ethyl cellosolve, acetone, methyl ethyl ketone, cyclohexanone, methyl acetate, n-butyl acetate, dioxane, tetrahydrofuran, methylene chloride, chloroform, chlorobenzene, and toluene. These solvents may be used singly or in combination.

Check for Curing

Whether the second layer 214 is cured is checked, for example, as described below. A coating film of the coating liquid for forming the second layer 214 containing an isocyanate compound, a resin, and an electron-transporting material is formed on an aluminum sheet with a mayer bar, and the coating film is dried by heating at 160° C. for 40 minutes to yield a second layer 214. The resulting second layer 214 is immersed in cyclohexanone/ethyl acetate=1/1 mixed solvent for 2 minutes, followed by drying at 160° C. for 5 minutes. The mass of the second layer 214 is measured before and after the immersion, and it is confirmed that there is no elution (difference in mass: within ±2%).

Fourth Photoelectric Conversion Element

The second layer 214 of the fourth photoelectric conversion element contains at least one of the structures represented by formula (C1) and the structures represented by formula (C2). The second layer 214 is a layer (cured layer) containing at least one of the structures represented by formula (C1) and formula (C2). In other words, the second layer 214 contains a cured film (polymer) having at least one of the structures represented by formula (C1) and formula (C2).

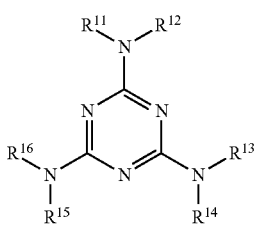

(C1)

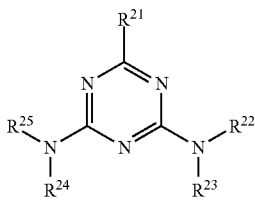

(C2)

In formulas (C1) and (C2), $R^{11}$ to $R^{16}$ and $R^{22}$ to $R^{25}$ each independently represent a hydrogen atom, a methylene group, a monovalent group represented by —CH$_2$OR$^2$ ($R^2$ represents a hydrogen atom or an alkyl group with 1 to 10 carbon atoms), a group represented by formula (i), or a group represented by formula (ii). At least one of $R^{11}$ to $R^{16}$ and at least one of $R^{22}$ to $R^{25}$ are groups represented by formula (i), and at least one of $R^{11}$ to $R^{16}$ and at least one of $R^{22}$ to $R^{25}$ are groups represented by formula (ii).

$R^{21}$ represents an alkyl group, a phenyl group, or an alkyl-substituted phenyl group.

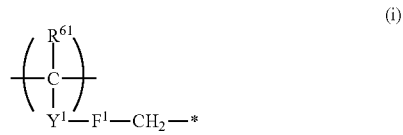

(i)

In formula (i), $R^{61}$ represents a hydrogen atom or an alkyl group.

$Y^1$ represents a single bond, an alkylene group, or a phenylene group.

$F^1$ represents a divalent group represented by any one of formulas (F1) to (F4).

* designates the side bound to N of formula (C1) or the side bound to N of formula (C2).

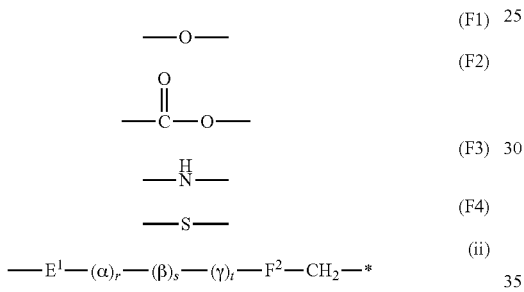

(F1)
(F2)
(F3)
(F4)

(ii)

In formula (ii), $F^2$ represents a divalent group represented by any one of formulas (F1) to (F4).

α represents an alkylene group whose main chain has 1 to 6 atoms, an alkylene group which is substituted by an alkyl group with 1 to 6 carbon atoms and whose main chain has 1 to 6 atoms, a benzyl-substituted alkylene group whose main chain has 1 to 6 atoms, alkoxycarbonyl-substituted alkylene group whose main chain has 1 to 6 atoms, or a phenyl-substituted alkylene group whose main chain has 1 to 6 atoms. One of the carbon atoms of the main chain of the alkylene group may be replaced with O, S, NH, or $NR^1$ ($R^1$ is an alkyl group with 1 to 6 carbon atoms). Preferably, α is an alkylene group whose main chain has 1 to 5 atoms, or an alkylene group which is substituted by an alkyl group with 1 to 4 carbon atoms and whose main chain has 1 to 5 atoms.

β represents a phenylene group, a phenylene group substituted by an alkyl group with 1 to 6 carbon atoms, a nitro-substituted phenylene group, or a halogen-substituted phenylene group. Preferably, β is a phenylene group.

γ represents an alkylene group whose main chain has 1 to 6 atoms, or an alkylene group which is substituted by an alkyl group with 1 to 6 carbon atoms and whose main chain has 1 to 6 atoms.
Preferably, γ is an alkylene group whose main chain has 1 to 5 atoms, or an alkylene group which is substituted by an alkyl group with 1 to 4 carbon atoms and whose main chain has 1 to 5 atoms.

r, s, and t are each 0 or 1.

$E^1$ represents a divalent group represented by any one of formulas (E-1) to (E-3).

* designates the side bound to N of formula (C1) or the side bound to N of formula (C2).

When the number of atoms in the main chain of formula (ii) excluding $E^1$ is 12 or less, the distance between the triazine ring and the electron-transporting portion is moderate, and their interaction enables electrons to be smoothly transported. This is preferred in terms of increasing the photoelectric conversion efficiency. More preferably, the number of atoms in the main chain of formula (ii) excluding $E^1$ is 2 to 9.

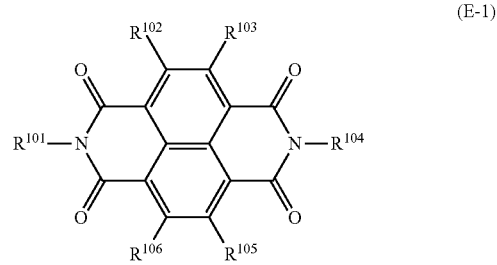

(E-1)

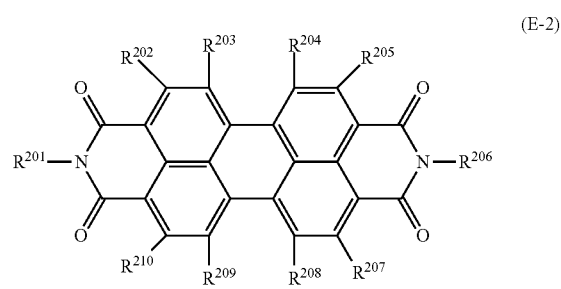

(E-2)

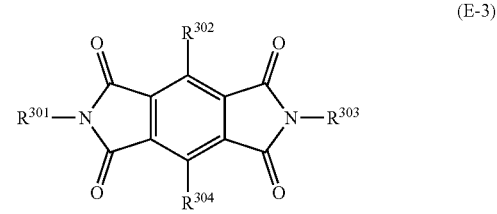

(E-3)

In formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group. One or two of $R^{101}$ to $R^{106}$, one or two of $R^{201}$ to $R^{210}$, and one or two of $R^{301}$ to $R^{304}$ are single bonds. The substituent of the substituted alkyl group is an alkyl group, an aryl group, a halogen atom, or a carbonyl group. The substituent of the substituted aryl group or the substituted heterocyclic group is a halogen atom, a nitro group, a cyano group, an alkyl group, a halogen-substituted alkyl group, an alkoxy group, or a carbonyl group.

The structure represented by formula (C1) includes a portion derived from melamine compounds, and the structure represented by formula (C2) includes a portion derived from guanamine compounds. The portion derived from melamine compounds or the portion derived from guanamine compounds are bound to a group represented by formula (i) or a group represented by formula (ii). The group represented by formula (i) is the portion derived from the resin. The group represented by formula (ii) has an electron-transporting portion represented by any one of (E-1) to (E-3).

The present inventors think that two effects of the second layer 214 containing the structures represented by formulas (C1) and (C2) increases the photoelectric conversion efficiency. One of the two is probably that binding the electron-transporting compound ($E^1$) and the structure represented by formulas (C1) and (C2) enhances electron extraction. Melamine compounds and guanamine compounds each have a triazine ring structure. The triazine ring is intrinsically deficient in electrons. The inventors think that the coexistence of the electron-transporting compound and such triazine rings enables electrons to move rapidly from the perovskite compound, thereby increasing the photoelectric conversion efficiency. The other is probably that the formation of the first layer 213 disposed on the second layer 214 is promoted, thus improving the crystallinity of the first layer 213. Probably, the feature of the present embodiment given to the second layer 214 facilitates interface formation and forms a surface with a wettability imparting an affinity with the first layer 213, promoting crystal growth. The inventors think that the improved crystallinity of the first layer 213 increases light absorption, allows generated charges to move efficiently, and consequently increases the photoelectric conversion efficiency.

The structure represented by formula (C1) and the structure represented by formula (C2) are bound to at least one of the groups represented by formula (i) and at least one of the groups represented by formula (ii). When the other groups not bound to the group represented by formula (i) or the group represented by formula (ii) are methylene groups, the structure may be bound to the melamine structure or the guanamine structure with the methylene group therebetween.

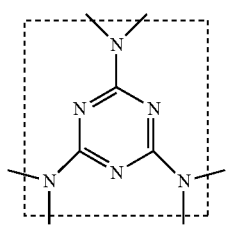

Melamine Structure

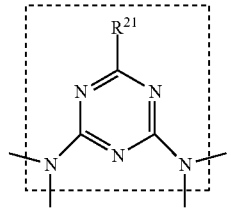

Guanamine Structure

Preferably, the second layer 214 contains the structures represented by formulas (C1) and formula (C2) in a proportion of 30% by mass to 100% by mass relative to the total mass of the second layer 214.

The amount of the structure represented by formula (C1) or (C2) in the second layer 214 can be analyzed by common analytical methods. An exemplary analytical method will be described below. The amount of the structure represented by formula (C1) or (C2) is determined by FT-IR using a KBr-tab method. A calibration curve based on the absorption by the triazine ring is prepared using samples prepared by adding melamine or guanamine to KBr powder in varying proportions, and the amount the structure represented by formula (C1) or (C2) in the second layer 214 can be calculated from the calibration curve.

Also, the structure represented by formula (C1) or (C2) can be identified by measuring the second layer 214 by a method such as solid-state $^{13}$C-NMR, mass spectrometry, MS spectrometry with pyrolysis GC analysis, and characteristic absorption measurements by infrared spectrometry. For example, solid-state $^{13}$C-NMR can be performed with CMX-300 Infinity manufactured by Chemagnetics under the conditions: observed nuclear: $^{13}$C, reference substance: polydimethylsiloxane, number of accumulations: 8192, pulse sequence: CP/MAS, DD/MAS, pulse width: 2.1 μs (DD/MAS), 4.2 μs (CP/MAS), contact time: 2.0 ms, and spinning rate of sample: 10 kHz. In mass spectrometry, the molecular weight is measured with a mass spectrometer (MALDI-TOF MS, Ultraflex manufactured by Bruker Daltonics) under the conditions: accelerating voltage: 20 kV, mode: Reflector, molecular weight standard: fullerene C60. The structure can be identified using the top values of the thus obtained peaks.

The second layer 214 may further contain various resins, a crosslinking agent, organic particles, inorganic particles, metal oxide particles, a leveling agent, a catalyst for promoting curing, and so forth to improve the formability of the layer and the photoelectric conversion efficiency in addition to the structure represented by formula (C1) or (C2). However, the total of such constituents is preferably less than 50% by mass, more preferably less than 20% by mass, relative to the total mass of the second layer 214. The thickness of the second layer 214 is preferably 10 nm to 1.0 μm.

Specific examples of the structures represented by formula (C1) or (C2) will be presented below, but these examples do not limit the invention. In each specific example, the number of atoms in the main chain of formula (ii) excluding the electron transporting portion $E^1$ is presented. In Tables 12 to 19, each binding site is designated by a dotted line. Single bonds are expressed as "SB". The left-right orientation of the groups represented by formula (i) and formula (ii) is the same as that of each structure presented in Tables 12 to 19.

The specific examples of $E^1$ in formulas (ii) are denoted by the corresponding numbers in Tables 1 to 5.
TABLE 12
| Specific example | Number of atoms in main chain | Formula (ii) α | r | β | s | γ | t | $F^2$ | Formula (i) $R^{61}$ | $Y^1$ |
|---|---|---|---|---|---|---|---|---|---|---|
| 101 | 4 | 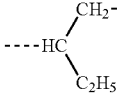 | 1 | SB | 0 | SB | 0 | ----O---- | H | SB |
| 102 | 4 | 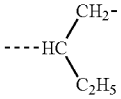 | 1 | SB | 0 | SB | 0 | ----O---- | $CH_2$ | ----$CH_2$---- |
| 103 | 4 | 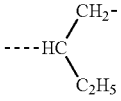 | 1 | SB | 0 | SB | 0 | ----O---- | $C_2H_5$ | ----$CH_2$---- |
| 104 | 4 | 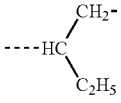 | 1 | SB | 0 | SB | 0 | ----O---- | H |  |
| 105 | 5 | 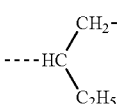 | 1 | SB | 0 | SB | 0 | ----O---- | H | SB |
| 106 | 4 | 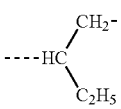 | 1 | SB | 0 | SB | 0 | ----O---- | H | SB |
| 107 | 4 | 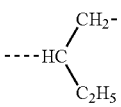 | 1 | SB | 0 | SB | 0 | ----O---- | H | SB |
| 108 | 4 | 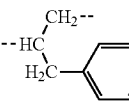 | 1 | SB | 0 | SB | 0 | ----O---- | H | SB |
| 109 | 5 | SB | 0 | 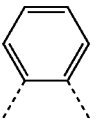 | 1 |  | 1 | ----O---- | H | SB |
| 110 | 6 | SB | 0 | 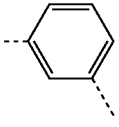 | 1 | SB | 0 | 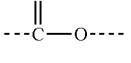 | H | SB |
| 111 | 5 | SB | 0 | 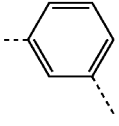 | 1 | SB | 0 |  | H | SB |

TABLE 12-continued
| | | | | | | | | | | |
|---|---|---|---|---|---|---|---|---|---|---|
| 112 | 6 | SB | 0 | 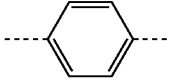 | 1 | SB | 0 | ----S---- | H | SB |
| 113 | 5 | SB | 0 | 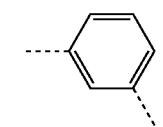 | 1 | SB | 0 | ----N(H)---- | H | SB |
| 114 | 4 | 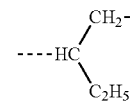 | 1 | SB | 0 | SB | 0 | ----O---- | H | SB |
| 115 | 6 | SB | 0 | 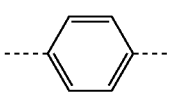 | 1 | SB | 0 | ----S---- | H | SB |
| 116 | 4 | 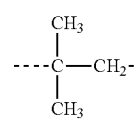 | 1 | SB | 0 | SB | 0 | ----O---- | H | SB |
| 117 | 4 | 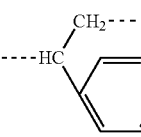 | 1 | SB | 0 | SB | 0 | ----O---- | H | SB |
| 118 | 4 | 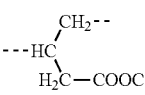 | 1 | SB | 0 | SB | 0 | ----O---- | H | SB |
| 119 | 5 | 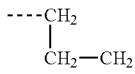 | 1 | SB | 0 | SB | 0 | ----O---- | H | SB |
| 120 | 4 | 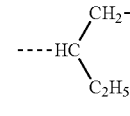 | 1 | SB | 0 | SB | 0 | ----O---- | H | SB |
| 121 | 4 | 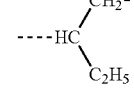 | 1 | SB | 0 | SB | 0 | ----O---- | H | SB |
| 122 | 4 | 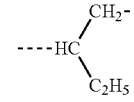 | 1 | SB | 0 | SB | 0 | ----O---- | H | SB |
| 123 | 10 | 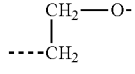 | 1 | 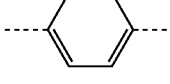 | 1 | SB | 0 | 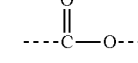 | H | SB |
| 124 | 4 | 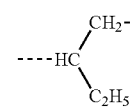 | 1 | SB | 0 | SB | 0 | ----O---- | H | SB |

TABLE 12-continued

| Specific example | Formula (i) F$^1$ | Formula (C1) R$^{11}$ | R$^{12}$ | R$^{13}$ | R$^{14}$ | R$^{15}$ | R$^{16}$ |
|---|---|---|---|---|---|---|---|
| 101 | ----O---- | Formula (ii) | ----CH$_2$---- | Formula (i) | ----CH$_2$---- | ----CH$_2$---- | ----CH$_2$---- |
| 102 | ----O---- | Formula (ii) | ----CH$_2$---- | Formula (i) | ----CH$_2$---- | ----CH$_2$---- | ----CH$_2$---- |
| 103 | ----O---- | Formula (ii) | ----CH$_2$---- | Formula (i) | ----CH$_2$---- | ----CH$_2$---- | ----CH$_2$---- |
| 104 | ----O---- | Formula (ii) | ----CH$_2$---- | Formula (i) | ----CH$_2$---- | ----CH$_2$---- | ----CH$_2$---- |
| 105 | ----C(=O)—O---- | Formula (ii) | ----CH$_2$---- | Formula (i) | ----CH$_2$---- | ----CH$_2$---- | ----CH$_2$---- |
| 106 | ----O---- | Formula (ii) | Formula (i) | ----CH$_2$---- | ----CH$_2$---- | ----CH$_2$---- | ----CH$_2$---- |
| 107 | ----O---- | Formula (ii) | H | Formula (i) | ----CH$_2$---- | ----CH$_2$---- | H |
| 108 | ----O---- | Formula (ii) | ----CH$_2$---- | Formula (i) | ----CH$_2$---- | ----CH$_2$---- | ----CH$_2$---- |
| 109 | ----O---- | Formula (ii) | ----CH$_2$---- | Formula (i) | ----CH$_2$---- | ----CH$_2$---- | ----CH$_2$---- |
| 110 | ----C(=O)—O---- | Formula (ii) | ----CH$_2$---- | Formula (i) | ----CH$_2$---- | ----CH$_2$---- | ----CH$_2$---- |
| 111 | ----NH---- | Formula (ii) | ----CH$_2$---- | Formula (i) | ----CH$_2$---- | ----CH$_2$---- | ----CH$_2$---- |
| 112 | ----S---- | Formula (ii) | ----CH$_2$---- | Formula (i) | ----CH$_2$---- | ----CH$_2$---- | ----CH$_2$---- |
| 113 | ----NH---- | Formula (ii) | H | Formula (i) | ----CH$_2$---- | ----CH$_2$---- | H |
| 114 | ----O---- | Formula (ii) | ----CH$_2$---- | Formula (i) | ----CH$_2$---- | ----CH$_2$---- | ----CH$_2$---- |
| 115 | ----S---- | Formula (ii) | ----CH$_2$---- | Formula (i) | ----CH$_2$---- | ----CH$_2$---- | ----CH$_2$---- |
| 116 | ----O---- | Formula (ii) | ----CH$_2$---- | Formula (i) | ----CH$_2$---- | ----CH$_2$---- | ----CH$_2$---- |
| 117 | ----O---- | Formula (ii) | ----CH$_2$---- | Formula (i) | ----CH$_2$---- | ----CH$_2$---- | ----CH$_2$---- |
| 118 | ----O---- | Formula (ii) | ----CH$_2$---- | Formula (i) | ----CH$_2$---- | ----CH$_2$---- | ----CH$_2$---- |
| 119 | ----O---- | Formula (ii) | ----CH$_2$---- | Formula (i) | ----CH$_2$---- | ----CH$_2$---- | ----CH$_2$---- |

TABLE 12-continued

| | | | | | | | |
|---|---|---|---|---|---|---|---|
| 120 | ----O---- | Formula (ii) | H | Formula (i) | ----$CH_2$---- | ----$CH_2$---- | H |
| 121 | ----O---- | Formula (ii) | ----$CH_2$---- | Formula (i) | ----$CH_2$---- | ----$CH_2$---- | ----$CH_2$---- |
| 122 | ----O---- | Formula (ii) | ----$CH_2$---- | Formula (i) | ----$CH_2$---- | ----$CH_2$---- | ----$CH_2$---- |
| 123 | ----C(=O)—O---- | Formula (ii) | ----$CH_2$---- | Formula (i) | ----$CH_2$---- | ----$CH_2$---- | ----$CH_2$---- |
| 124 | ----O---- | Formula (ii) | ----$CH_2$---- | Formula (i) | ----$CH_2$---- | ----$CH_2$---- | ----$CH_2$---- |

TABLE 13

| Specific example | Number of atoms in main chain | Formula (ii) | | | | | | Formula (i) | | |
|---|---|---|---|---|---|---|---|---|---|---|
| | | α | r | β | s | γ | t | $F^2$ | $R^{61}$ | $Y^1$ | $F^1$ |
| 125 | 4 | ----HC($CH_2$—)($C_2H_5$) | 1 | SB | 0 | SB | 0 | ----O---- | H | SB | ----O---- |
| 126 | 4 | ----HC($CH_2$—)($C_2H_5$) | 1 | SB | 0 | SB | 0 | ----O---- | H | SB | ----O---- |
| 127 | 4 | ----HC($CH_2$—)($C_2H_5$) | 1 | SB | 0 | SB | 0 | ----O---- | H | SB | ----O---- |
| 128 | 4 | ----HC($CH_2$—)($C_2H_5$) | 1 | SB | 0 | SB | 0 | ----O---- | H | SB | ----O---- |
| 129 | 4 | ----HC($CH_2$—)($C_2H_5$) | 1 | SB | 0 | SB | 0 | ----O---- | H | SB | ----O---- |
| 130 | 4 | ----HC($CH_2$—)($C_2H_5$) | 1 | SB | 0 | SB | 0 | ----O---- | $C_2H_5$ | ----$CH_2$---- | ----O---- |
| 131 | 4 | SB | 0 | (phenylene) | 1 | ----$CH_2$---- | 1 | ----O---- | H | SB | ----O---- |
| 132 | 4 | ----HC($CH_2$—)($C_2H_5$) | 1 | SB | 0 | SB | 0 | ----O---- | H | SB | ----O---- |

TABLE 13-continued

| Specific example | Number of atoms in main chain | | | | | | | | | | |
|---|---|---|---|---|---|---|---|---|---|---|---|
| 133 | 6 | SB | 0 | 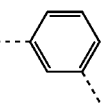 | 1 | SB | 0 | 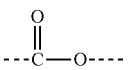  ----C—O---- | H | SB | 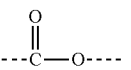  ----C—O---- |
| 134 | 5 | SB | 0 | 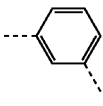 | 1 | SB | 0 | ----N---- H | H | SB | ----N---- H |
| 135 | 6 | SB | 0 | 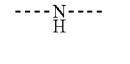 | 1 | SB | 0 | ----S---- | H | SB | ----S---- |
| 136 | 4 | 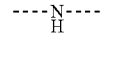 | 1 | SB | 0 | SB | 0 | ----O---- | H | SB | ----O---- |
| 137 | 4 |  | 1 | SB | 0 | SB | 0 | ----O---- | H | SB | ----O---- |
| 138 | 10 | ----(CH$_2$)$_8$---- | 1 | SB | 0 | SB | 0 | ----O---- | H | SB | ----O---- |
| 139 | 10 | 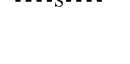 | 1 | 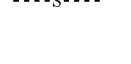 | 1 | SB | 0 | 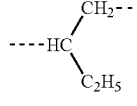  ----C—O---- | H | SB | 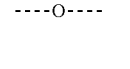  ----C—O---- |

| Specific example | Number of atoms in main chain | Formula (C2) | | | | |
|---|---|---|---|---|---|---|
| | | $R^{21}$ | $R^{22}$ | $R^{23}$ | $R^{24}$ | $R^{25}$ |
| 125 | 4 | 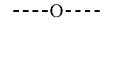 | Formula (ii) | ----CH$_2$---- | Formula (i) | ----CH$_2$---- |
| 126 | 4 | 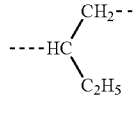 | Formula (ii) | ----CH$_2$---- | Formula (i) | ----CH$_2$---- |
| 127 | 4 | 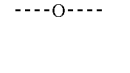 | Formula (ii) | Formula (i) | ----CH$_2$---- | ----CH$_2$---- |
| 128 | 4 | 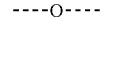 | Formula (ii) | ----CH$_2$---- | Formula (i) | ----CH$_2$---- |
| 129 | 4 | 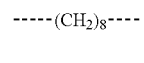 | H | Formula (ii) | Formula (i) | ----CH$_2$---- |
| 130 | 4 | 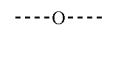 | Formula (ii) | ----CH$_2$---- | Formula (i) | ----CH$_2$---- |
| 131 | 4 | 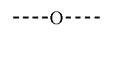 | Formula (ii) | ----CH$_2$---- | Formula (i) | ----CH$_2$---- |
| 132 | 4 | 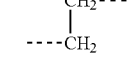 | Formula (ii) | ----CH$_2$---- | Formula (i) | ----CH$_2$---- |

TABLE 13-continued

| | | | | | | | |
|---|---|---|---|---|---|---|---|
| 133 | 6 | phenyl | Formula (ii) | ----CH$_2$--- | Formula (i) | ----CH$_2$--- |
| 134 | 5 | phenyl | Formula (ii) | ----CH$_2$--- | Formula (i) | ----CH$_2$--- |
| 135 | 6 | phenyl | Formula (ii) | ----CH$_2$--- | Formula (i) | ----CH$_2$--- |
| 136 | 4 | methylphenyl | Formula (ii) | ----CH$_2$--- | Formula (i) | ----CH$_2$--- |
| 137 | 4 | phenyl | Formula (ii) | ----CH$_2$--- | Formula (i) | ----CH$_2$--- |
| 138 | 10 | cyclopentyl | Formula (ii) | ----CH$_2$--- | Formula (i) | ----CH$_2$--- |
| 139 | 10 | cyclopentyl | Formula (ii) | ----CH$_2$--- | Formula (i) | ----CH$_2$--- |

TABLE 14

| Specific example | Number of atoms in main chain | Formula (ii) | | | | | Formula (i) | | |
|---|---|---|---|---|---|---|---|---|---|
| | | α | r | β | s | γ | t | F$^2$ | R$^{61}$ | Y$^1$ |
| 140 | 4 | H$_2$C----, ----CH, H$_2$C—CH(CH$_3$), CH$_3$ | 1 | SB | 0 | SB | 0 | ----O---- | H | SB |
| 141 | 7 | H$_2$C—S, ----CH$_2$, H$_2$C—CH$_2$ | 1 | SB | 0 | SB | 0 | ----O---- | H | SB |
| 142 | 7 | H$_2$C—O, ----CH$_2$, H$_2$C—CH$_2$ | 1 | SB | 0 | SB | 0 | ----O---- | H | SB |

| Specific example | Formula (C1) | | | | | | |
|---|---|---|---|---|---|---|---|
| | F$^1$ | R$^{11}$ | R$^{12}$ | R$^{13}$ | R$^{14}$ | R$^{15}$ | R$^{16}$ |
| 140 | ----O---- | Formula (ii) | ----CH$_2$--- | Formula (i) | ----CH$_2$--- | ----CH$_2$--- | ----CH$_2$--- |
| 141 | ----O---- | Formula (ii) | ----CH$_2$--- | Formula (i) | ----CH$_2$--- | ----CH$_2$--- | ----CH$_2$--- |
| 142 | ----O---- | Formula (ii) | ----CH$_2$--- | Formula (i) | ----CH$_2$--- | ----CH$_2$--- | ----CH$_2$--- |

TABLE 15

| Specific example | Number of atoms in main chain | Formula (ii) | | | | | Formula (i) | | |
|---|---|---|---|---|---|---|---|---|---|
| | | α | r | β | s | γ | t | $F^2$ | $R^{61}$ | $Y^1$ |
| 143 | 4 | H₂C—CH(—CH₂—CH(CH₃)—CH₃) branched structure | 1 | SB | 0 | SB | 0 | ----O---- | H | SB |
| 144 | 7 | H₂C—S—CH₂—CH₂—CH₂ (with ----CH₂) | 1 | SB | 0 | SB | 0 | ----O---- | H | SB |
| 145 | 7 | H₂C—O—CH₂—CH₂—CH₂ (with ----CH₂) | 1 | SB | 0 | SB | 0 | ----O---- | H | SB |

| Specific example | Formula (C2) | | | | |
|---|---|---|---|---|---|
| | $R^{21}$ | $R^{22}$ | $R^{23}$ | $R^{24}$ | $R^{25}$ |
| 143 | phenyl | Formula (ii) | ----CH₂---- | Formula (i) | ----CH₂---- |
| 144 | phenyl | Formula (ii) | ----CH₂---- | Formula (i) | ----CH₂---- |
| 145 | phenyl | Formula (ii) | ----CH₂---- | Formula (i) | ----CH₂---- |

TABLE 16

| Specific example | Number of atoms in main chain | Formula (ii) | | | | | | Formula (i) | | |
|---|---|---|---|---|---|---|---|---|---|---|
| | | α | l | β | m | γ | n | $D^2$ | $R^{61}$ | $Y^1$ |
| 201 | 6 | SB | 0 | phenyl | 1 | CH₂—CH₂ | 1 | ----O---- | H | SB |
| 202 | 6 | SB | 0 | phenyl | 1 | ----CH₂---- | 1 | ----O---- | H | SB |
| 203 | 6 | SB | 0 | phenyl | 1 | SB | 0 | ----C(=O)—O---- | H | SB |
| 204 | 5 | SB | 0 | phenyl | 1 | SB | 0 | ----N(H)---- | H | SB |
| 205 | 6 | SB | 0 | phenyl | 1 | SB | 0 | ----S---- | H | SB |

TABLE 16-continued

| | | | | | | | | | |
|---|---|---|---|---|---|---|---|---|---|
| 206 | 4 | ---HC(CH$_2$---)(C$_2$H$_5$) | 1 | SB | 0 | SB | 0 | ----O---- | C$_2$H$_5$ | ----CH$_2$--- |

| Specific example | Formula (C1) | | | | | | |
|---|---|---|---|---|---|---|---|
| | D$^1$ | R$^{11}$ | R$^{12}$ | R$^{13}$ | R$^{14}$ | R$^{15}$ | R$^{16}$ |
| 201 | ----O---- | Formula (ii) | ----CH$_2$--- | Formula (i) | ----CH$_2$--- | ----CH$_2$--- | ----CH$_2$--- |
| 202 | ----O---- | Formula (ii) | ----CH$_2$--- | Formula (i) | ----CH$_2$--- | ----CH$_2$--- | ----CH$_2$--- |
| 203 | ----C(=O)—O---- | Formula (ii) | ----CH$_2$--- | Formula (i) | ----CH$_2$--- | ----CH$_2$--- | ----CH$_2$--- |
| 204 | ----NH---- | Formula (ii) | ----CH$_2$--- | Formula (i) | ----CH$_2$--- | ----CH$_2$--- | ----CH$_2$--- |
| 205 | ----S---- | Formula (ii) | ----CH$_2$--- | Formula (i) | ----CH$_2$--- | ----CH$_2$--- | ----CH$_2$--- |
| 206 | ----O---- | Formula (ii) | ----CH$_2$--- | Formula (i) | ----CH$_2$--- | ----CH$_2$--- | ----CH$_2$--- |

TABLE 17

| Specific example | Number of atoms in main chain | Formula (ii) | | | | | | Formula (i) | | | |
|---|---|---|---|---|---|---|---|---|---|---|---|
| | | α | l | β | m | γ | n | D$^2$ | R$^{61}$ | Y$^1$ | D$^1$ |
| 207 | 4 | ---HC(CH$_2$---)(C$_2$H$_5$) | 1 | SB | 0 | SB | 0 | ----O---- | H | SB | ----O---- |
| 208 | 6 | SB | 0 | (phenylene) | 1 | SB | 0 | ----C(=O)—O---- | H | SB | ----C(=O)—O---- |

| Specific example | Formula (C2) | | | | |
|---|---|---|---|---|---|
| | R$^{21}$ | R$^{22}$ | R$^{23}$ | R$^{24}$ | R$^{25}$ |
| 207 | (cyclohexyl) | Formula (ii) | ----CH$_2$--- | Formula (i) | ----CH$_2$--- |
| 208 | (phenyl) | Formula (ii) | ----CH$_2$--- | Formula (i) | ----CH$_2$--- |

TABLE 18

| Specific example | Number of atoms in main chain | Formula (ii) | | | | | | Formula (i) | | |
|---|---|---|---|---|---|---|---|---|---|---|
| | | α | l | β | m | γ | n | D$^2$ | R$^{61}$ | Y$^1$ |
| 301 | 7 | SB | 0 | (phenylene) | 1 | ----CH$_2$---CH$_2$---- | 1 | ----C(=O)—O---- | H | SB |

TABLE 18-continued

| | | | | | | | | | | |
|---|---|---|---|---|---|---|---|---|---|---|
| 302 | 4 | CH₂---<br>\|<br>----CH₂ | 1 | SB | 0 | SB | 0 | ----O---- | H | SB |
| 303 | 2 | SB | 0 | SB | 0 | SB | 0 | ----O---- | H | SB |
| 304 | 7 | SB | 0 | (phenyl) | 1 | CH₂---<br>\|<br>----CH₂ | 1 | ----C(=O)—O---- | H | SB |
| 305 | 2 | SB | 0 | SB | 0 | SB | 0 | ----O---- | H | SB |

| Specific example | | Formula (C1) | | | | | |
|---|---|---|---|---|---|---|---|
| | $D^1$ | $R^{11}$ | $R^{12}$ | $R^{13}$ | $R^{14}$ | $R^{15}$ | $R^{16}$ |
| 301 | ----C(=O)—O---- | Formula (ii) | ----CH₂---- | Formula (i) | ----CH₂---- | ----CH₂---- | ----CH₂---- |
| 302 | ----O---- | Formula (ii) | H | Formula (i) | ----CH₂---- | ----CH₂---- | H |
| 303 | ----O---- | Formula (ii) | ----CH₂---- | Formula (i) | ----CH₂---- | ----CH₂---- | ----CH₂---- |
| 304 | ----C(=O)—O---- | Formula (ii) | H | Formula (i) | ----CH₂---- | ----CH₂---- | H |
| 305 | ----O---- | Formula (ii) | ----CH₂---- | Formula (i) | ----CH₂---- | ----CH₂---- | ----CH₂---- |

TABLE 19

| Specific example | Number of atoms in main chain | Formula (ii) | | | | | | Formula (i) | | | |
|---|---|---|---|---|---|---|---|---|---|---|---|
| | | α | l | β | m | γ | n | $D^2$ | $R^{61}$ | $Y^1$ | $D^1$ |
| 306 | 4 | CH₂---<br>\|<br>----CH₂ | 1 | SB | 0 | SB | 0 | ----O---- | H | SB | ----O---- |
| 307 | 4 | CH₂---<br>\|<br>----CH₂ | 1 | SB | 0 | SB | 0 | ----O---- | H | SB | ----N(H)---- |
| 308 | 4 | CH₂---<br>\|<br>----CH₂ | 1 | SB | 0 | SB | 0 | ----O---- | H | SB | ----S---- |

| Specific example | Formula (C2) | | | | |
|---|---|---|---|---|---|
| | $R^{21}$ | $R^{22}$ | $R^{23}$ | $R^{24}$ | $R^{25}$ |
| 306 | (phenyl) | Formula (ii) | ----CH₂---- | Formula (i) | ----CH₂---- |
| 307 | (phenyl) | Formula (ii) | ----CH₂---- | Formula (i) | ----CH₂---- |
| 308 | (phenyl) | Formula (ii) | ----CH₂---- | Formula (i) | ----CH₂---- |

The second layer 214 may be formed, for example, as described below. First, a coating liquid containing a melamine compound or a guanamine compound, a resin having a polymerizable functional group capable of reacting with the melamine or guanamine compound, and an electron-transporting compound having a polymerizable functional group capable of reacting with the melamine or guanamine compound is applied to form a coating film. Then, the resulting coating film is thermally cured to yield the second layer 214.

Melamine Compound, Guanamine Compound

The melamine compound and the guanamine compound will now be described. The melamine compound or the guanamine compound is synthesized by a known process using, for example, melamine or guanamine and formaldehyde.

Specific examples of the melamine compound and the guanamine compound will be presented below. Although the following specific examples are monomers, oligomers of monomers may be contained. Preferably, monomers are contained in a proportion of 10% by mass to the total mass of the monomers and oligomers from the viewpoint of increasing the conversion efficiency. Preferably, the polymerization degree of the oligomer may be 2 to 100. Two or more of oligomers and monomers may be contained together. Commercially available amine compounds include, for example, Super Melami No. 90 (produced by NOF Corporation); Super Beckamine® series TD-139-60, L-105-60, L127-60, L110-60, J-820-60, and G-821-60 (all produced by DIC Corporation); U-VAN 2020 (produced by Mitsui Chemicals, Inc.); Sumitex Resin M-3 (produced by Sumitomo Chemical Company, Limited); and NIKALAC series MW-30, MW-390, and MX-750LM (produced by Nippon Carbide Industries Co., Inc.) Commercially available guanamine compounds include, for example, Super Beckamine® series L-148-55, 13-535, L-145-60, and TD-126 (all produced by DIC Corporation); and NIKALAC series BL-60 and BX-4000 (produced by Nippon Carbide Industries Co., Inc.)

The following presents specific examples of the melamine compound.

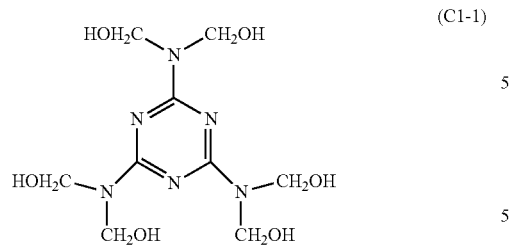
(C1-1)

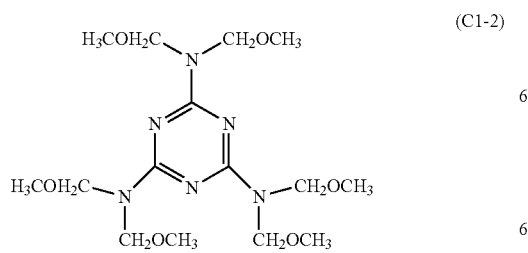
(C1-2)

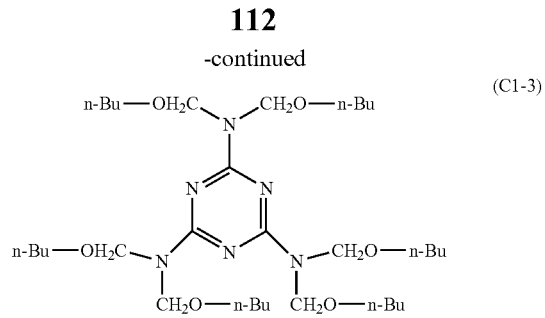
(C1-3)

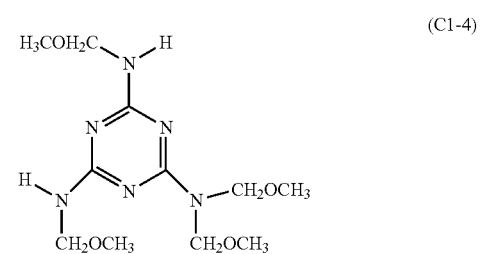
(C1-4)

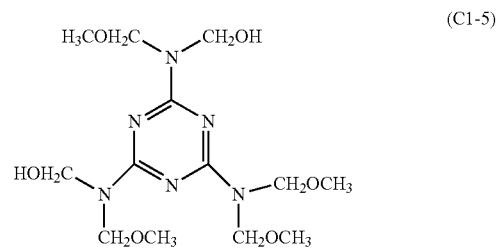
(C1-5)

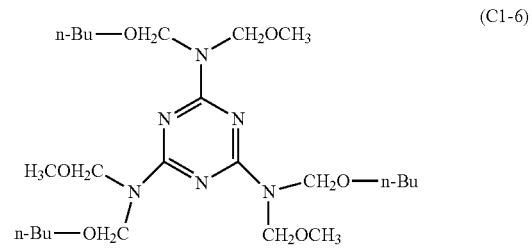
(C1-6)

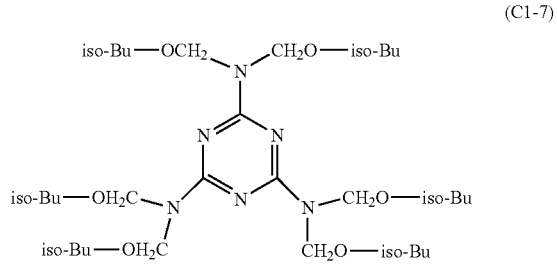
(C1-7)

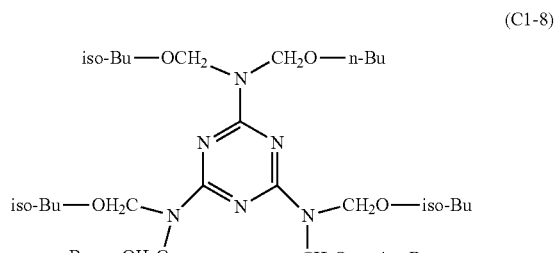
(C1-8)

(C1-9)
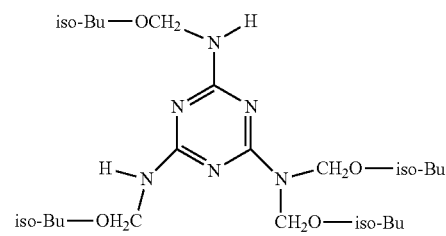
(C1-10)
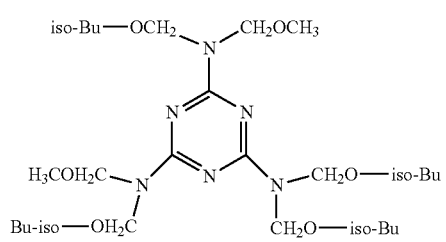
(C1-11)
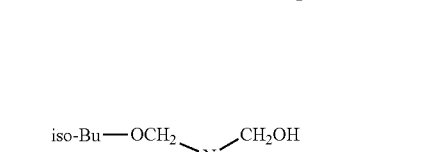
(C1-12)
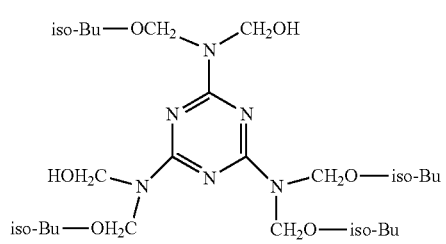
The following presents specific examples of the guanamine compound.
(C2-1)
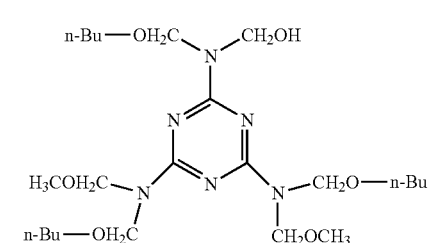
(C2-2)
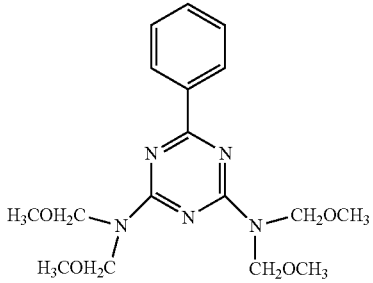
(C2-3)
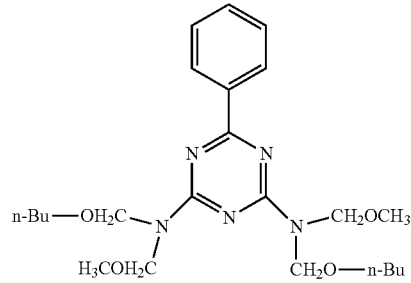
(C2-4)
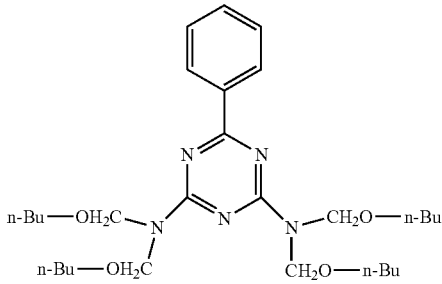
(C2-5)
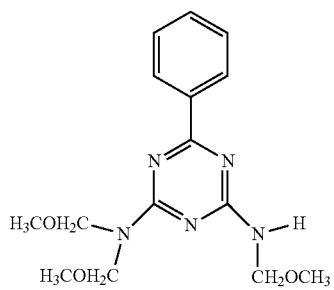
(C2-6)
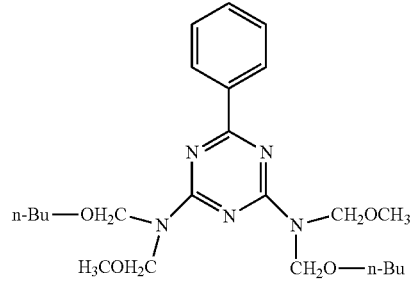

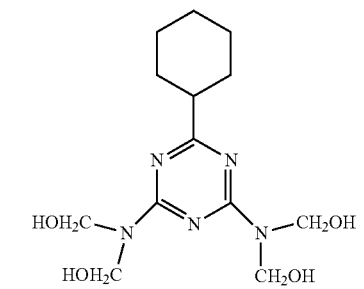
(C2-7)
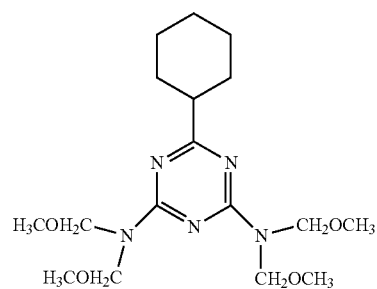
(C2-8)
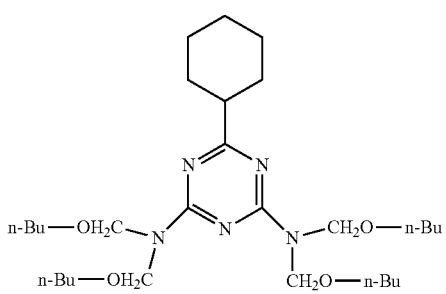
(C2-9)
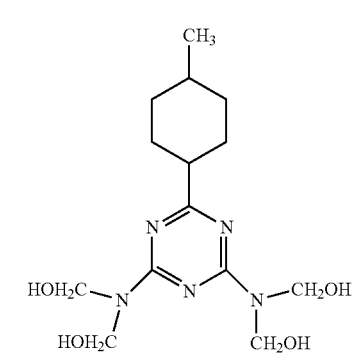
(C2-10)
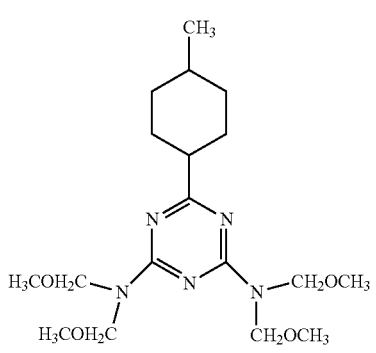
(C2-11)
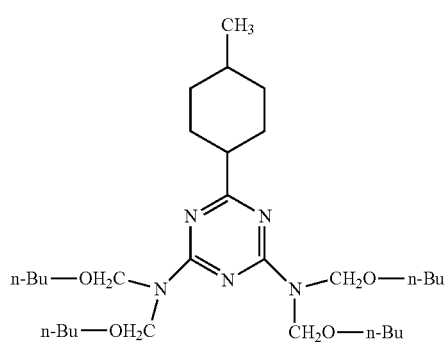
(C2-12)
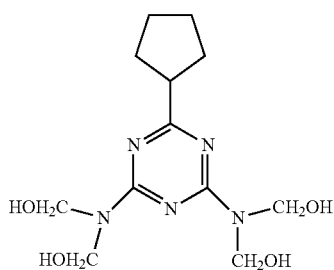
(C2-13)
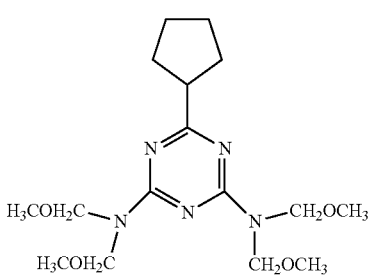
(C2-14)
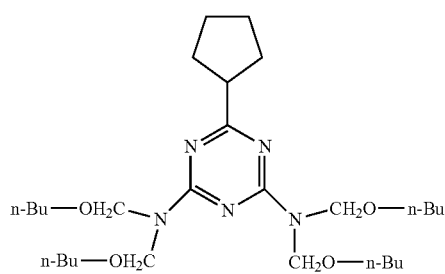
(C2-15)
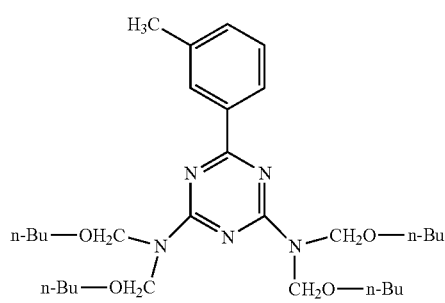
(C2-16)

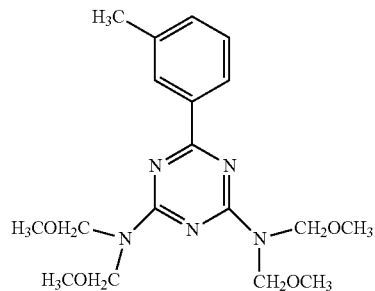

(C2-17)

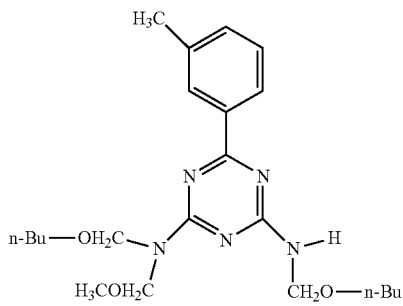

(C2-18)

The mole ratio (I:H) of the functional groups (amount by mole=I) of the melamine or guanamine compound to the total moles (=H) of the polymerizable functional groups of the resin and the electron-transporting compound (compound having the structure represented by any one of formulas (E-1) to (E-3)) is preferably 1:0.5 to 1:3.0. A mole ratio in this range is preferred because the proportion of functional groups to react is high.

Electron-Transporting Compound

Details of the electron-transporting compound having a polymerizable functional group capable of reacting with the melamine compound or the guanamine compound have been described above in [Electron-Transporting Compound] in [Second Photoelectric Conversion Element]. The electron-transporting compound is derived from the structure denoted by $E^1$ in formula (ii).

Resin

The resin having a polymerizable functional group capable of reacting with the melamine compound or the guanamine compound will now be described. The resin has a group represented by formula (i). This resin can be obtained by polymerizing monomers having polymerizable functional groups (hydroxy group, thiol group, amino group, carboxyl group, and methoxy group) that are commercially available from, for example, Sigma-Aldrich Japan or Tokyo Chemical Industry Co., Ltd.

The resin is also commercially available for purchase as it is. Examples of commercially available resins include polyether-polyol resin, such as AQD-457 and AQD-473 produced by Nippon Polyurethane Industry Co., Ltd. and SANNIX GP-400 and GP-700 produced by Sanyo Chemical Industries, Ltd.; polyester-polyol resin, such as Phthalkyd W2343 produced by Hitachi Chemical Company, Ltd., WATERSOL S-118 and CD-520 and BECKOLITE M-6402-50 and M-6201-401M produced by DIC Corporation, HARIDIP WH-1188 produced by Harima Chemicals Group, Inc., and ES3604 and ES6538 produced by Japan U-pica co., ltd.; polyacrylic polyol resin, such as BURNOCK WE-300 and WE-304 produced by DIC Corporation; polyvinyl alcohol resin, such as KURARAY POVAL PVA-203 produced by Kuraray Co., Ltd.; polyvinyl acetal resin, such as BX-1, BM-1, KS-1, and KS-5 produced by Sekisui Chemical Co., Ltd.; polyamide resin, such as Toresin FS-350 produced by Nagase Chemtex Corporation; carboxy-containing resin, such as AQUALIC produced by Nippon Shokubai Co., Ltd. and FINELEX SG2000 produced by Namariichi Co., Ltd.; polyamine resin, such as LUCKAMIDE produced by DIC Corporation; and polythiol resin, such as QE-340M produced by Toray Industries, Inc. Among these, polyvinyl acetal resin and polyester-polyol resin are preferred in view of polymerizability and second layer 214 uniformity.

Preferably, the weight average molecular weight (Mw) of the resin is 5,000 to 300,000. The molecular weight of the resin can be determined by measurement with, for example, a gel permeation chromatography "HLC-8120" manufactured by Tosoh Corporation and calculation in polystyrene equivalent.

Methods for determination of functional groups in the resin include, for example, titration of carboxyl groups using potassium hydroxide, titration of amino groups using sodium nitrite, titration of hydroxy groups using acetic anhydride and potassium hydroxide, titration of thiol groups using 5,5'-dithiobis(2-nitrobenzoic acid), and a method using a calibration curve obtained from IR spectra of samples with a functional group introduced in varying proportions.

Next, specific samples of the resin will be presented below.

TABLE 20

| Resin | Formula (i) structure | | | mol/g of Functional group | Rest of the structure | Molecular weight |
| --- | --- | --- | --- | --- | --- | --- |
| | $R^{61}$ | $Y^1$ | $F^1$ | | | |
| Resin 1 | H | SB | OH | 3.3 mmol | Butyral | $1 \times 10^5$ |
| Resin 2 | H | SB | OH | 3.3 mmol | Butyral | $4 \times 10^4$ |
| Resin 3 | H | SB | OH | 3.3 mmol | Butyral | $2 \times 10^4$ |
| Resin 4 | H | SB | OH | 1.0 mmol | Polyolefin | $1 \times 10^5$ |
| Resin 5 | H | SB | OH | 3.0 mmol | Ester | $8 \times 10^4$ |
| Resin 6 | H | SB | OH | 2.5 mmol | Polyether | $5 \times 10^4$ |
| Resin 7 | H | SB | OH | 2.8 mmol | Cellulose | $3 \times 10^4$ |
| Resin 8 | H | SB | COOH | 3.5 mmol | Polyolefin | $6 \times 10^4$ |
| Resin 9 | H | SB | $NH_2$ | 1.2 mmol | Polyamide | $2 \times 10^5$ |
| Resin 10 | H | SB | SH | 1.3 mmol | Polyolefin | $9 \times 10^3$ |
| Resin 11 | H | Phenylene | OH | 2.8 mmol | Polyolefin | $4 \times 10^3$ |
| Resin 12 | H | SB | OH | 3.0 mmol | Butyral | $7 \times 10^4$ |
| Resin 13 | H | SB | OH | 2.9 mmol | Polyester | $2 \times 10^4$ |
| Resin 14 | H | SB | OH | 2.5 mmol | Polyester | $6 \times 10^3$ |
| Resin 15 | H | SB | OH | 2.7 mmol | Polyester | $8 \times 10^4$ |

TABLE 20-continued

| Resin | Formula (i) structure | | | mol/g of Functional group | Rest of the structure | Molecular weight |
|---|---|---|---|---|---|---|
| | $R^{61}$ | $Y^1$ | $F^1$ | | | |
| Resin 16 | H | SB | COOH | 1.4 mmol | Polyolefin | $2 \times 10^5$ |
| Resin 17 | H | SB | COOH | 2.2 mmol | Polyester | $9 \times 10^3$ |
| Resin 18 | H | SB | COOH | 2.8 mmol | Polyester | $8 \times 10^2$ |
| Resin 19 | $CH_3$ | Alkylene | OH | 1.5 mmol | Polyester | $2 \times 10^4$ |
| Resin 20 | $C_2H_5$ | Alkylene | OH | 2.1 mmol | Polyester | $1 \times 10^4$ |
| Resin 21 | $C_2H_5$ | Alkylene | OH | 3.0 mmol | Polyester | $5 \times 10^4$ |
| Resin 22 | H | SB | $OCH_3$ | 2.8 mmol | Polyolefin | $7 \times 10^3$ |
| Resin 23 | H | SB | OH | 3.3 mmol | Butyral | $2.7 \times 10^5$ |
| Resin 24 | H | SB | OH | 3.3 mmol | Butyral | $4 \times 10^5$ |

Solvent

The solvent used for preparing the coating liquid for forming the second layer 214 can be selected arbitrarily from, for example, alcohols, aromatic solvents, halogenated hydrocarbons, ketones, ketoalcohols, ethers, esters, and so forth. More specifically, examples that can be used include, for example, organic solvents, such as methanol, ethanol, n-propanol, isopropanol, n-butanol, benzyl alcohol, methyl cellosolve, ethyl cellosolve, acetone, methyl ethyl ketone, cyclohexanone, methyl acetate, n-butyl acetate, dioxane, tetrahydrofuran, methylene chloride, chloroform, chlorobenzene, and toluene. These solvents may be used singly or in combination.

Check for Curing

Whether the second layer 214 is cured is checked, for example, as described below. A coating film of the coating liquid for forming the second layer 214 containing a melamine compound or a guanamine compound, a resin, and an electron-transporting material is formed on an aluminum sheet with a mayer bar, and the coating film is dried by heating at 160° C. for 40 minutes to yield a second layer 214. The resulting second layer 214 is immersed in cyclohexanone/ethyl acetate=1/1 mixed solvent for 2 minutes, followed by drying at 160° C. for 5 minutes. The mass of the second layer 214 is measured before and after the immersion, and it is confirmed that there is no elution (difference in mass: within ±2%).

Photoelectric Conversion Device

The photoelectric conversion device contains the photoelectric conversion element according to an embodiment of the present invention.

A device in which a plurality of the elements is connected may also be referred to as a photoelectric conversion module. The elements may be disposed one on top of another to increase the output voltage. Also, the photoelectric conversion device includes the photoelectric conversion element according to an embodiment of the present invention, and an inverter. The inverter may be a converter that converts direct current into alternating current. The photoelectric conversion device may include a power storage portion connected to the photoelectric conversion element. The power storage portion stores electricity and is not otherwise limited. Examples of the power storage portion include a secondary battery using lithium ions or the like, an all-solid-state battery, and an electric double-layer capacitor.

Figure 5:
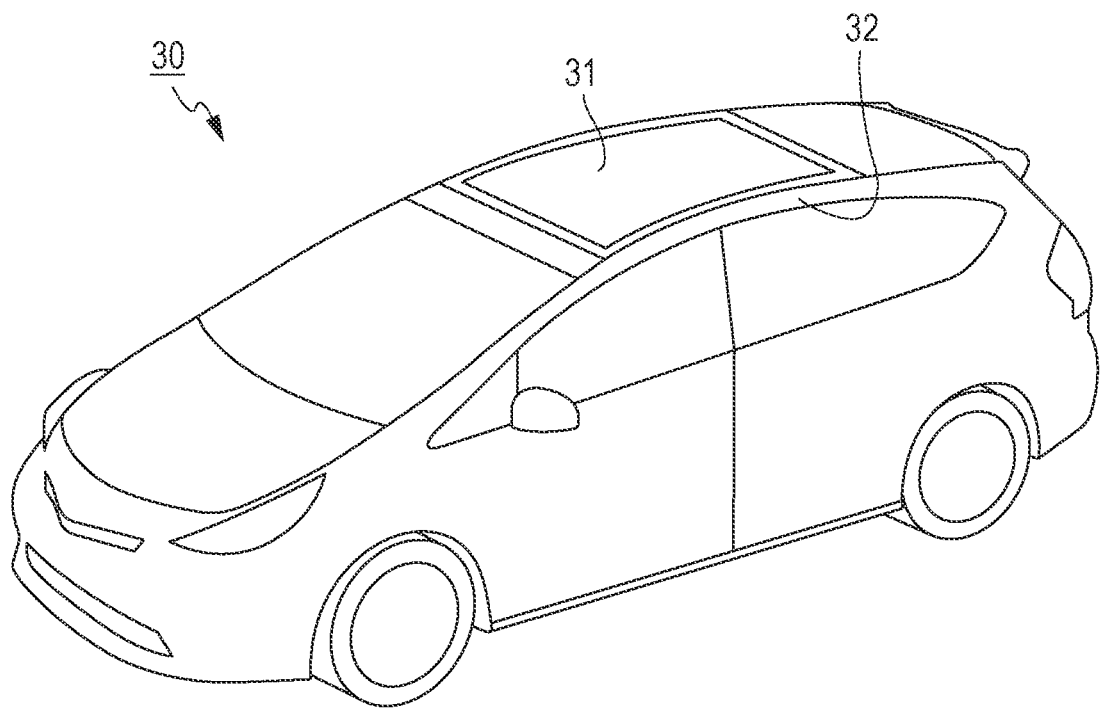
FIG. 5 depicts an example of a movable body including the photoelectric conversion element according to an embodiment of the present invention.

FIG. 5 depicts an example of the movable body according to the present embodiment. The movable body 30 includes a photoelectric conversion element 31 according to an embodiment of the present invention, and a body frame 32 provided with the photoelectric conversion element. The photoelectric conversion element 31 is located at a position in the body frame 32 at which external light can be received.

In a movable body 30 being an automobile, the photoelectric conversion element may be positioned at the roof. The electrical energy obtained by the photoelectric conversion element 31 may power the movable body 30 or other electrical apparatuses. The electrical energy generated from the power of the movable body 30 may be used for powering the photoelectric conversion element 31. In a movable body 30 being an automobile, the frictional energy generated by braking may be converted into electrical energy and used to control the photoelectric conversion element 31.

The movable body 30 may be, for example, an automobile, a ship, an airplane, or a drone. The body frame 32 of the movable body 30 is not particularly limited but is preferably made of a high-strength material.

Figure 6:
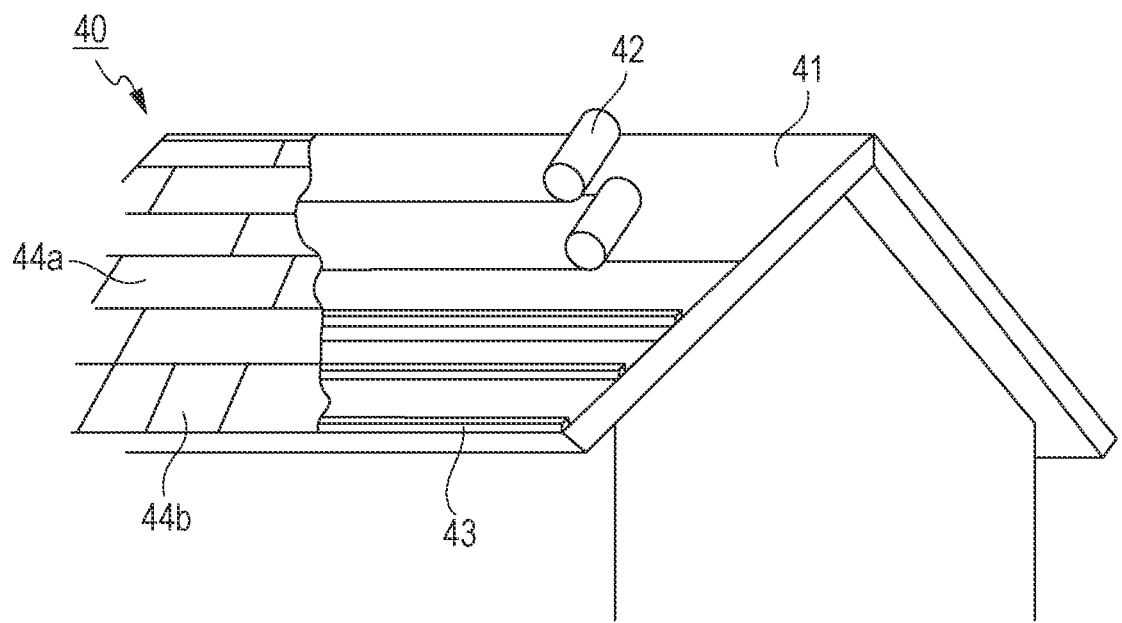
FIG. 6 depicts an example of a building material including the photoelectric conversion element according to an embodiment of the present invention.

FIG. 6 depicts an example of a building material according to the present embodiment. The building material may be a roof of a building. The building material 40 includes a photoelectric conversion element 41 according to an embodiment of the present invention, a protective member 42 that protects the photoelectric conversion element, a heat radiation member 43, and an exterior 44. Hence, the building material according to the present embodiment includes a photoelectric conversion element 41 according to the present invention and a protective member 42 or a heat radiation member 43.

The building material 40 according to the present embodiment may include a heat radiation member 43 with a higher thermal conductivity than the photoelectric conversion element 41. When the building material is used for a roof or the like, sunlight can increase the temperature of the photoelectric conversion element 41, thereby reducing the photoelectric conversion efficiency. Using the heat radiation member 43 can reduce the decrease in photoelectric conversion efficiency. The heat radiation member 43 may be metal, alloy, liquid metal, liquid resin, or the like.

The building material 40 according to the present embodiment has the exterior 44. Exterior 44a and exterior 44b may emit different colors or the same color. The exterior 44a and the exterior 44b may be constituted of the same members or different members. The exterior 44 may use a paint and a transparent substrate. Preferably, light absorption is low, and heat shielding performance is high.

The building material 40 according to the present embodiment can be excellent in design because it includes a photoelectric conversion layer containing perovskite. In addition, the building material has high photoelectric conversion efficiency because it includes a reflection layer. Hence, the building material can be excellent in photoelectric conversion efficiency and have vivid color.

EXAMPLES

The present invention will be further described in detail with reference to Examples and Comparative Examples. The present invention is not limited by the following Examples unless departing from the gist of the invention. In the following Examples, "part(s)" is on a mass basis unless otherwise specified.

First Embodiment

Selection and Production Examples of Particles
Particles 1 to 8: Titanium Oxide Particles Titanium oxide (produced by Tayca Corporation) with a volume average particle size of 50 nm to 600 nm was used.
Particle 9: Zinc Oxide Particles Zinc oxide (produced by Hakusui Tech Co., Ltd.) with a volume average particle size of 200 nm was used.
Particle 10: Tin Oxide-Coated Titanium Oxide Particles Titanium oxide particles with a volume average particle size of 200 nm were used as core particles.

200 g of core particles were dispersed in water to prepare 2 L of water suspension, followed by heating to 70° C. Tin-acid solution A, which was prepared by dissolving 226.2 g of stannic chloride ($SnCl_4.5H_2O$) in 500 mL of 3 mol/L hydrochloric acid solution, and alkaline solution B, which was prepared by dissolving 5.2 g of sodium tungstate ($Na_2WO_4.2H_2O$) in 500 mL of 5 mol/L sodium hydroxide solution, were simultaneously dropped (parallelly added) into the suspension over 6 hours so that the suspension had a pH of 2 to 3. After the completion of dropping, the suspension was filtered, and the product was rinsed and dried at 110° C. for 8 hours. The dried product was heat-treated at 650° C. for 1 hour in a nitrogen gas stream (1 L/min) to yield Particle 10.
Particle 11: Nb-Doped Titanium Oxide-Coated Titanium Oxide Particles Titanium oxide particles with a volume average particle size of 200 nm were used as core particles.

A titanium niobium sulfuric acid solution containing 33.7 g of titanium in terms of $TiO_2$ and 2.9 g of niobium in terms of $Nb_2O$ was prepared. 100 g of core particles were dispersed in pure water to prepare 1 L of suspension, followed by heating to 60° C. The titanium niobium sulfuric acid solution and 10 mol/L sodium hydroxide were dropped over 3 hours so that the suspension had a pH of 2 to 3. After the entire volume was dropped, the pH was adjusted to near neutral, and a flocculant was added to allow the solids to settle. The supernatant was removed, and the rest was filtered. The residue was washed and dried at 110° C. to obtain an intermediate containing 0.1 wt % flocculant-derived organic substance in terms of C. The intermediate was fired at 800° C. for 1 hour in nitrogen gas to yield Particle 11.

Preparation Examples of Coating Liquid for Reflection Layer

In the cases where no binder was added to the reflection layer, a solution was obtained by dissolution in 1500 parts of 1-methoxy-2-propanol as the solvent. Into this solution, 30 parts of the above-described particles were added, and the particles were dispersed in the solution for 4 hours at a dispersion liquid temperature of 23° C.±3° C. in a vertical sand mill using 1500 parts of glass beads of 1.0 mm in average diameter as a dispersion medium at a rotational speed of 1500 rpm (peripheral speed of 5.5 m/s). The glass beads were removed from the resulting dispersion liquid with a mesh to yield a coating material for the reflection layer.

In the cases where the reflection layer contained a binder, a solution was obtained by dissolving a phenol resin or polyamide resin as the binder in 1500 parts of 1-methoxy-2-propanol as the solvent. Into the resulting solution, the above-prepared particles were added in an arbitrary weight ratio to the selected resin and dispersed in the solution for 4 hours at a dispersion liquid temperature of 23° C.±3° C. in a vertical sand mill using 1500 parts of glass beads of 1.0 mm in average diameter as a dispersion medium at a rotational speed of 1500 rpm (peripheral speed of 5.5 m/s). The glass beads were removed from the resulting dispersion liquid with a mesh to yield a coating material for the reflection layer.

Preparation Examples of Coating Material for Photoelectric Conversion Layer

Coating Material 1: $MAPbI_3$ Coating Material

In 4.5 parts of dimethylformamide as the solvent were dissolved 4 parts of lead iodide and 1.4 parts of methylammonium iodide by stirring at 60° C. for 24 hours.

Coating Material 2: $MAPbBr_3$ Coating Material

In 4.5 parts of dimethylformamide as the solvent were dissolved 3.4 parts of lead bromide and 1 part of methylammonium bromide by stirring at 60° C. for 24 hours.

Coating Materials 3 to 5: $MAPbI_{(1-x)}Br_x$ Coating Materials

Each coating material was prepared by mixing coating material 1 and coating material 2 in the weight ratio presented in Table 22.

TABLE 21

| Particle No. | Material | Particle size | Coating layer material | Coating layer thickness | Aspect ratio | Refractive index |
| --- | --- | --- | --- | --- | --- | --- |
| Particle 1 | Titanium oxide | 50 | None | None | 1.0 | 2.4 |
| Particle 2 | Titanium oxide | 70 | None | None | 1.2 | 2.5 |
| Particle 3 | Titanium oxide | 120 | None | None | 1.3 | 2.5 |
| Particle 4 | Titanium oxide | 150 | None | None | 2.2 | 2.7 |
| Particle 5 | Titanium oxide | 180 | None | None | 1.3 | 2.7 |
| Particle 6 | Titanium oxide | 200 | None | None | 2.4 | 2.7 |
| Particle 7 | Titanium oxide | 300 | None | None | 1.9 | 2.8 |
| Particle 8 | Titanium oxide | 600 | None | None | 2.3 | 2.7 |
| Particle 9 | Zinc oxide | 200 | None | None | 1.5 | 2.4 |
| Particle 10 | Titanium oxide | 200 | Tin oxide | 20 | 2.6 | 2.8 |
| Particle 11 | Titanium oxide | 200 | Nb-doped titanium oxide | 30 | 2.4 | 2.7 |

TABLE 22

| Photoelectric conversion layer coating material No. | Weight ratio Coating material 1/coating material 2 |
|---|---|
| Coating material 3 | 10/90 |
| Coating material 4 | 20/80 |
| Coating material 5 | 30/70 |

Example 1-1

Onto an ITO glass substrate, Spiro-OMeTAD (180 mg) as the hole-transporting material was dissolved in chlorobenzene (1 mL) in an $N_2$ atmosphere. t-Butylpyridine (TBP, 17.5 μL) and an acetonitrile solution (37.5 μL) prepared by dissolving lithium bis(trifluoromethanesulfonyl)imide (170 mg) in acetonitrile (1 mL) were added into the chlorobenzene solution to prepare a hole-transporting material solution. The resulting solution was applied onto the perovskite layer by spin coating. After the application, the coating film was fired at 100° C. for 10 minutes to form a 300 nm-thick hole transport layer.

Subsequently, a film of coating material 4 for the photoelectric conversion layer was formed on the hole transport layer by spin coating, and the coating film was fired at 100° C. for 10 minutes to form a 300 nm-thick photoelectric conversion layer.

Subsequently, a film of a coating material prepared by dispersing particle 6 and a phenol resin in each other in a weight ratio of 80/1 was formed on the photoelectric conversion layer by spin coating. The coating film was fired at 130° C. for 30 minutes to form a 300 nm-thick reflection layer.

Then, a gold electrode with a thickness of 80 nm and an area of 0.09 $cm^2$ was formed on the reflection layer by vacuum deposition to complete a photoelectric conversion element.

Example 1-2

The layers up to the photoelectric conversion layer were formed one on top of another in the same manner as in Example 1-1, and a film of a coating material in which particle 6 was dispersed was formed by spin coating. The coating film was fired at 130° C. for 30 minutes to form a 300 nm-thick reflection layer. Then, an 80 nm-thick gold electrode was formed on the reflection layer by vacuum deposition to complete a photoelectric conversion element.

Examples 1-3 to 1-19

The layers up to the charge transport layer were formed one on top of another in the same manner as in Example 1-1, and a film of a coating material for the photoelectric conversion layer presented in Table 23 was formed by spin coating. The coating film was fired at 100° C. for 10 minutes to form a 300 nm-thick active layer. Subsequently, a coating film of a coating material in which the particle presented in Table 23 was dispersed was formed by spin coating. The coating film was fired at 130° C. for 30 minutes to form a 300 nm-thick reflection layer. Then, a gold electrode with a thickness of 80 nm and an area of 0.09 $cm^2$ was formed on the reflection layer by vacuum deposition to complete a photoelectric conversion element.

Example 1-20

A photoelectric conversion element was produced in the same manner as in Example 1-1, except that the weight ratio of particle 6 to the phenol resin was 100/1.

Example 1-21

A photoelectric conversion element was produced in the same manner as in Example 1-1, except that the weight ratio of particle 6 to the phenol resin was 2/1.

Example 1-22

A photoelectric conversion element was produced in the same manner as in Example 1-20, except that polyamide was used as the binder resin.

Example 1-23

A photoelectric conversion element was produced in the same manner as in Example 1-21, except that polyamide was used as the binder resin.

Comparative Example 1-1

A photoelectric conversion element was produced in the same manner as in Example 1-1, except that particle 6 was replaced with titanium oxide with a volume average particle size of 30 nm.

Comparative Example 1-2

A photoelectric conversion element was produced in the same manner as in Example 1-2, except that particle 6 was replaced with titanium oxide with a volume average particle size of 30 nm.

Comparative Example 1-3

A photoelectric conversion element was produced in the same manner as in Example 1-14, except that particle 6 was replaced with titanium oxide with a volume average particle size of 30 nm.

Evaluation

The photoelectric conversion elements produced in the Examples and Comparative Examples were subjected to the following evaluation.

Figure 7A:
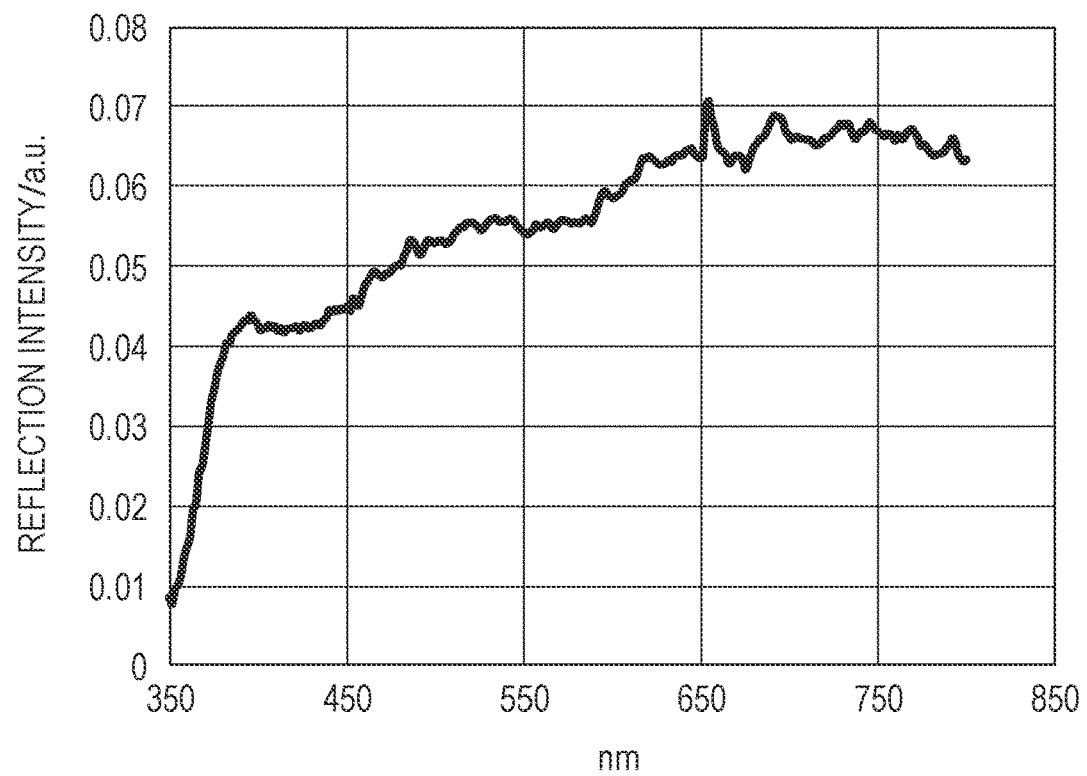
FIG. 7A depicts a spectrum of Example 1-1.
Figure 7B:
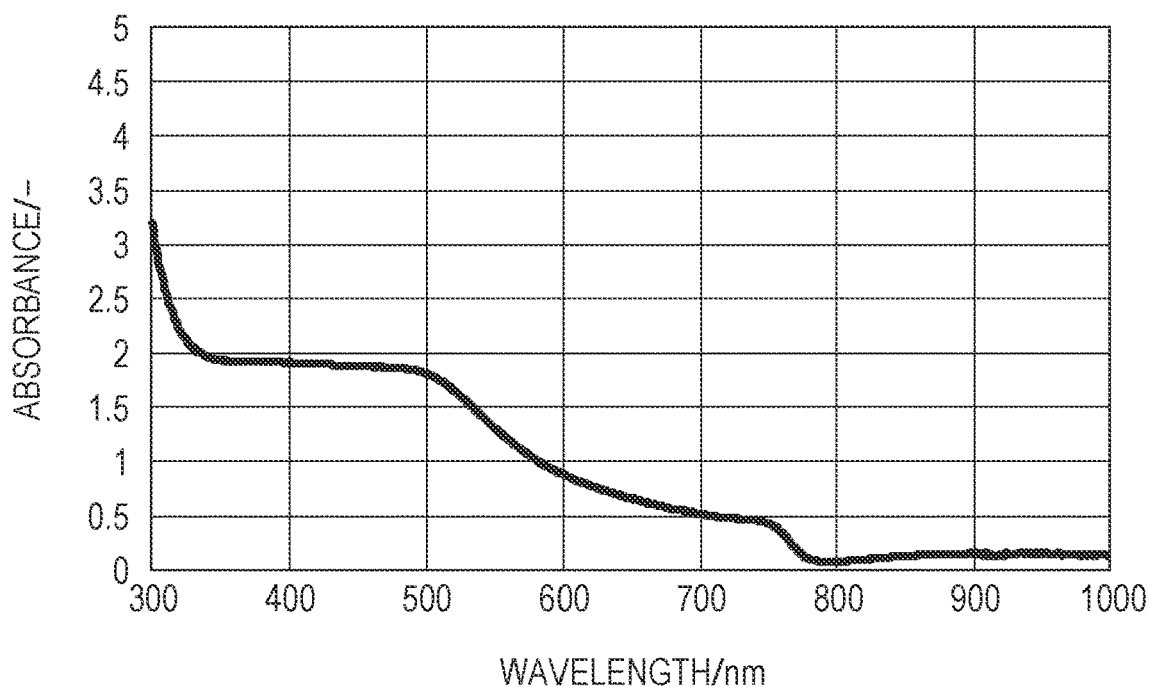
FIG. 7B depicts a spectrum of Example 1-1.

Wavelength α at Which Reflectance of Reflection Layer is Maximum in the Visible Region FIGS. 7A and 7B depict spectra of the element of Example 1-1. FIG. 7A is a reflection spectrum of the reflection layer, and FIG. 7B is an absorption spectrum of the photoelectric conversion layer. FIG. 7A shows that the wavelength α at which the reflectance of the reflection layer is maximum in the visible region (360 nm to 830 nm) is 656 nm. Also, FIG. 7B shows that the optical absorption coefficient of the photoelectric conversion layer in the visible region comes to a maximum value of 1.92 (A.U.) at 360 nm. The optical absorption coefficient at the wavelength α (656 nm) is 0.64 (A.U.). Thus, in the element of Example 1-1, the wavelength α was within the range in which the optical absorption coefficient of the photoelectric conversion layer is ⅓ or more of the maximum value in the visible region.

In the elements of other Examples, also, the wavelength α was within the range in which the optical absorption coefficient of the photoelectric conversion layer is ⅕ or more of the maximum value in the visible region.

In contrast, in the elements of the Comparative Examples, the wavelength α was outside the range in which the optical absorption coefficient of the photoelectric conversion layer is ⅕ or more of the maximum value in the visible region.

Power Generation Efficiency

A power supply (Model 236, manufactured by KEITHLEY Instruments) was connected between the electrodes of the photoelectric conversion element. The element was constantly irradiated with light from the glass substrate side using a solar simulation (manufactured by Yamashita Denso Corporation) at an intensity of 100 mW/cm², and the generated current and voltage were measured for evaluation of photoelectric conversion efficiency.

As presented above, the photoelectric conversion elements according to the present invention exhibited higher photoelectric conversion efficiency than those of Comparative Examples. Additionally, the elements of the Examples were not only excellent in photoelectric conversion efficiency but also vivid in color, as measured.

Second Embodiment

Preparation of Electrically Conductive Particles
Electrically Conductive Particle 1

Titanium oxide particles whose average major axis diameter a and average minor axis diameter b were both 50 nm were used as core particles. A titanium niobium sulfuric acid solution containing 33.7 g of titanium in terms of $TiO_2$ and

TABLE 23

| Example No. | Particle No. | Particle size | Resin | Particle/resin weight ratio | Photoelectric conversion layer coating material | L* | c* | h* | Conversion efficiency |
|---|---|---|---|---|---|---|---|---|---|
| Example 1-1 | Particle 6 | 200 | Phenol resin | 80/1 | Coating material 4 | 48 | 49 | 33 | 14.0 |
| Example 1-2 | Particle 6 | 200 | None | 100/0 | Coating material 4 | 44 | 47 | 31 | 10.5 |
| Example 1-3 | Particle 9 | 200 | None | 100/0 | Coating material 4 | 43 | 46 | 31 | 10.2 |
| Example 1-4 | Particle 1 | 50 | None | 100/0 | Coating material 4 | 20 | 33 | 18 | 9.8 |
| Example 1-5 | Particle 8 | 600 | None | 100/0 | Coating material 4 | 50 | 49 | 32 | 10.4 |
| Example 1-6 | Particle 2 | 70 | None | 100/0 | Coating material 4 | 33 | 30 | 28 | 10.1 |
| Example 1-7 | Particle 2 | 70 | None | 100/0 | Coating material 5 | 35 | 38 | 0 | 10.4 |
| Example 1-8 | Particle 2 | 70 | None | 100/0 | Coating material 2 | 80 | 40 | 90 | 10.2 |
| Example 1-9 | Particle 6 | 200 | None | 100/0 | Coating material 4 | 35 | 33 | 30 | 10.5 |
| Example 1-10 | Particle 6 | 200 | None | 100/0 | Coating material 4 | 30 | 31 | 29 | 10.9 |
| Example 1-11 | Particle 10 | 220 | None | 100/0 | Coating material 4 | 46 | 49 | 31 | 10.9 |
| Example 1-12 | Particle 11 | 230 | None | 100/0 | Coating material 4 | 42 | 38 | 30 | 10.8 |
| Example 1-13 | Particle 4 | 150 | None | 100/0 | Coating material 4 | 43 | 47 | 31 | 11.8 |
| Example 1-14 | Particle 6 | 200 | None | 100/0 | Coating material 5 | 30 | 51 | 0 | 11.1 |
| Example 1-15 | Particle 7 | 300 | None | 100/0 | Coating material 2 | 80 | 50 | 90 | 11.5 |
| Example 1-16 | Particle 3 | 120 | None | 100/0 | Coating material 4 | 40 | 42 | 35 | 12.3 |
| Example 1-17 | Particle 3 | 120 | None | 100/0 | Coating material 5 | 40 | 44 | 0 | 12.5 |
| Example 1-18 | Particle 4 | 150 | None | 100/0 | Coating material 3 | 60 | 42 | 50 | 12.8 |
| Example 1-19 | Particle 5 | 180 | None | 100/0 | Coating material 3 | 60 | 47 | 50 | 12.8 |
| Example 1-20 | Particle 6 | 200 | Phenol resin | 100/1 | Coating material 4 | 52 | 53 | 35 | 13.8 |
| Example 1-21 | Particle 6 | 200 | Phenol resin | 2/1 | Coating material 4 | 49 | 51 | 32 | 13.5 |
| Example 1-22 | Particle 6 | 200 | Polyamide | 100/1 | Coating material 4 | 48 | 50 | 34 | 13.5 |
| Example 1-23 | Particle 6 | 200 | Polyamide | 2/1 | Coating material 4 | 46 | 49 | 31 | 13.2 |
| Comparative Example 1-1 | Titanium oxide | 30 | Phenol resin | 80/1 | Coating material 4 | 45 | 41 | 30 | 4.8 |
| Comparative Example 1-2 | Titanium oxide | 30 | None | 100/0 | Coating material 4 | 40 | 38 | 28 | 3.9 |
| Comparative Example 1-3 | Titanium oxide | 30 | None | 100/0 | Coating material 2 | 65 | 46 | 62 | 4.1 |

2.9 g of niobium in terms of $Nb_2O_5$ was prepared. 100 g of core particles were dispersed in pure water to prepare 1 L of suspension, followed by heating to 60° C. The titanium niobium sulfuric acid solution and 10 mol/L sodium hydroxide were dropped over 3 hours so that the suspension had a pH of 2 to 3. After the entire volume was dropped, the pH was adjusted to near neutral, and a flocculant was added to allow the solids to settle. The supernatant was removed, and the rest was filtered. The residue was washed and dried at 110° C. to obtain an intermediate containing 0.1% by mass flocculant-derived organic substance in terms of C. The intermediate was fired at 800° C. for 1 hour in nitrogen gas to yield electrically conductive Particle 1.

Electrically Conductive Particles 2 to 6

Electrically conductive particles 2 to 6 presented in Table 24 were prepared in the same manner as in the preparation process of electrically conductive particle 1, except that the average major axis diameter a and average minor axis diameter b of the core particles were varied.

Electrically Conductive Particle 7

Electrically conductive particle 7 was prepared in the same manner as in the preparation process of electrically conductive particle 2, except that the coating conditions were changed so that both the average major axis diameter a and the average minor axis diameter b could be 250 nm.

Electrically Conductive Particle 8

Titanium oxide particles whose average major axis diameter a and average minor axis diameter b were both 200 nm were used as core particles. 200 g of core particles were dispersed in water to prepare 2 L of water suspension, followed by heating to 70° C. A tin-acid solution prepared by dissolving 226.2 g of stannic chloride ($SnCl_4 \cdot 5H_2O$) in 500 mL of 3 mol/L hydrochloric acid solution, and 5 mol/L sodium hydroxide solution were simultaneously dropped (parallelly added) into the suspension over 6 hours so that the suspension had a pH of 2 to 3. After the completion of dropping, the suspension was filtered, and the product was rinsed and dried at 110° C. for 8 hours. The dried product was heat-treated at 650° C. for 1 hour in a nitrogen gas stream (1 L/min) to yield electrically conductive particle 8.

Electrically Conductive Particle 9

Electrically conductive particle 9 presented in Table 24 was prepared in the same manner as in the preparation process of electrically conductive particle 8, except that orthophosphoric acid was added to the tin-acid solution so that the amount of the dopant could be 5.0% by mass in terms of $P_2O_5$.

Electrically Conductive Particle 10

Electrically conductive particle 10 presented in Table 24 was prepared in the same manner as in the preparation process of electrically conductive particle 8, except that tantalum (V) chloride was added to the tin-acid solution so that the amount of dopant could be 5.0% by mass in terms of $Ta_2O_5$.

Electrically Conductive Particle 11

Electrically conductive particle 11 presented in Table 24 was prepared in the same manner as in the preparation process of electrically conductive particle 8, except that niobium (V) chloride was added to the tin-acid solution so that the amount of dopant could be 5.0% by mass in terms of $Nb_2O_5$.

Electrically Conductive Particle 12

Electrically conductive particle 12 presented in Table 24 was prepared in the same manner as in the preparation process of electrically conductive particle 8, except that sodium tungstate dihydrate was added to the tin-acid solution so that the amount of dopant could be 5.0% by mass in terms of $WO_3$.

Electrically Conductive Particle 13

Electrically conductive particle 13 presented in Table 24 was prepared in the same manner as in the preparation process of electrically conductive particle 8, except that sodium fluoride was added to the tin-acid solution so that the amount of dopant could be 1.0% by mass in terms of F.

Electrically Conductive Particle 14

Titanium oxide particles whose average major axis diameter a and average minor axis diameter b were both 200 nm were used as core particles. 250 g of core particles were dispersed in water to prepare 2 L of water suspension, followed by heating to 50° C. A zinc chloride aqueous solution prepared by dissolving 161.5 g of zinc chloride ($ZnCl_2$) in 3 L of water and 5 mol/L sodium hydroxide solution were simultaneously dropped (parallelly added) into the suspension over 2 hours so that the suspension had a pH of 10. After the completion of dropping, the suspension was filtered, and the product was rinsed and dried at 110° C. for 12 hours. The dried product was heat-treated at 550° C. for 1 hour in a nitrogen gas stream (1 L/min) to yield electrically conductive particle 14.

Electrically Conductive Particle 15

Electrically conductive particle 15 presented in Table 24 was prepared in the same manner as in the preparation process of electrically conductive particle 14, except that aluminum (III) chloride was added to the tin-acid solution so that the amount of dopant could be 3.0% by mass in terms of $Al_2O_3$.

Electrically Conductive Particle 16

Electrically conductive particle 16 presented in Table 24 was prepared in the same manner as in the preparation process of electrically conductive particle 14, except that gallium (III) chloride was added to the tin-acid solution so that the amount of dopant could be 3.0% by mass in terms of $Ga_2O_3$.

Electrically Conductive Particle 17

Electrically conductive particle 17 presented in Table 24 was prepared in the same manner as in the preparation process of electrically conductive particle 8, except that barium sulfate particles whose average major axis diameter a and average minor axis diameter b were both 300 nm were used as core particles.

Electrically Conductive Particle 18

Electrically conductive particle 18 presented in Table 24 was prepared in the same manner as in the preparation process of electrically conductive particle 17, except that orthophosphoric acid was added to the tin-acid solution so that the amount of dopant could be 5.0% by mass in terms of $P_2O_5$.

Electrically Conductive Particle 19

Electrically conductive particle 19 presented in Table 24 was prepared in the same manner as in the preparation process of electrically conductive particle 1, except that strontium titanate particles whose average major axis diameter a and average minor axis diameter b were both 100 nm were used as core particles.

Electrically Conductive Particle 20

Electrically conductive particle 20 presented in Table 24 was prepared in the same manner as in the preparation process of electrically conductive particle 1, except that barium titanate particles whose average major axis diameter a and average minor axis diameter b were both 150 nm were used as core particles.

Electrically Conductive Particle 21

Strontium titanate particles whose average major axis diameter a and average minor axis diameter b were both 100 nm were used as core particles. To 7 g of the core particles were added 140 mg of methyl hydrogen polysiloxane while an edge runner was operating. The materials were mixed and stirred at a line load of 588 N/cm (60 kg/cm) for 30 minutes. The stirring speed at this time was 22 rpm. To the mixture was added 7 g of carbon black particles (volume average particle size: 20 nm, volume resistivity: $1.0 \times 10^2$ Ω·cm, pH 8.0) while an edge runner was operating. The materials were further mixed and stirred at a line load of 588 N/cm (60 kg/cm) for 60 minutes. Carbon black was thus attached to the surfaces of methyl hydrogen polysiloxane-coated strontium titanate particles. Then, the resulting particles were dried at 80° C. for 60 minutes with a dryer, thus preparing electrically conductive particle 21 presented in Table 24.

Electrically Conductive Particles 22 and 23

Strontium titanate particles whose average major axis diameter a and average minor axis diameter b were both 100 nm were used as core particles. A 10 nm-thick copper coating film was formed over the surfaces of the strontium titanate particles by electroless plating, thus preparing electrically conductive particle 22 presented in Table 24. Similarly, a 10 nm-thick silver coating film was formed by electroless plating to yield electrically conductive particle 23 presented in Table 24.

Electrically Conductive Particle 24

Electrically conductive particle 24 presented in Table 24 was prepared in the same manner as in the preparation process of electrically conductive particle 8, except that silica particles whose average major axis diameter a and average minor axis diameter b were both 150 nm were used as core particles.

Electrically Conductive Particle 25

Electrically conductive particle 25 presented in Table 24 was prepared in the same manner as in the preparation process of electrically conductive particle 8, except that alumina particles whose average major axis diameter a and average minor axis diameter b were both 250 nm were used as core particles.

Electrically Conductive Particle 26

Electrically conductive particle 26 presented in Table 24 was prepared in the same manner as in the preparation process of electrically conductive particle 21, except that silica particles whose average major axis diameter a and average minor axis diameter b were both 150 nm were used as core particles.

Electrically Conductive Particles 27 to 29

Tin oxide particles whose average major axis diameter a and average minor axis diameter b were both 200 nm, zinc oxide particles whose average major axis diameter a and average minor axis diameter b were both 150 nm, and carbon black particles with a volume average particle size of 20 nm were prepared as electrically conductive particles for Comparative Examples, as presented in Table 24.

TABLE 24

| | | Coating layer | | | | | |
|---|---|---|---|---|---|---|---|
| No. | Core particle | Material | Doped amount [% by mass] | Thickness [nm] | a [nm] | b [nm] | a/b |
| 1 | Titanium oxide | Nb-doped titanium oxide | 7.0 | 5.0 | 60 | 60 | 1.0 |
| 2 | Titanium oxide | Nb-doped titanium oxide | 7.0 | 5.0 | 220 | 220 | 1.0 |
| 3 | Titanium oxide | Nb-doped titanium oxide | 7.0 | 5.0 | 530 | 530 | 1.0 |
| 4 | Titanium oxide | Nb-doped titanium oxide | 7.0 | 5.0 | 110 | 90 | 1.2 |
| 5 | Titanium oxide | Nb-doped titanium oxide | 7.0 | 5.0 | 320 | 120 | 2.7 |
| 6 | Titanium oxide | Nb-doped titanium oxide | 7.0 | 5.0 | 420 | 120 | 3.5 |
| 7 | Titanium oxide | Nb-doped titanium oxide | 7.0 | 20.0 | 250 | 250 | 1.0 |
| 8 | Titanium oxide | Tin oxide | — | 10.0 | 220 | 220 | 1.0 |
| 9 | Titanium oxide | P-doped tin oxide | 5.0 | 10.0 | 220 | 220 | 1.0 |
| 10 | Titanium oxide | Ta-doped tin oxide | 5.0 | 10.0 | 220 | 220 | 1.0 |
| 11 | Titanium oxide | Nb-doped tin oxide | 5.0 | 10.0 | 220 | 220 | 1.0 |
| 12 | Titanium oxide | W-doped tin oxide | 5.0 | 10.0 | 220 | 220 | 1.0 |
| 13 | Titanium oxide | F-doped tin oxide | 1.0 | 10.0 | 220 | 220 | 1.0 |
| 14 | Titanium oxide | Zinc oxide | — | 10.0 | 220 | 220 | 1.0 |
| 15 | Titanium oxide | Al-doped zinc oxide | 3.0 | 10.0 | 220 | 220 | 1.0 |
| 16 | Titanium oxide | Ga-doped zinc oxide | 3.0 | 10.0 | 220 | 220 | 1.0 |
| 17 | Barium sulfate | Tin oxide | — | 10.0 | 320 | 320 | 1.0 |
| 18 | Barium sulfate | P-doped tin oxide | 5.0 | 10.0 | 320 | 320 | 1.0 |
| 19 | Strontium titanate | Nb-doped titanium oxide | 7.0 | 10.0 | 120 | 120 | 1.0 |
| 20 | Barium titanate | Nb-doped titanium oxide | 7.0 | 10.0 | 170 | 170 | 1.0 |
| 21 | Strontium titanate | Carbon black | — | 5.0 | 110 | 110 | 1.0 |
| 22 | Strontium titanate | Ag | — | 10.0 | 120 | 120 | 1.0 |
| 23 | Strontium titanate | Cu | — | 10.0 | 120 | 120 | 1.0 |
| 24 | Silica | Tin oxide | — | 10.0 | 170 | 170 | 1.0 |
| 25 | Aluminum oxide | Tin oxide | — | 10.0 | 270 | 270 | 1.0 |
| 26 | Silica | Carbon black | — | 5.0 | 160 | 160 | 1.0 |
| 27 | Tin oxide | — | — | — | 200 | 200 | 1.0 |
| 28 | Zinc oxide | — | — | — | 150 | 150 | 1.0 |
| 29 | Carbon black | — | — | — | 20 | 20 | 1.0 |

Example 2-1

Spiro-OMeTAD (180 mg) as the hole-transporting material was dissolved in chlorobenzene (1 mL). t-Butylpyridine (TBP, 17.5 μL) and an acetonitrile solution (37.5 μL) prepared by dissolving lithium bis(trifluoromethanesulfonyl) imide (170 mg) in acetonitrile (1 mL) were added into the chlorobenzene solution to prepare a hole-transporting material solution. The hole-transporting material solution was applied onto an ITO glass substrate by spin coating in a $N_2$ atmosphere and fired at 100° C. for 10 minutes to form a 300 nm-thick hole transport layer.

Subsequently, 4 parts of lead iodide and 1.4 parts of methylammonium iodide were dissolved in 4.5 parts of dimethylformamide as a solvent, and the solution was stirred at 60° C. for 24 hours to prepare the coating liquid for the active layer. A film of this coating liquid was formed on the hole transport layer by spin coating and fired at 100° C. for 10 minutes to form a 300 nm-thick active layer.

In 1500 parts of 1-methoxy-2-propanol as a solvent, 5 parts of a phenol resin (phenol resin monomer/oligomer) (trade name "Plyophen J-325", produced by DIC Corporation, resin solids: 60% by mass, density after being cured: 1.3 $g/cm^2$) was dissolved as a binder. Into the resulting solution, 30 parts of electrically conductive particle 1 was added, and the particle was dispersed in the solution for 4 hours at a dispersion liquid temperature of 23° C.±3° C. in a vertical sand mill using 1500 parts of glass beads of 1.0 mm in average diameter as a dispersion medium at a rotational speed of 1500 rpm (peripheral speed of 5.5 m/s). The glass beads were removed from the resulting dispersion liquid with a mesh to yield a coating liquid for the electrically conductive layer.

Subsequently, the coating liquid for the electrically conductive layer was applied onto the active layer by spin coating. After the application, the coating film was fired at 150° C. for 10 minutes to form a 500 nm-thick electrically conductive layer.

Then, a gold electrode with a thickness of 80 nm and an area of 0.09 $cm^2$ was formed on the electrically conductive layer by vacuum deposition to complete a photoelectric conversion element.

A power supply (Model 236, manufactured by KEITHLEY Instruments) was connected between the electrodes of the photoelectric conversion element. The element was constantly irradiated with light using a solar simulation (manufactured by Yamashita Denso Corporation) at an intensity of 100 $mW/cm^2$, and the generated current and voltage were measured for evaluation of photoelectric conversion efficiency. The results of short-circuit current density and photoelectric conversion efficiency are presented in Table 25.

Examples 2-2 to 2-26

Photoelectric conversion elements were produced in the same manner as in Example 2-1, except that the electrically conductive particle used for preparing the coating liquid for the electrically conductive layer was respectively replaced with electrically conductive particles 2 to 26 presented in Table 24, and their photoelectric conversion efficiencies were evaluated. The results of short-circuit current density and photoelectric conversion efficiency are presented in Table 25.

Example 2-27

The coating liquid for the electrically conductive layer was prepared as described below.

In a mixed solvent of 400 parts of methyl ethyl ketone and 700 parts of 1-butanol, 1 part of a butyral resin (trade name: BM-1, produced by Sekisui Chemical Co., Ltd.) as polyol resin and 1 part of a blocked isocyanate resin (trade name: TPA-B80E, 80% solution, produced by Asahi Kasei Corp.) were dissolved to prepare a solution. A coating liquid for the electrically conductive layer was prepared by adding 20 parts of electrically conductive particle 2 presented in Table 24 to the resulting solution, and dispersing the particles in the solution for 4 hours in a vertical sand mill using 1100 parts of glass beads of 1.0 mm in average diameter as a dispersion medium at a rotational speed of 1500 rpm (peripheral speed of 5.5 m/s) in an atmosphere of 25° C.±3° C.

A photoelectric conversion element was produced in the same manner as in Example 2-1, except for using the above-prepared coating liquid for the electrically conductive layer, and the photoelectric conversion efficiency was evaluated. The results of short-circuit current density and photoelectric conversion efficiency are presented in Table 25.

Example 2-28

A photoelectric conversion element was produced in the same manner as in Example 2-27, except that the electrically conductive particle used for preparing the coating liquid for the electrically conductive layer was replaced with electrically conductive particle 9 presented in Table 24, and the photoelectric conversion efficiency was evaluated. The results of short-circuit current density and photoelectric conversion efficiency are presented in Table 25.

Example 2-29

A photoelectric conversion element was produced in the same manner as in Example 2-1, except that no phenol resin was used for preparing the coating liquid for the electrically conductive layer and that electrically conductive particle 2 presented in Table 24 was used as the electrically conductive particle, and the photoelectric conversion efficiency was evaluated. The results of short-circuit current density and photoelectric conversion efficiency are presented in Table 25.

Comparative Examples 2-1 to 2-3

Photoelectric conversion elements were produced in the same manner as in Example 2-1, except that the electrically conductive particle used for preparing the coating liquid for the electrically conductive layer was replaced with any one of electrically conductive particles 27 to 29 presented in Table 24, and their photoelectric conversion efficiencies were evaluated. The results of short-circuit current density and photoelectric conversion efficiency are presented in Table 25.

In the elements of Comparative Examples 2-1 and 2-2, the wavelength α at which the reflectance of the reflection layer is maximum in the visible region was outside the range in which the optical absorption coefficient of the photoelectric conversion layer is ⅕ or more of the maximum value in the visible region.

TABLE 25

| | No. | Electrically conductive particles | | Photoelectric conversion efficiency [%] | Short-circuit current density [mA/cm$^2$] |
|---|---|---|---|---|---|
| | | Core particle | Coating layer | | |
| Example 2-1 | 1 | Titanium oxide | Nb-doped titanium oxide | 13.5 | 25.2 |
| Example 2-2 | 2 | Titanium oxide | Nb-doped titanium oxide | 13.6 | 24.7 |
| Example 2-3 | 3 | Titanium oxide | Nb-doped titanium oxide | 12.5 | 23.2 |
| Example 2-4 | 4 | Titanium oxide | Nb-doped titanium oxide | 12.2 | 24.2 |
| Example 2-5 | 5 | Titanium oxide | Nb-doped titanium oxide | 12.0 | 23.0 |
| Example 2-6 | 6 | Titanium oxide | Nb-doped titanium oxide | 10.1 | 19.0 |
| Example 2-7 | 7 | Titanium oxide | Nb-doped titanium oxide | 14.3 | 25.7 |
| Example 2-8 | 8 | Titanium oxide | Tin oxide | 11.5 | 20.1 |
| Example 2-9 | 9 | Titanium oxide | P-doped tin oxide | 13.5 | 24.5 |
| Example 2-10 | 10 | Titanium oxide | Ta-doped tin oxide | 12.9 | 22.5 |
| Example 2-11 | 11 | Titanium oxide | Nb-doped tin oxide | 12.8 | 23.6 |
| Example 2-12 | 12 | Titanium oxide | W-doped tin oxide | 13.2 | 22.9 |
| Example 2-13 | 13 | Titanium oxide | F-doped tin oxide | 12.5 | 21.8 |
| Example 2-14 | 14 | Titanium oxide | Zinc oxide | 11.3 | 19.3 |
| Example 2-15 | 15 | Titanium oxide | Al-doped zinc oxide | 12.2 | 20.9 |
| Example 2-16 | 16 | Titanium oxide | Ga-doped zinc oxide | 12.5 | 22.0 |
| Example 2-17 | 17 | Barium sulfate | Tin oxide | 12.2 | 21.4 |
| Example 2-18 | 18 | Barium sulfate | P-doped tin oxide | 14.5 | 25.6 |
| Example 2-19 | 19 | Strontium titanate | Nb-doped titanium oxide | 13.2 | 23.5 |
| Example 2-20 | 20 | Barium titanate | Nb-doped titanium oxide | 13.5 | 23.7 |
| Example 2-21 | 21 | Strontium titanate | Carbon black | 10.6 | 17.8 |
| Example 2-22 | 22 | Strontium titanate | Ag | 9.4 | 16.5 |
| Example 2-23 | 23 | Strontium titanate | Cu | 8.9 | 16.0 |
| Example 2-24 | 24 | Silica | Tin oxide | 9.9 | 15.3 |
| Example 2-25 | 25 | Aluminum oxide | Tin oxide | 10.2 | 17.0 |
| Example 2-26 | 26 | Silica | Carbon black | 8.0 | 14.8 |
| Example 2-27 | 2 | Titanium oxide | Nb-doped titanium oxide | 13.6 | 24.2 |
| Example 2-28 | 9 | Titanium oxide | P-doped tin oxide | 14.0 | 25.1 |
| Example 2-29 | 2 | Titanium oxide | Nb-doped titanium oxide | 13.6 | 23.5 |
| Comparative Example 2-1 | 27 | Tin oxide | None | 5.2 | 10.0 |
| Comparative Example 2-2 | 28 | Zinc oxide | None | 4.0 | 9.5 |
| Comparative Example 2-3 | 29 | Carbon black | None | 4.2 | 11.1 |

Third Embodiment

Example 3-1

In a mixed solvent of 50 parts of methyl ethyl ketone and 50 parts of dimethylacetamide, 3.27 parts of example compound (E-1-1) as the electron-transporting compound, 6.2 parts of example compound (I-8) as the isocyanate compound, and 1.29 parts of a butyral resin (trade name: BM-1, produced by Sekisui Chemical Co., Ltd.) as the resin were dissolved. Into the resulting solution, 0.031 part of dioctyltin dilaurate was added as a catalyst to prepare a coating liquid for the foundation layer, which was the second layer 214. This coating liquid was applied onto an FTO glass substrate, which was the substrate 216 provided with a cathode 215, by spin coating. After the application, the coating film was heated at 160° C. for 30 minutes for polymerization (curing), thus forming a 500 nm-thick foundation layer.

Then, a 1 M solution was prepared by dissolving lead iodide as a metal halide compound in N,N-dimethylformamide (DMF). A coating film of this solution was formed on the foundation layer by spin coating. Furthermore, a 1 M solution was prepared by dissolving methylammonium iodide as an amine compound in 2-propanol. The sample of the lead iodide coating film was immersed in this solution and was then fired at 100° C. for 10 minutes in the air, thus forming a 500 nm-thick perovskite layer as the first layer 213.

Then, Spiro-OMeTAD (180 mg) as the hole-transporting material was dissolved in chlorobenzene (1 mL). t-Butylpyridine (TBP, 17.5 µL) and an acetonitrile solution (37.5 µL) prepared by dissolving lithium bis(trifluoromethanesulfonyl)imide (170 mg) in acetonitrile (1 mL) were added into the chlorobenzene solution to prepare a hole-transporting material solution. The resulting solution was applied onto the perovskite layer by spin coating. After the application, the coating film was fired at 100° C. for 10 minutes, thus forming a 300 nm-thick hole transport layer as the third layer 212.

Then, an 80 nm-thick gold electrode as the anode 211 was formed on the hole transport layer by vacuum deposition to complete a photoelectric conversion element.

Examination

Foundation Layer Structure

The structure of the foundation layer was analyzed as described below. The photoelectric conversion element to be used for analyzing the foundation layer structure was immersed in chlorobenzene solvent for 5 minutes, and ultrasonic waves were applied to the element to peel the hole transport layer. Then, the perovskite layer was polished with lapping tape (C2000, manufactured by FUJIFILM Corporation) and dried at 100° C. for 10 minutes. The resulting structure was used as the photoelectric conversion element for analyzing the foundation layer structure. For this photoelectric conversion element, it was confirmed by an FTIR-ATR method that no constituents of the hole transport and perovskite layers remain on the foundation layer. A 5 mm square was cut out from the center of the photoelectric conversion element and used as a sample for analyzing the foundation layer structure. The number of atoms in the main chain of the structure represented by formula (U1) (specific examples in Tables 1 to 11) and the number of atoms of the $D^1$ structure were identified by the above-mentioned solid-state $^{13}$C-NMR, mass spectrometry, MS spectrometry with pyrolysis GC analysis, and characteristic absorption measurements by infrared spectrometry and presented in Table 26.

Power Generation Efficiency

A power supply (Model 236, manufactured by KEITHLEY Instruments) was connected between the electrodes of the photoelectric conversion element. The element was constantly irradiated with light using a solar simulation (manufactured by Yamashita Denso Corporation) at an intensity of 100 mW/cm², and the generated current and voltage were measured for evaluation of photoelectric conversion efficiency. The results of short-circuit current density and photoelectric conversion efficiency are presented in Table 26.

Examples 3-2 to 3-73

Photoelectric conversion elements were produced in the same manner as in Example 3-1, except that the electron-transporting compound and the isocyanate compound in the coating liquid for the foundation layer used in Example 3-1 were replaced with those presented in Tables 26 and 27.

Comparative Examples 3-1 to 3-3

Photoelectric conversion elements were produced in the same manner as in Example 3-1, except that the coating liquid for the foundation layer used in Example 3-1 was replaced with a coating liquid as presented in Table 28, which contained only the electron-transporting compound without using isocyanate compounds or resin.

Comparative Example 3-4

A photoelectric conversion element was produced in the same manner as in Example 3-1, except that the coating liquid for the foundation layer used in Example 3-1 was replaced with a coating liquid as presented in Table 28, which contained the isocyanate compound and the resin without using the electron-transporting compound.

TABLE 26

| Example | Specific Example of Tables 1-11 | Electron-transporting compound Kind | Part(s) by mass | Isocyanate compound Kind | Part(s) by mass | Resin Part(s) by mass | Number of atoms in $D^1$ mainchain | Photoelectric conversion efficiency [%] | Short-circuit current density [mA/cm²] |
|---|---|---|---|---|---|---|---|---|---|
| 3-1 | 101 | E-1-14 | 3.27 | I-8 | 6.20 | 1.29 | 11 | 9.3 | 18.3 |
| 3-2 | 101 | E-1-14 | 2.44 | I-8 | 6.43 | 2.02 | 11 | 8.4 | 16.4 |
| 3-3 | 101 | E-1-14 | 4.14 | I-8 | 6.05 | 0.56 | 11 | 11.4 | 23.1 |
| 3-4 | 101 | E-1-14 | 5.38 | I-8 | 4.21 | 1.11 | 11 | 13.2 | 25.3 |
| 3-5 | 101 | E-1-14 | 3.48 | I-8 | 4.52 | 2.78 | 11 | 9.4 | 19.1 |
| 3-6 | 101 | E-1-14 | 3.35 | I-8 | 5.52 | 1.9 | 11 | 9.2 | 18.8 |
| 3-7 | 101 | E-1-14 | 3.23 | I-8 | 6.74 | 0.85 | 11 | 9.1 | 18.7 |
| 3-8 | 101 | E-1-14 | 3.27 | I-9 | 7.98 | 1.29 | 11 | 9.5 | 18.5 |
| 3-9 | 101 | E-1-14 | 3.27 | I-10 | 6.42 | 1.29 | 11 | 9.1 | 18.6 |
| 3-10 | 101 | E-1-14 | 3.27 | I-11 | 5.77 | 1.29 | 11 | 9.6 | 18.4 |
| 3-11 | 101 | E-1-14 | 3.27 | I-8 | 6.20 | 1.29 | 11 | 9.2 | 18.5 |
| 3-12 | 101 | E-1-14 | 3.27 | I-8 | 6.20 | 1.29 | 11 | 9.1 | 18.5 |
| 3-13 | 101 | E-1-14 | 3.27 | I-8 | 6.20 | 1.29 | 11 | 9.1 | 18.6 |
| 3-14 | 119 | E-1-47 | 3.98 | I-8 | 6.20 | 1.29 | 14 | 9.8 | 19.5 |
| 3-15 | 105 | E-1-14 | 3.60 | I-8 | 6.20 | 1.29 | 11 | 9.5 | 19.3 |
| 3-16 | 115 | E-1-42 | 3.60 | I-1 | 2.38 | 1.29 | 6 | 9.4 | 19.2 |
| 3-17 | 105 | E-1-14 | 3.60 | I-2 | 4.09 | 1.29 | 11 | 9.5 | 19.3 |
| 3-18 | 105 | E-1-14 | 3.60 | I-8 | 6.84 | 1.29 | 11 | 9.6 | 19.3 |
| 3-19 | 105 | E-1-14 | 3.60 | I-9 | 7.98 | 1.29 | 11 | 9.5 | 19.3 |
| 3-20 | 105 | E-1-14 | 3.60 | I-10 | 6.42 | 1.29 | 11 | 9.4 | 19.2 |
| 3-21 | 105 | E-1-14 | 3.60 | I-11 | 5.77 | 1.29 | 11 | 9.6 | 19.2 |
| 3-22 | 105 | E-1-14 | 3.60 | I-12 | 6.54 | 1.29 | 11 | 9.5 | 19.3 |
| 3-23 | 106 | E-1-43 | 3.74 | I-8 | 6.20 | 1.29 | 11 | 9.7 | 19.6 |
| 3-24 | 106 | E-1-43 | 2.79 | I-8 | 6.43 | 2.02 | 11 | 8.8 | 16.7 |
| 3-25 | 106 | E-1-43 | 4.73 | I-8 | 6.05 | 0.56 | 11 | 11.6 | 23.7 |
| 3-26 | 106 | E-1-43 | 6.15 | I-8 | 4.21 | 1.11 | 11 | 13.9 | 25.8 |
| 3-27 | 106 | E-1-43 | 3.97 | I-8 | 4.52 | 2.78 | 11 | 9.8 | 19.6 |
| 3-28 | 106 | E-1-43 | 3.83 | I-8 | 5.52 | 1.9 | 11 | 9.7 | 19.4 |
| 3-29 | 106 | E-1-43 | 3.69 | I-8 | 6.74 | 0.85 | 11 | 9.6 | 19.2 |
| 3-30 | 116 | E-1-17 | 3.27 | I-8 | 6.20 | 1.29 | 5 | 9.3 | 18.6 |
| 3-31 | 117 | E-1-45 | 3.98 | I-8 | 6.20 | 1.29 | 14 | 9.8 | 19.6 |
| 3-32 | 113 | E-1-38 | 3.99 | I-8 | 6.20 | 1.29 | 15 | 9.9 | 19.6 |
| 3-33 | 121 | E-1-47 | 3.23 | I-8 | 7.66 | 0.028 | 11 | 9.3 | 18.6 |
| 3-34 | 122 | E-1-48 | 3.08 | I-8 | 7.66 | 0.028 | 11 | 9.1 | 18.1 |
| 3-35 | 205 | E-2-4 | 3.43 | I-8 | 6.20 | 1.29 | 15 | 9.8 | 18.6 |
| 3-36 | 205 | E-2-4 | 2.56 | I-8 | 6.43 | 2.02 | 15 | 8.6 | 16.5 |
| 3-37 | 205 | E-2-4 | 4.34 | I-8 | 6.05 | 0.56 | 15 | 11.3 | 23.3 |
| 3-38 | 205 | E-2-4 | 5.64 | I-8 | 4.21 | 1.11 | 15 | 13.6 | 25.6 |
| 3-39 | 205 | E-2-4 | 3.65 | I-8 | 4.52 | 2.78 | 15 | 9.4 | 19.4 |
| 3-40 | 205 | E-2-4 | 3.52 | I-8 | 5.52 | 1.9 | 15 | 9.3 | 19.2 |

TABLE 27

| Example | Specific Example of Tables 1-11 | Electron-transporting compound Kind | Electron-transporting compound Part(s) by mass | Isocyanate compound Kind | Isocyanate compound Part(s) by mass | Resin Part(s) by mass | Number of atoms in $D^1$ mainchain | Photoelectric conversion efficiency [%] | Short-circuit current density [mA/cm$^2$] |
|---|---|---|---|---|---|---|---|---|---|
| 3-41 | 205 | E-2-4 | 3.39 | I-8 | 6.74 | 0.85 | 15 | 9.2 | 18.8 |
| 3-42 | 207 | E-2-4 | 3.31 | I-8 | 6.20 | 1.29 | 15 | 9.2 | 18.7 |
| 3-43 | 301 | E-3-1 | 2.48 | I-8 | 6.43 | 2.02 | 13 | 8.4 | 16.4 |
| 3-44 | 132 | E-1-47 | 3.71 | I-8 | 6.20 | 1.29 | 14 | 9.5 | 19.2 |
| 3-45 | 133 | E-1-33 | 4.23 | I-8 | 6.20 | 1.29 | 11 | 11.0 | 23.2 |
| 3-46 | 205 | E-2-4 | 2.65 | I-8 | 6.20 | 1.29 | 14 | 8.6 | 16.6 |
| 3-47 | 207 | E-2-4 | 3.31 | I-8 | 6.20 | 1.29 | 13 | 9.3 | 18.6 |
| 3-48 | 2001 | E-1-54 | 2.86 | I-10 | 4.28 | 1.55 | 11 | 8.8 | 17.1 |
| 3-49 | 2001 | E-1-54 | 2.17 | I-10 | 4.10 | 2.43 | 11 | 8.1 | 16.2 |
| 3-50 | 2001 | E-1-54 | 3.54 | I-10 | 4.47 | 0.68 | 11 | 9.5 | 19.2 |
| 3-51 | 2001 | E-1-54 | 3.88 | I-10 | 4.56 | 0.26 | 11 | 9.7 | 19.5 |
| 3-52 | 2001 | E-1-54 | 3.64 | I-10 | 3.96 | 1.15 | 11 | 9.6 | 19.2 |
| 3-53 | 2001 | E-1-54 | 3.46 | I-10 | 4.94 | 0.30 | 11 | 9.4 | 19.1 |
| 3-54 | 2001 | E-1-54 | 3.42 | I-10 | 5.14 | 0.13 | 11 | 9.4 | 18.8 |
| 3-55 | 2002 | E-1-54 | 2.86 | I-10 | 4.27 | 1.56 | 14 | 8.7 | 17.1 |
| 3-56 | 2002 | E-1-54 | 2.17 | I-10 | 4.08 | 2.44 | 14 | 8.1 | 16.1 |
| 3-57 | 2002 | E-1-54 | 3.55 | I-10 | 4.45 | 0.7 | 14 | 9.5 | 19.2 |
| 3-58 | 2002 | E-1-54 | 3.88 | I-10 | 4.54 | 0.27 | 14 | 9.7 | 19.4 |
| 3-59 | 2002 | E-1-54 | 3.65 | I-10 | 3.90 | 1.15 | 14 | 9.6 | 19.3 |
| 3-60 | 2002 | E-1-54 | 3.46 | I-10 | 4.92 | 0.32 | 14 | 9.4 | 19.1 |
| 3-61 | 2002 | E-1-54 | 3.43 | I-10 | 5.12 | 0.15 | 14 | 9.4 | 19.1 |
| 3-62 | 2003 | E-1-54 | 2.85 | I-10 | 4.34 | 1.5 | 14 | 8.7 | 17.1 |
| 3-63 | 2003 | E-1-54 | 2.16 | I-10 | 4.14 | 2.4 | 14 | 8.2 | 16.1 |
| 3-64 | 2003 | E-1-54 | 3.53 | I-10 | 4.53 | 0.63 | 14 | 9.5 | 19.1 |
| 3-65 | 2003 | E-1-54 | 3.87 | I-10 | 4.63 | 0.2 | 14 | 9.8 | 19.4 |
| 3-66 | 2003 | E-1-54 | 3.63 | I-10 | 3.97 | 1.09 | 14 | 9.6 | 19.3 |
| 3-67 | 2003 | E-1-54 | 3.45 | I-10 | 5.01 | 0.24 | 14 | 9.4 | 18.7 |
| 3-68 | 2003 | E-1-54 | 3.41 | I-10 | 5.22 | 0.07 | 14 | 9.4 | 18.8 |
| 3-69 | 2001 | E-1-54 | 3.54 | I-10 | 4.47 | 0.68 | 11 | 9.5 | 18.9 |
| 3-70 | 2001 | E-1-54 | 3.54 | I-10 | 4.47 | 0.68 | 11 | 9.5 | 19.0 |
| 3-71 | 2001 | E-1-54 | 3.54 | I-10 | 4.47 | 0.68 | 11 | 9.5 | 18.9 |
| 3-72 | 2001 | E-1-54 | 3.54 | I-10 | 4.47 | 0.68 | 11 | 9.5 | 19.0 |
| 3-73 | 2001 | E-1-54 | 3.54 | I-10 | 4.47 | 0.68 | 11 | 9.5 | 19.0 |

TABLE 28

| Comparative Example | Specific Example of Tables 1-11 | Electron-transporting compound Kind | Electron-transporting compound Part(s) by mass | Isocyanate compound Kind | Isocyanate compound Part(s) by mass | Resin Part(s) by mass | Photoelectric conversion efficiency [%] | Short-circuit current density [mA/cm$^2$] |
|---|---|---|---|---|---|---|---|---|
| 3-1 | 101 | E-1-14 | 10.00 | None | None | None | Unmeasurable | Unmeasurable |
| 3-2 | 205 | E-2-4 | 10.00 | None | None | None | Unmeasurable | Unmeasurable |
| 3-3 | 301 | E-3-1 | 10.00 | None | None | None | Unmeasurable | Unmeasurable |
| 3-4 | 101 | None | None | I-8 | 5.00 | 5 | Unmeasurable | Unmeasurable |

In Tables 26 to 28, the part(s) by mass of the electron-transporting compound represents the amount (part(s) by mass) of the electron-transporting compound in the coating liquid for the foundation layer. The part(s) by mass of the isocyanate compound represents the amount (part(s) by mass) of the isocyanate compound in the coating liquid for the foundation layer. The part(s) by mass of the resin represents the amount (part(s) by mass) of the resin in the coating liquid for the foundation layer.

In the comparison between the Examples and the Comparative Examples, the foundation layers formed of only an electron-transporting compound caused elusion when the perovskite layer was formed, as shown in Comparative Examples 3-1 to 3-3, and significantly deteriorated in film properties. This is probably the reason why the properties as the photoelectric conversion element of such samples were not measured. Comparative Example 3-4 probably does not allow electrons to be transferred from the perovskite layer because of the absence of the electron-transporting compound.

Example 3-74

The coating liquid for the foundation layer was prepared by dissolving 5 parts of an electron-transporting compound (E-1-8), 3.5 parts of a melamine compound (C1-3), 3.4 parts of resin 1, and 0.1 part of dodecylbenzenesulfonic acid as a catalyst in a mixed solvent of 100 parts of dimethylacetamide and 100 parts of methyl ethyl ketone. This coating liquid was applied onto an FTO glass substrate by spin coating. After the application, the coating film was heated at 160° C. for 30 minutes for polymerization (curing), thus forming a 500 nm-thick foundation layer. The following operation was conducted in the same manner as in Example 3-1 to produce a photoelectric conversion element.

Examples 3-75 to 3-141

Photoelectric conversion elements were produced in the same manner as in Example 3-74, except that the electron-transporting compound and the melamine or guanamine compound used in the coating liquid for the foundation layer of Example 3-74 were replaced as presented in Tables 29 and 30.

Comparative Examples 3-5 to 3-7

Photoelectric conversion elements were produced in the same manner as in Example 3-74, except that the coating liquid for the foundation layer used in Example 3-74 was replaced with a coating liquid as presented in Table 31, which contained only the electron-transporting compound without using melamine compounds, guanamine compounds, or resins.

Comparative Example 3-8

A photoelectric conversion element was produced in the same manner as in Example 3-74, except that the coating liquid for the foundation layer used in Example 3-74 was replaced with a coating liquid as presented in Table 31, which contained a melamine or guanamine compound and a resin but no electron-transporting compound.

TABLE 29

| Example | Specific Example of Tables 1-5 and 12-19 | Electron transporting compound Kind | Part(s) by mass | Melamine compound, Guanamine compound Kind | Part(s) by mass | Resin Kind | Part(s) by mass | Photoelectric conversion efficiency [%] | Short-circuit current density [mA/cm$^2$] |
|---|---|---|---|---|---|---|---|---|---|
| 3-74 | 101 | E-1-8 | 5 | C1-3 | 3.5 | Resin 1 | 3.4 | 9.3 | 18.3 |
| 3-75 | 101 | E-1-8 | 6 | C1-3 | 3.5 | Resin 1 | 3.4 | 10.4 | 21.8 |
| 3-76 | 101 | E-1-8 | 7 | C1-3 | 3.5 | Resin 1 | 3.4 | 11.4 | 23.1 |
| 3-77 | 101 | E-1-8 | 4 | C1-3 | 3.5 | Resin 1 | 3.4 | 8.4 | 16.4 |
| 3-78 | 101 | E-1-8 | 8 | C1-3 | 3.5 | Resin 1 | 3.0 | 13.2 | 25.3 |
| 3-79 | 101 | E-1-8 | 5 | C1-2 | 2.5 | Resin 1 | 3.4 | 9.2 | 18.8 |
| 3-80 | 101 | E-1-8 | 5 | C1-11 | 3.3 | Resin 1 | 3.4 | 9.1 | 18.7 |
| 3-81 | 101 | E-1-8 | 5 | C1-10 | 3.5 | Resin 2 | 3.4 | 9.5 | 18.5 |
| 3-82 | 101 | E-1-8 | 5 | C1-12 | 3.5 | Resin 3 | 3.4 | 9.1 | 18.6 |
| 3-83 | 102 | E-1-8 | 5 | C1-6 | 3.2 | Resin 19 | 3.4 | 9.6 | 18.4 |
| 3-84 | 103 | E-1-8 | 5 | C1-5 | 2.5 | Resin 20 | 3.4 | 9.2 | 18.5 |
| 3-85 | 103 | E-1-8 | 5 | C1-2 | 2.5 | Resin 20 | 3.4 | 9.1 | 18.5 |
| 3-86 | 103 | E-1-8 | 5 | C1-7 | 3.5 | Resin 21 | 3.0 | 9.1 | 18.6 |
| 3-87 | 103 | E-1-8 | 5 | C1-8 | 3.5 | Resin 21 | 3.0 | 9.8 | 19.5 |
| 3-88 | 101 | E-1-8 | 5 | C1-5 | 2.5 | Resin 1 | 3.4 | 9.5 | 19.3 |
| 3-89 | 101 | E-1-8 | 5 | C1-6 | 3.2 | Resin 1 | 3.4 | 9.4 | 19.2 |
| 3-90 | 109 | E-1-36 | 5 | C1-3 | 3.5 | Resin 1 | 3.7 | 9.5 | 19.3 |
| 3-91 | 110 | E-1-37 | 5 | C1-3 | 3.5 | Resin 8 | 1.6 | 9.6 | 19.3 |
| 3-92 | 111 | E-1-38 | 5 | C1-3 | 3.5 | Resin 9 | 4.0 | 9.5 | 19.3 |
| 3-93 | 112 | E-1-39 | 5 | C1-3 | 3.5 | Resin 10 | 4.0 | 9.4 | 19.2 |
| 3-94 | 114 | E-1-40 | 5 | C1-3 | 3.5 | Resin 2 | 4.0 | 9.6 | 19.2 |
| 3-95 | 132 | E-1-22 | 5 | C2-12 | 2.7 | Resin 1 | 4.0 | 9.5 | 19.3 |
| 3-96 | 115 | E-1-42 | 5 | C1-3 | 8.4 | Resin 10 | 3.0 | 9.7 | 19.6 |
| 3-97 | 116 | E-1-44 | 5 | C1-3 | 3.5 | Resin 2 | 3.5 | 8.8 | 16.7 |
| 3-98 | 117 | E-1-45 | 5 | C1-3 | 3.5 | Resin 2 | 0.4 | 9.5 | 18.5 |
| 3-99 | 125 | E-1-8 | 5 | C2-3 | 2.4 | Resin 2 | 1.4 | 9.4 | 18.8 |
| 3-100 | 131 | E-1-33 | 5 | C2-4 | 2.9 | Resin 12 | 1.4 | 9.8 | 19.6 |
| 3-101 | 108 | E-1-34 | 5 | C1-10 | 3.5 | Resin 12 | 1.2 | 9.7 | 19.4 |
| 3-102 | 118 | E-1-46 | 5 | C1-7 | 3.5 | Resin 12 | 3.5 | 9.6 | 19.2 |
| 3-103 | 119 | E-1-47 | 5 | C1-6 | 3.4 | Resin 12 | 3.1 | 9.3 | 18.6 |
| 3-104 | 133 | E-1-37 | 5 | C2-4 | 3.3 | Resin 8 | 3.4 | 9.8 | 19.6 |
| 3-105 | 134 | E-1-38 | 5 | C2-4 | 3.3 | Resin 9 | 3.4 | 9.9 | 19.6 |
| 3-106 | 135 | E-1-39 | 5 | C2-4 | 3.3 | Resin 10 | 3.4 | 9.3 | 18.6 |
| 3-107 | 120 | E-1-22 | 5 | C1-9 | 3.0 | Resin 2 | 3.4 | 9.1 | 18.1 |
| 3-108 | 136 | E-1-22 | 5 | C2-18 | 3.0 | Resin 1 | 3.4 | 9.8 | 18.6 |
| 3-109 | 201 | E-2-3 | 5 | C1-3 | 3.5 | Resin 5 | 3.0 | 8.6 | 16.5 |
| 3-110 | 201 | E-2-3 | 5 | C1-10 | 3.5 | Resin 6 | 3.3 | 11.3 | 23.3 |
| 3-111 | 202 | E-2-5 | 5 | C1-3 | 3.5 | Resin 14 | 3.0 | 13.6 | 25.6 |
| 3-112 | 203 | E-2-12 | 5 | C1-7 | 3.5 | Resin 16 | 4.0 | 9.4 | 19.4 |
| 3-113 | 204 | E-2-13 | 5 | C1-12 | 3.4 | Resin 9 | 4.5 | 9.3 | 19.2 |
| 3-114 | 205 | E-2-14 | 5 | C1-10 | 3.3 | Resin 10 | 4.5 | 9.2 | 18.8 |
| 3-115 | 206 | E-2-19 | 5 | C1-8 | 3.5 | Resin 21 | 4.5 | 9.2 | 18.7 |

TABLE 30

| Example | Specific Example of Tables 1-5 and 12-19 | Electron-transporting compound Kind | Part(s) by mass | Melamine compound, Guanamine compound Kind | Part(s) by mass | Resin Kind | Part(s) by mass | Photoelectric conversion efficiency [%] | Short-circuit current density [mA/cm$^2$] |
|---|---|---|---|---|---|---|---|---|---|
| 3-116 | 301 | E-3-1 | 5 | C1-6 | 3.5 | Resin 8 | 1.8 | 8.4 | 16.4 |
| 3-117 | 126 | E-1-8 | 5 | C2-13 | 2.8 | Resin 3 | 3.0 | 9.5 | 19.2 |
| 3-118 | 125 | E-1-38 | 5 | C1-9 | 2.4 | Resin 9 | 3.3 | 11.0 | 23.2 |
| 3-119 | 131 | E-1-48 | 5 | C1-2 | 2.6 | Resin 2 | 3.4 | 8.6 | 16.6 |
| 3-120 | 121 | E-1-22 | 5 | C1-7 | 3.5 | Resin 14 | 3.5 | 9.3 | 18.6 |
| 3-121 | 121 | E-1-22 | 5 | C1-10 | 3.5 | Resin 23 | 3.5 | 8.8 | 17.1 |
| 3-122 | 203 | E-2-12 | 5 | C1-6 | 3.4 | Resin 8 | 3.0 | 8.1 | 16.2 |
| 3-123 | 207 | E-2-19 | 5 | C2-9 | 2.9 | Resin 3 | 2.0 | 9.5 | 19.2 |
| 3-124 | 302 | E-3-2 | 5 | C1-9 | 3.3 | Resin 2 | 2.8 | 9.7 | 19.5 |
| 3-125 | 208 | E-2-12 | 5 | C2-2 | 2.4 | Resin 8 | 1.5 | 9.6 | 19.2 |
| 3-126 | 303 | E-3-1 | 5 | C1-7 | 3.0 | Resin 1 | 2.0 | 9.4 | 19.1 |
| 3-127 | 124 | E-1-51 | 8 | C1-7 | 2.5 | Resin 1 | 3.0 | 13.2 | 25.3 |
| 3-128 | 137 | E-1-51 | 8 | C2-4 | 2.5 | Resin 15 | 3.0 | 13.4 | 25.1 |
| 3-129 | 132 | E-1-49 | 5 | C1-2 | 3.2 | Resin 8 | 3.3 | 8.1 | 16.1 |
| 3-130 | 139 | E-1-49 | 5 | C2-8 | 3.2 | Resin 16 | 3.3 | 9.5 | 19.2 |
| 3-131 | 138 | E-1-50 | 5 | C2-13 | 3.2 | Resin 13 | 3.3 | 9.7 | 19.4 |
| 3-132 | 304 | E-3-7 | 5 | C1-4 | 5.9 | Resin 18 | 2.1 | 9.6 | 19.3 |
| 3-133 | 305 | E-3-7 | 5 | C1-7 | 3.4 | Resin 24 | 3.1 | 9.4 | 19.1 |
| 3-134 | 140 | E-1-54 | 5 | C1-3 | 3.5 | Resin 24 | 3.4 | 9.4 | 19.1 |
| 3-135 | 140 | E-1-54 | 5 | C1-3 | 3.5 | Resin 24 | 3.4 | 8.7 | 17.1 |
| 3-136 | 140 | E-1-54 | 5 | C1-3 | 3.5 | Resin 24 | 3.4 | 8.2 | 16.1 |
| 3-137 | 140 | E-1-54 | 5 | C1-3 | 3.5 | Resin 24 | 3.4 | 9.5 | 19.1 |
| 3-138 | 140 | E-1-54 | 5 | C1-3 | 3.5 | Resin 24 | 3.4 | 9.8 | 19.4 |
| 3-139 | 140 | E-1-54 | 5 | C1-3 | 3.5 | Resin 24 | 3.4 | 9.6 | 19.3 |
| 3-140 | 141 | E-1-54 | 5 | C1-3 | 3.5 | Resin 24 | 3.4 | 9.4 | 18.7 |
| 3-141 | 142 | E-1-22 | 5 | C1-3 | 3.5 | Resin 24 | 3.4 | 9.4 | 18.8 |

TABLE 31

| Comparative Example | Electron-transporting compound Kind | Part(s) by mass | Melamine compound, Guanamine compound Kind | Part(s) by mass | Resin Kind | Part(s) by mass | Photoelectric conversion efficiency [%] | Short-circuit current density [mA/cm$^2$] |
|---|---|---|---|---|---|---|---|---|
| 3-5 | E-1-8 | 10 | None | None | — | — | Unmeasurable | Unmeasurable |
| 3-6 | E-2-4 | 10 | None | None | — | — | Unmeasurable | Unmeasurable |
| 3-7 | E-3-1 | 10 | None | None | — | — | Unmeasurable | Unmeasurable |
| 3-8 | None | None | C1-3 | 5 | B14 | 5 | Unmeasurable | Unmeasurable |

In Tables 29 to 31, the part(s) by mass of the electron-transporting compound represents the amount (part(s) by mass) of the electron-transporting compound in the coating liquid for the foundation layer. The part(s) by mass of the melamine or guanamine compound represents the amount (part(s) by mass) of the melamine or guanamine compound in the coating liquid for the foundation layer. The part(s) by mass of the resin represents the amount (part(s) by mass) of the resin in the coating liquid for the foundation layer.

In the comparison between the Examples and the Comparative Examples, the foundation layers formed of only an electron-transporting compound caused elusion when the perovskite layer was formed, as shown in Comparative Examples 3-5 to 3-7, and significantly deteriorated in film properties. This is probably the reason why the properties as the photoelectric conversion element of such samples were not measured. Comparative Example 3-8 probably does not allow electrons to be transferred from the perovskite layer because of the absence of the electron-transporting compound.

The present invention can provide a photoelectric conversion element with high photoelectric conversion efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion element comprising: a first layer containing a perovskite compound between an anode and a cathode; and a second layer between the cathode and the first layer,
   wherein the second layer contains at least one of the structures represented by formula (U1) presented below and the structures represented by formula (U2) presented below;

(U1)

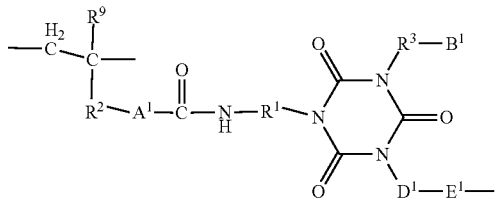

(U2)

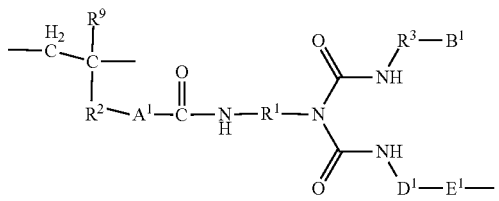

wherein in formulas (U1) and (U2), $R^1$ and $R^3$ each independently represent a substituted or unsubstituted alkylene group whose main chain has 1 to 10 atoms, or a substituted or unsubstituted phenylene group;

$R^2$ represents a single bond, a substituted or unsubstituted alkylene group whose main chain has 1 to 10 atoms, or a substituted or unsubstituted phenylene group;

the substituent of the substituted alkylene group is an alkyl group, an aryl group, a hydroxy group, or a halogen atom;

the substituent of the substituted phenylene group is a halogen atom, a nitro group, a cyano group, a hydroxy group, an alkyl group, or a halogen-substituted alkyl group;

$R^9$ represents a hydrogen atom or an alkyl group;

$A^1$ represents any one of the groups represented by formulas (A-1) to (A-6) presented below;

$B^1$ represents a group represented by any one of formulas (B-1) to (B-3) presented below;

$D^1$ represents a group represented by formula (D) presented below and whose main chain has 5 to 15 atoms;

$E^1$ represents a divalent group represented by any one of formulas (E-1) to (E-3) presented below;

—O— (A-1)

—C(=O)—O— (A-2)

—NH— (A-3)

—S— (A-4)

(A-5)

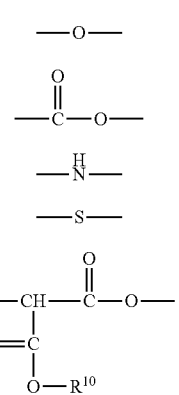

(A-6)

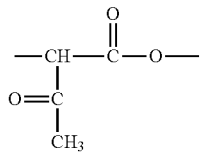

in formula (A-5), $R^{10}$ represents a hydrogen atom or an alkyl group;

—N=C=O ⟶ (B-1)

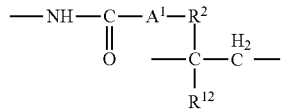 ⟶ (B-2)

(B-3)

in formulas (B-1) to (B-3), $R^6$ and $R^7$ each independently represent an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, alkoxycarbonyl-substituted alkylene group whose main chain has 1 to 5 atoms, or a phenyl-substituted alkylene group whose main chain has 1 to 5 atoms;

one of the carbon atoms of the main chain of the alkylene group may be replaced with O, S, NH, or $NR^{15}$, wherein $R^{15}$ is an alkyl group;

$R^2$ represents a single bond, a substituted or unsubstituted alkylene group whose main chain has 1 to 10 atoms, or a substituted or unsubstituted phenylene group;

the substituent of the substituted alkylene group is an alkyl group, an aryl group, a hydroxy group, or a halogen atom;

the substituent of the substituted phenylene group is a halogen atom, a nitro group, a cyano group, a hydroxy group, an alkyl group, or a halogen-substituted alkyl group;

$R^{12}$ represents a hydrogen atom or an alkyl group;

$Ar^2$ represents a substituted or unsubstituted phenylene group;

the substituent of the substituted phenylene group is a halogen atom, a nitro group, a hydroxy group, a cyano group, an alkyl group, or a halogenated alkyl group;

$A^1$ and $A^2$ represent any one of the groups represented by formulas (A-1) to (A-6) presented above;

$E^1$ represents a divalent group represented by any one of formulas (E-1) to (E-3) presented below;

o, p, and q are each independently 0 or 1, and the sum of o, p, and q is 1 to 3;

arrows point to the side bound to $R^3$;

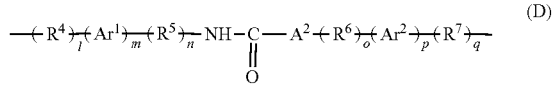 (D)

in formula (D), $R^4$, $R^5$, $R^6$, and $R^7$ each independently represent an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, an alkoxycarbonyl-substituted alkylene group whose main chain has 1 to 5 atoms, or a phenyl-substituted alkylene group whose main chain has 1 to 5 atoms;

one of the carbon atoms of the main chain of the alkylene group may be replaced with O, S, NH, or $NR^{15}$, wherein $R^{15}$ is an alkyl group;

$Ar^1$ and $Ar^2$ each independently represent a substituted or unsubstituted phenylene group;

the substituent of the substituted phenylene group is a halogen atom, a nitro group, a hydroxy group, a cyano group, an alkyl group, or a halogenated alkyl group;

$A^2$ represents a group represented by any one of formulas (A-1) to (A-6) presented above;

l, m, n, o, p, and q are each independently 0 or 1, and the sum of l, m, and n and the sum of o, p, and q are 1 to 3;

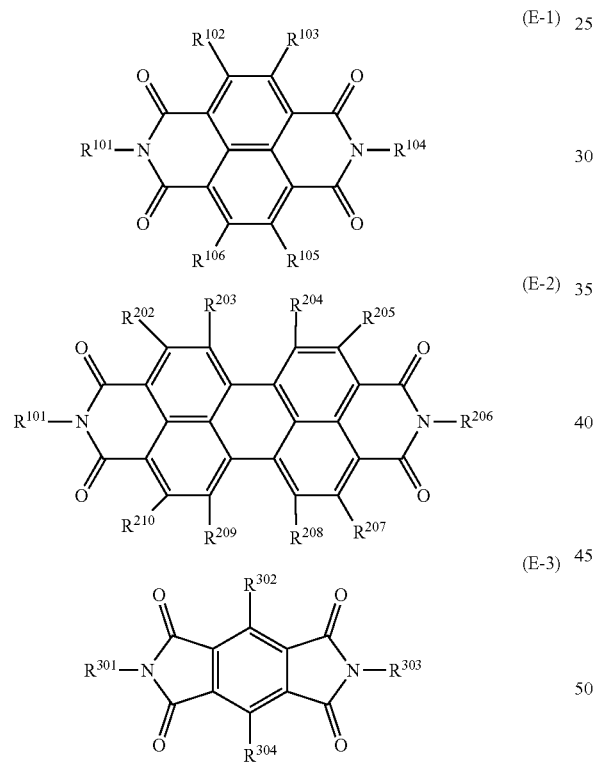

in formulas (E-1) to (E-3), $R^{101}$ to $R^{106}$, $R^{201}$ to $R^{210}$, and $R^{301}$ to $R^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group;

two of $R^{101}$ to $R^{106}$, two of $R^{201}$ to $R^{210}$, and two of $R^{301}$ to $R^{304}$ are single bonds;

the substituent of the substituted alkyl group is an alkyl group, an aryl group, a halogen atom, or a carbonyl group; and the substituent of the substituted aryl group or the substituted heterocyclic group is a halogen atom, a nitro group, a cyano group, an alkyl group, a halogen-substituted alkyl group, an alkoxy group, or a carbonyl group.

2. The photoelectric conversion element according to claim 1, wherein D1 is a group whose main chain has 10 to 15 atoms.

3. The photoelectric conversion element according to claim 1, wherein $R^4$, $R^5$, $R^6$, and $R^7$ are each independently an alkylene group whose main chain has 1 to 5 atoms or a methyl-substituted or ethyl-substituted alkylene group whose main chain has 1 to 5 atoms.

4. The photoelectric conversion element according to claim 1, wherein $Ar^1$ and $Ar^2$ are unsubstituted phenylene groups.

5. A photoelectric conversion element comprising: a first layer containing a perovskite compound between an anode and a cathode; and a second layer between the cathode and the first layer,
wherein the second layer contains at least one of the structures represented by formula (U1) presented below and the structures represented by formula (U2) presented below;

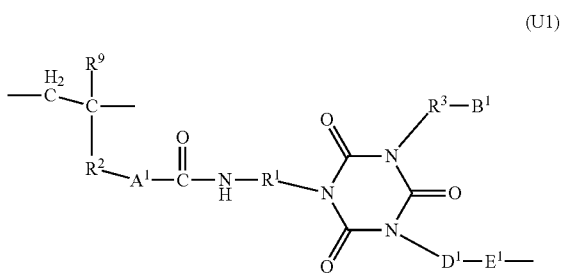

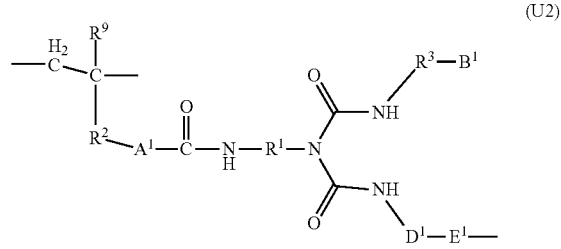

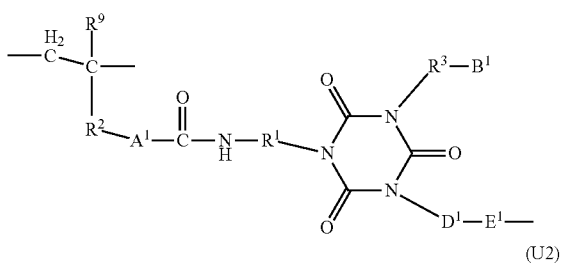

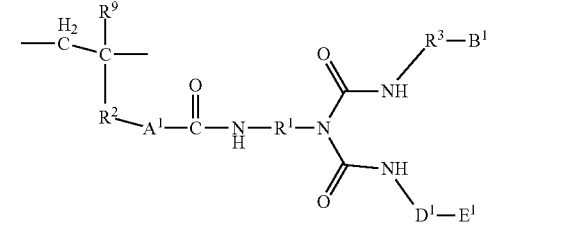

wherein
in formulas (U1) and (U2), $R^1$ and $R^3$ each independently represent a substituted or unsubstituted alkylene group whose main chain has 1 to 10 atoms, or a substituted or unsubstituted phenylene group;

$R^2$ represents a single bond, a substituted or unsubstituted alkylene group whose main chain has 1 to 10 atoms, or a substituted or unsubstituted phenylene group;

the substituent of the substituted alkylene group is an alkyl group, an aryl group, a hydroxy group, or a halogen atom;

the substituent of the substituted phenylene group is a halogen atom, a nitro group, a cyano group, a hydroxy group, an alkyl group, or a halogen-substituted alkyl group;

$R^9$ represents a hydrogen atom or an alkyl group;

$A^1$ represents any one of the groups represented by formulas (A-1) to (A-6) presented below;

B1 represents a group represented by any one of formulas (B-1) to (B-3) presented below;

$D^1$ represents a group represented by formula (D) presented below and whose main chain has 5 to 15 atoms;

$E^1$ represents a group represented by any one of formulas (E-1) to (E-3) presented below;

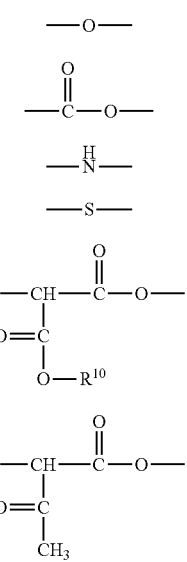

in formula (A-5), $R^{10}$ represents a hydrogen atom or an alkyl group;

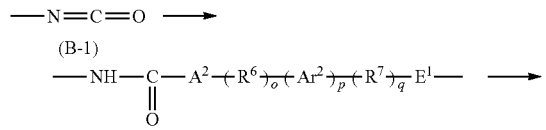

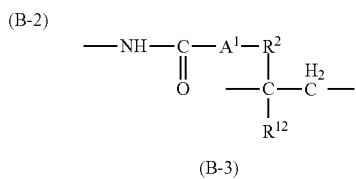

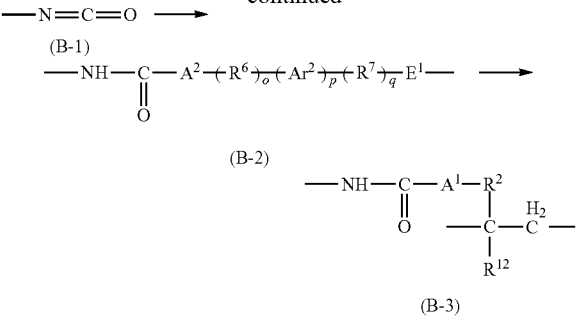

in formulas (B-1) to (B-3), $R^6$ and $R^7$ each independently represent an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, alkoxycarbonyl-substituted alkylene group whose main chain has 1 to 5 atoms, or a phenyl-substituted alkylene group whose main chain has 1 to 5 atoms;

one of the carbon atoms of the main chain of the alkylene group may be replaced with O, S, NH, or $NR^{15}$, wherein $R^{15}$ is an alkyl group;

$R^2$ represents a single bond, a substituted or unsubstituted alkylene group whose main chain has 1 to 10 atoms, or a substituted or unsubstituted phenylene group;

the substituent of the substituted alkylene group is an alkyl group, an aryl group, a hydroxy group, or a halogen atom;

the substituent of the substituted phenylene group is a halogen atom, a nitro group, a cyano group, a hydroxy group, an alkyl group, or a halogen-substituted alkyl group;

$R^{12}$ represents a hydrogen atom or an alkyl group;

$Ar^2$ represents a substituted or unsubstituted phenylene group;

the substituent of the substituted phenylene group is a halogen atom, a nitro group, a hydroxy group, a cyano group, an alkyl group, or a halogenated alkyl group;

$A^1$ and $A^2$ represent any one of the groups represented by formulas (A-1) to (A-6) presented above;

$E^1$ represents a group represented by any one of formulas (E-1) to (E-3) presented below;

o, p, and q are each independently 0 or 1, and the sum of o, p, and q is 1 to 3;

arrows point to the side bound to $R^3$;

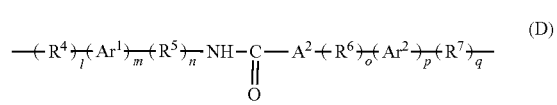

in formula (D), $R^4$, $R^5$, $R^6$, and $R^7$ each independently represent an alkylene group whose main chain has 1 to 5 atoms, an alkylene group which is substituted by an alkyl group with 1 to 5 carbon atoms and whose main chain has 1 to 5 atoms, a benzyl-substituted alkylene group whose main chain has 1 to 5 atoms, an alkoxycarbonyl-substituted alkylene group whose main chain has 1 to 5 atoms, or a phenyl-substituted alkylene group whose main chain has 1 to 5 atoms;

one of the carbon atoms of the main chain of the alkylene group may be replaced with O, S, NH, or $NR^{15}$-, wherein $R^{15}$ is an alkyl group;

Ar$^1$ and Ar$^2$ each independently represent a substituted or unsubstituted phenylene group;

the substituent of the substituted phenylene group is a halogen atom, a nitro group, a hydroxy group, a cyano group, an alkyl group, or a halogenated alkyl group;

A$^2$ represents a group represented by any one of formulas (A-1) to (A-6) presented above;

I, m, n, o, p, and q are each independently 0 or 1, and the sum of I, m, and n and the sum of o, p, and q are 1 to 3;

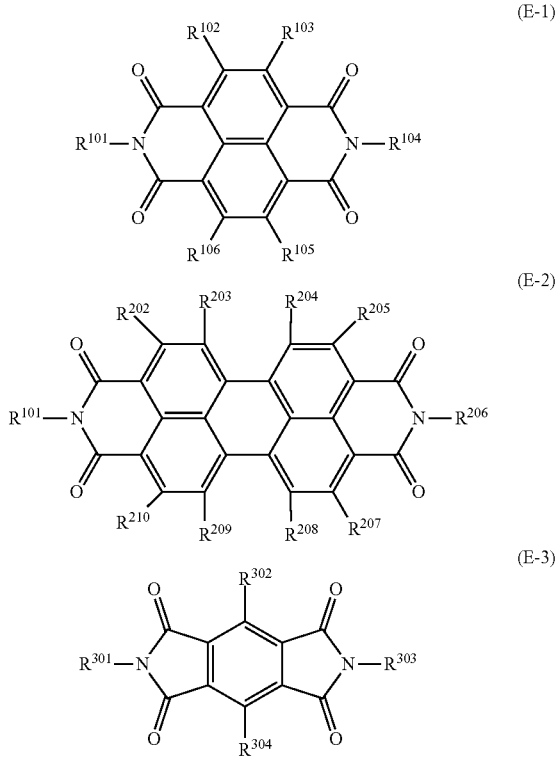

in formulas (E-1) to (E-3), R$^{101}$ to R$^{106}$, R$^{201}$ to R$^{210}$, and R$^{301}$ to R$^{304}$ each independently represent a single bond, a hydrogen atom, a cyano group, a nitro group, a halogen atom, an alkoxycarbonyl group, a carboxyl group, a dialkylamino group, a hydroxy group, a substituted or unsubstituted alkyl group, a substituted or unsubstituted aryl group, or a substituted or unsubstituted heterocyclic group;

one of R$^{101}$ to R$^{106}$, one of R$^{201}$ to R$^{210}$, and one of R$^{301}$ to R$^{304}$ are single bonds;

the substituent of the substituted alkyl group is an alkyl group, an aryl group, a halogen atom, or a carbonyl group; and the substituent of the substituted aryl group or the substituted heterocyclic group is a halogen atom, a nitro group, a cyano group, an alkyl group, a halogen-substituted alkyl group, an alkoxy group, or a carbonyl group.

6. The photoelectric conversion element according to claim 5, wherein D$^1$ is a group whose main chain has 10 to 15 atoms.

7. The photoelectric conversion element according to claim 5, wherein R$^4$, R$^5$, R$^6$, and R$^7$ are each independently an alkylene group whose main chain has 1 to 5 atoms or a methyl-substituted or ethyl-substituted alkylene group whose main chain has 1 to 5 atoms.

8. The photoelectric conversion element according to claim 5, wherein Ar$^1$ and Ar$^2$ are unsubstituted phenylene groups.

9. The photoelectric conversion element according to claim 5, wherein in formulas (B-1) to (B-3), A$^1$ represents the group represented by (A-1), and A$^2$ represents the group represented by (A-1) or (A-3), and in formula (D), A$^2$ represents a group represented by (A-1) or (A-3).

* * * * *